(12) United States Patent
Tayanaka

(10) Patent No.: US 10,163,962 B2
(45) Date of Patent: Dec. 25, 2018

(54) SOLID-STATE IMAGING APPARATUS, MANUFACTURING METHOD THEREFOR, AND ELECTRONIC APPARATUS

(71) Applicant: SONY SEMICONDUCTOR SOLUTIONS CORPORATION, Kanagawa (JP)

(72) Inventor: Hiroshi Tayanaka, Kanagawa (JP)

(73) Assignee: Sony Semiconductor Solution Corporation, Kanagawa (JP)

( * ) Notice: Subject to any disclaimer, the term of this patent is extended or adjusted under 35 U.S.C. 154(b) by 0 days.

(21) Appl. No.: 15/394,092

(22) Filed: Dec. 29, 2016

(65) Prior Publication Data

US 2017/0110500 A1     Apr. 20, 2017

Related U.S. Application Data

(63) Continuation of application No. 14/912,659, filed as application No. PCT/JP2014/071464 on Aug. 15, 2014, now Pat. No. 9,564,465.

(30) Foreign Application Priority Data

Aug. 28, 2013   (JP) .................................. 2013-176619

(51) Int. Cl.
| | |
|---|---|
| H01L 27/146 | (2006.01) |
| H01L 31/028 | (2006.01) |
| H01L 31/036 | (2006.01) |
| H04N 5/359 | (2011.01) |
| H04N 5/3745 | (2011.01) |
| H04N 5/367 | (2011.01) |

(52) U.S. Cl.
CPC .... *H01L 27/14643* (2013.01); *H01L 27/1464* (2013.01); *H01L 27/14614* (2013.01); *H01L 27/14623* (2013.01); *H01L 27/14634* (2013.01); *H01L 27/14638* (2013.01); *H01L 27/14689* (2013.01); *H01L 31/028* (2013.01); *H01L 31/036* (2013.01); *H04N 5/3594* (2013.01); *H04N 5/367* (2013.01); *H04N 5/3745* (2013.01); *H04N 5/37457* (2013.01)

(58) Field of Classification Search
CPC ........... H01L 27/1464; H01L 27/14614; H01L 27/14623; H01L 27/14638; H01L 27/14643; H01L 27/14689
See application file for complete search history.

(56) References Cited

U.S. PATENT DOCUMENTS

2005/0167704 A1\* 8/2005 Ezaki ................ H01L 27/14603
257/233

\* cited by examiner

*Primary Examiner* — Karen Kusumakar
(74) *Attorney, Agent, or Firm* — Sheridan Ross P.C.

(57) ABSTRACT

The present technology relates to a solid-state imaging apparatus, a manufacturing method therefor, and an electronic apparatus by which fine pixel signals can be suitably generated.

A charge accumulation section that is formed on a first semiconductor substrate and accumulates photoelectrically converted charges, a charge-retaining section that is formed on a second semiconductor substrate and retains charges accumulated in the charge accumulation section, and a transfer transistor that is formed on the first semiconductor substrate and the second semiconductor substrate and transfers charges accumulated in the charge accumulation section to the charge-retaining section are provided. A bonding interface between the first semiconductor substrate and the second semiconductor substrate is formed in a channel of the transfer transistor.

19 Claims, 46 Drawing Sheets

SOLID-STATE IMAGING APPARATUS, MANUFACTURING METHOD THEREFOR, AND ELECTRONIC APPARATUS

CROSS REFERENCE TO RELATED APPLICATIONS

This application a continuation of U.S. patent application Ser. No. 14/912,659, filed Feb. 18, 2016, which is a national stage application under 35 U.S.C. 371 and claims the benefit of PCT Application No. PCT/JP2014/071464 having an international filing date of 15 Aug. 2014, which designated the United States, which PCT application claimed the benefit of Japanese Patent Application No. 2013-176619 filed 28 Aug. 2013, the disclosures of which are incorporated herein by reference in their entirety.

TECHNICAL FIELD

The present technology relates to a solid-state imaging apparatus, a manufacturing method therefor, and an electronic apparatus and more particularly to a solid-state imaging apparatus, a manufacturing method therefor, and an electronic apparatus, by which fine pixel signals can be suitably generated.

BACKGROUND ART

Manufacturing processes for a semiconductor apparatus such as an image sensor include a process of bonding a semiconductor substrate on which imaging elements are formed to another semiconductor substrate, a glass substrate, or the like.

In general, the semiconductor apparatus such as the image sensor is constituted of a photodiode (PD) that photoelectrically converts incident light, a transistor (TG) that transfers electrons resulting from the photoelectric conversion to an FD (Floating Diffusion), a transistor (RST) that resets charges accumulated in the PD, a transistor (AMP) that amplifies a signal voltage corresponding to the electrons from the FD, a transistor (SEL) that transfers the signal voltage to the subsequent stage, and the like. The RST, AMP, and SEL transistors are also called pixel transistors.

For suppressing generation of noise and the like in fine pixel signals, it is desirable that the elements such as the FD and the pixel transistors be formed of a single-crystal semiconductor material.

That is because, if they are formed of a polycrystalline semiconductor material, they have an uneven particle size and many traps, which induces noise and the like when electrons corresponding to fine pixel signals pass through the inside of the elements.

Furthermore, the RST, AMP, and SEL transistors, which are called pixel transistors, are frequently turned ON/OFF for generation of pixel signals. Therefore, the pixel transistors are required to have a good I-V characteristic. If the pixel transistors can be configured as single-crystal elements, a better I-V characteristic can be obtained.

Using a lamination technique for a semiconductor layer an FD on a semiconductor substrate, an image sensor including a light-shielding section between a light-receiving surface and the FD has been proposed (e.g., see Patent Document 1).

Furthermore, for example, if light is mixed in the FD of the image sensor, it results in noise and the like when photo-electric conversion is performed on the FD region of the semiconductor substrate. Therefore, it is desirable that the FD be shielded from light.

Patent Document 1: Japanese Patent Application Laid-open No. 2010-212668

Non-Patent Document 1: H. Yamamoto, H. Ishihara, S. Furukawa, J. Appl. Phys., 25, 667 (1986).

Non-Patent Document 2: T. J. Donahue and Rief: J. Electrochem. Soc., 133, 1961 (1986).

Non-Patent Document 3: T. Takagi, Jpn. J. Appl., 64, 3516 (1988).

Non-Patent Document 4: Y. Kunii, M. Tabe, and Y. Sakakibara, Jpn. J. Appl. Phys., 26, 1008 (1987).

Non-Patent Document 5: L. Csepregi, E. F. Kenedy, T. J. Gallagher, J. W. Mayerand, T. W. Sigmon, J. Appl. Phys., 49, 4234 (1977).

Non-Patent Document 6: H. Ishihara, A. Tamba, H. Yamamoto, Jpn. J. Appl. Phys., 24, 513 (1985).

Non-Patent Document 7: T. Dan, Appl. Phys. Lett., 53, 2626 (1988).

Non-Patent Document 8: H. Hirayama, Y. Tatsumi, and N. Aizaki, Appl. Phys. Lett., 52, 2242 (1988)

Non-Patent Document 9: T. Rung, Y. KennethO, and R. Reif, Appl. Phys. Lett., 52, 1797 (1988)

Non-Patent Document 10: K. Yoneda, J. Sano, M. Michimoro, Y. Morimoto, S. Nakanishi, and H. Ogata, in proc. 4th Int. on SOI technology and device, D. N. Schmidt, Editor, PV90-6, p. 421, Non-Patent Document 11: Tne Electrochemical Society Proceeding Series, Pennington, N.J. (1990)

Non-Patent Document 12: M. Moniwa, K. Kusuwada, E. Murakami, T. Warabisako, and M. Miyao, Appl. Phys. Lett., 52, 1788 (1988)

Non-Patent Document 13: Ueno, K. Suzuki, K. Iemura, K Kawai, T. MOrisawa, and I. Ohdomari, in Proceeding of the Forth International Symposiumon Siliconon Insulator Technology and Devices, PV90-6, 427 (1990)

Non-Patent Document 14: Y. Morimoto, S. Nakanishi, N. Oda, T. Yami, H. Matuda, H. Ogata, and K. Yoneda, J. Electrochem. Soc., 141, 188 (1994)

Non-Patent Document 15: M. Miyao, M. Moniwa, K. kusukawa, and W. Sike, J. Appl. Phys., 64, 3018 (1988)

SUMMARY OF INVENTION

Problem to be Solved by the Invention

However, with the technology of Patent Document 1, it has been difficult to completely shield the FD from light.

Therefore, if intense incident light is emitted, the light reaches the FD and results in noise and the like. Thus, it has been unsuitable for a global shutter structure.

In an image sensor including a light-shielding film between pixels and pixel transistors, it is desirable that all the pixels, the semiconductor elements such as the pixel transistors, and the FDs have uniform properties. Therefore, for example, it is desirable that the pixels, the semiconductor elements such as the pixel transistors, and the like be all fabricated from a single-crystal semiconductor material with the light-shielding film being sandwiched therebetween. However, in the conventional techniques, it has been difficult to manufacture the image sensor sandwiching the light-shielding film from semiconductor single crystals.

For example, Patent Document 1 has proposed a technology in which an interface between a surface semiconductor layer and a conductor layer, an interface between a channel region and an FD, and an interface between a channel layer and a dielectric layer are provided to thereby make the image sensor sandwiching the light-shielding film closer to the semiconductor single crystals as much as possible (e.g., see FIG. 9 of Patent Document 1).

However, for example, if the conventional techniques are used for manufacturing an image sensor including several hundred thousand pixels, bonding interfaces between the surface semiconductor layer and the conductor layer have been formed in many transfer transistors out of the several hundred thousand pixels. Regarding the direction of the bonding interfaces, they are formed in parallel to gates of the transfer transistors or they are formed at both ends of the transfer transistors.

For example, if a bonding interface is formed in parallel to a direction of a channel current flowing through the gate and source-drain of a transfer transistor, a resistance that is connected in parallel to a PD is present as a parasitic resistance in an equivalent circuit (e.g., see FIG. 9 of Patent Document 1).

In this case, a leakage current is constantly generated in the PD and large noise is mixed in signals transferred from the PD. Noise is conspicuous particularly in pixels corresponding to a darker region in an image.

In the conventional techniques, a leakage current due to a parasitic resistance which results from many bonding positions between the surface semiconductor layer and the conductor layer out of the several hundred thousand pixels in the image sensor is generated. Therefore, it has been difficult to fabricate the image sensor having uniform properties.

Furthermore, for example, if the conventional techniques are used for manufacturing an image sensor including several hundred thousand pixels, near many pixel transistors and FDs out of the several hundred thousand pixels, crystal defects and bonding interfaces have been formed in interfaces between the channel regions and the FDs or near these interfaces.

If a crystal defect or bonding interface is formed in an FD or near the FD, a resistance that is connected branching from the FD is present as a parasitic resistance in an equivalent circuit.

In this case, a constant leakage current is generated in the FD. Also, noise is conspicuous particularly in pixels corresponding to a dark region of an image.

In addition, in the conventional techniques, a leakage current due to a parasitic resistance which results from crystal defects or bonding interfaces in interfaces between many channel regions and the FDs or near these interfaces out of the several hundred thousand pixels in the image sensor has been generated. Therefore, it has been difficult to fabricate the image sensor having uniform properties.

Furthermore, as described above, in the conventional techniques, leakage currents due to parasitic resistances which result from interfaces have been generated in many interfaces between the channel layer and the dielectric layer out of the several hundred thousand pixels in the image sensor (e.g., see FIGS. 13, 16, and 17 of Patent Document 1).

For example, in the technology of Patent Document 1, one in which no crystal interfaces are present in a channel of a transfer transistor, a TFT is in a channel of a pixel transistor, and a polysilicon crystal interface is present has been manufactured.

If a crystal interface is in a pixel transistor such as an AMP, the AMP is used as a source follower, and hence even if it is used only for a short time, the properties of the transistor are largely varied. Thus, the variations of the image sensor properties become larger.

Therefore, the pixel transistor becomes polycrystalline. Thus, it has been difficult to obtain a good I-V characteristic that is adaptable also to fine pixel signals. Furthermore, the polycrystalline pixel transistors are likely to be varied in performance for each pixel and the image quality is deteriorated, for example, in terms of color reproduction in an image, for example.

Furthermore, if, for example, using the lamination technique for the semiconductor layer in Patent Document 1, the image sensor including the light-shielding film between the pixels and the pixel transistors is manufactured, no bonding interfaces are formed in all the pixels, the semiconductor elements such as the pixel transistors, the FDs, and the like. Thus, it has been difficult to manufacture it from semiconductor single crystals.

A semiconductor layer is laminated directly on conductor layers and the semiconductor layer is laminated on dielectric layers in a horizontal direction. Therefore, it is technically difficult to form a larger-area semiconductor layer that is wide in the horizontal direction and uniformly form crystals and the like (e.g., see FIGS. 7, 13, and 16 of Patent Document 1).

In addition, in accordance with Non-Patent Documents 1 to 14, for implementing the technology of Patent Document 1, for example, the following problems can also be exemplified.

That is, in the interface between the dielectric layer and the single-crystal semiconductor layer, lamination defects occur in the crystals. Furthermore, crystal defects occur in a position in which the single-crystal materials are brought into contact with each other in the horizontal direction. In addition, the film thickness of the laminated semiconductor layer becomes uneven. Furthermore, the surface of the semiconductor layer laminated in the horizontal direction is non-uniform. In addition, many crystal defects occur in the interface between the dielectric layer and the single-crystal semiconductor layer. Furthermore, due to defects in a top surface of the dielectric layer, a dislocation loop or lamination defect is likely to occur in the semiconductor layer. In addition, the thickness of the semiconductor layer in the horizontal direction is likely to be uneven. Furthermore, in order to fabricate the transistor, when the semiconductor layer laminated in the horizontal direction is subjected to thermal oxidation, a crystal defect is likely to be generated in a thermal oxidation film. In addition, in order to form a large-area semiconductor layer as wide as possible in the horizontal direction, it is necessary to form a film for a long time at a low temperature.

Thus, it has been difficult to manufacture all the FDs and the pixel transistors from semiconductor single crystals by the manufacturing methods according to the conventional techniques.

Furthermore, for example, if the lamination technique for the semiconductor layer described in Patent Document 1 is used for manufacturing an image sensor including several hundred thousand pixels, crystal interfaces and bonding interfaces, which are reported by Non-Patent Documents 1 to 14, have been formed at unexpected positions, which are not intended by a designer, below the gates of the channel layers in many transfer transistors.

If a crystal interface and a bonding interface are formed in an inside of a transfer transistor, a resistance connected branching from a channel is present as a parasitic resistance in an equivalent circuit. The positions at which the crystal interface and the bonding interface are formed are the unexpected positions not intended by the designer and crystals in the crystal interface and the bonding interface are non-uniform. Thus, a channel current flowing therethrough is uneven. With this, the properties of the transfer transistor are largely varied, and hence the variations of the image sensor properties become larger.

Furthermore, in Patent Document 1, by forming a light-blocking layer in the surface semiconductor layer, the transistor has been manufactured. In this case, the bonding interface is formed in the interface between the surface semiconductor layer and the conductor layer or the interface between the conductor layer and the semiconductor layer (see FIG. 16 of Patent Document 1).

If a leakage current due to the parasitic resistance which results from the bonding position is generated, it is difficult for the image sensor to have uniform properties.

The present technology has been disclosed in view of the above-mentioned situations and it makes it possible to suitably generate fine pixel signals.

Means for Solving the Problem

A first aspect of the present technology is a solid-state imaging apparatus including: a charge accumulation section that is formed on a first semiconductor substrate and accumulates photoelectrically converted charges; a charge-retaining section that is formed on a second semiconductor substrate and retains charges accumulated in the charge accumulation section; and a transfer transistor that is formed on the first semiconductor substrate and the second semiconductor substrate and transfers charges accumulated in the charge accumulation section to the charge-retaining section, in which a bonding interface between the first semiconductor substrate and the second semiconductor substrate is formed in a channel of the transfer transistor.

The transfer transistor may be formed such that a gate terminal penetrates the first semiconductor substrate and reaches the second semiconductor substrate.

The bonding interface may be formed at a position of the gate terminal of the transfer transistor, which is closer to a drain terminal than to a source terminal.

In the solid-state imaging apparatus, in the second semiconductor substrate, formed may be pixel transistors including an amplifying transistor that amplifies a signal voltage corresponding to charges retained by at least the charge-retaining section, a reset transistor that resets charges retained by the charge-retaining section, and a selection transistor that selects a signal to be output to a signal line, the signal corresponding to charges read out from the charge-retaining section.

The gate terminal of the amplifying transistor and the charge-retaining section may be connected by silicon.

A P-type semiconductor region may be formed as a body contact that connects the amplifying transistor, the reset transistor, and the selection transistor.

A part of an N-type semiconductor region forming the charge-retaining section may be directly connected to the amplifying transistor.

The second semiconductor substrate that is the single-crystal silicon substrate may be configured to be bonded to the first semiconductor substrate that is the silicon substrate.

The second semiconductor substrate may be the single-crystal silicon substrate, the first semiconductor substrate may be the silicon substrate, and a silicon layer may be formed in the bonding interface with the second semiconductor substrate.

The silicon layer may be formed by epitaxial growth.

Silicon ions may be implanted onto the silicon layer and the silicon layer may be bonded to the second semiconductor substrate.

A light-shielding film may be embedded in the first semiconductor substrate.

Near the gate terminal of the transfer transistor, a region in which the light-shielding film is not provided may be present, and near the gate terminal of the transfer transistor, the light-shielding film may be configured to be long in a direction parallel to an extending direction of the gate terminal of the transfer transistor.

The light-shielding film may be formed of tungsten, titanium, tantalum, nickel, molybdenum, chromium, iridium, or a tungsten silicon compound.

The single charge-retaining section may be provided corresponding to a plurality of charge accumulation sections.

A plurality of charge accumulation sections may be multilayered in a direction in which the first semiconductor substrate and the second semiconductor substrate are laminated.

It may be configured as a planar structure.

It may be configured as a mesa structure.

In a first aspect of the present technology, the bonding interface between the first semiconductor substrate and the second semiconductor substrate is formed in the channel of the transfer transistor.

A second aspect of the present technology is a manufacturing method for a solid-state imaging apparatus including: a step of bonding a first semiconductor substrate formed in a charge accumulation section that accumulates photoelectrically converted charges and a second semiconductor substrate on which a charge-retaining section that retains charges accumulated in the charge accumulation section to each other; and a step of forming a transfer transistor that transfers charges accumulated in the charge accumulation section to the charge-retaining section in the first semiconductor substrate and the second semiconductor substrate.

In the second aspect of the present technology, a first semiconductor substrate formed in a charge accumulation section that accumulates photoelectrically converted charges and a second semiconductor substrate on which a charge-retaining section that retains charges accumulated in the charge accumulation section are bonded to each other. A transfer transistor that transfers charges accumulated in the charge accumulation section to the charge-retaining section is formed in the first semiconductor substrate and the second semiconductor substrate.

A third aspect of the present technology is an electronic apparatus including: a solid-state imaging apparatus including a charge accumulation section that is formed on a first semiconductor substrate and accumulates photoelectrically converted charges; a charge-retaining section that is formed on a second semiconductor substrate and retains charges accumulated in the charge accumulation section; and a transfer transistor that is formed on the first semiconductor substrate and the second semiconductor substrate and transfers charges accumulated in the charge accumulation section to the charge-retaining section, in which a bonding interface between the first semiconductor substrate and the second semiconductor substrate is formed in a channel of the transfer transistor.

In the third aspect of the present technology, the bonding interface between the first semiconductor substrate and the second semiconductor substrate is formed in the channel of the transfer transistor.

Effects of the Invention

According to the present technology, it is possible to suitably generate fine pixel signals.

MODE(S) FOR CARRYING OUT THE INVENTION

Hereinafter, embodiments of the technology disclosed herein will be described with reference to the drawings.

Figure 1:
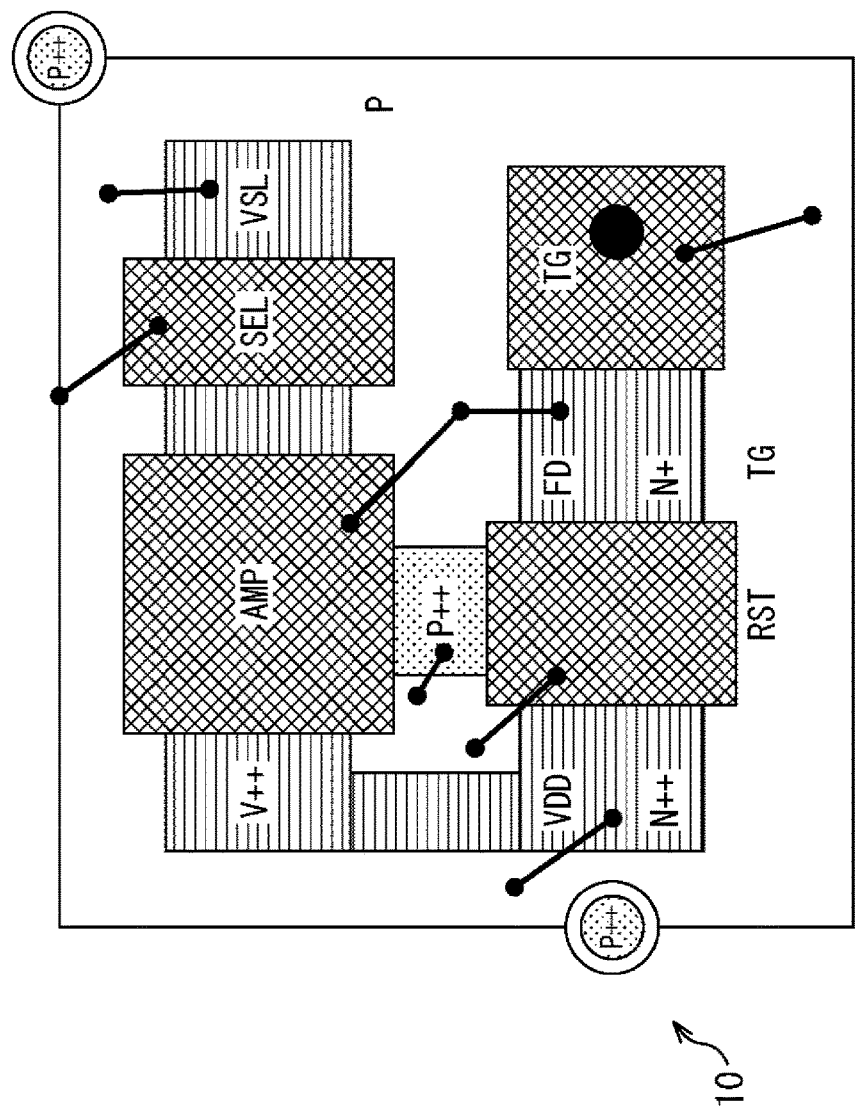
FIG. 1 A plan view showing a configuration example according to an embodiment of an image sensor to which the present technology is applied.

FIG. 1 is a plan view showing a configuration example according to an embodiment of an image sensor to which the present technology is applied. In an image sensor 10 shown in the figure, a region corresponding to an area of one pixel formed on a semiconductor substrate having a planar structure is illustrated.

In the planar structure, terminal electrodes are formed in the same plane and a current path can be shortened.

Each pixel of the image sensor 10 is configured to transfer charges accumulated in a photodiode to a floating diffusion (FD) and read out a signal voltage corresponding to the charges retained by the FD via an amplifying transistor (AMP). Note that the signal voltage is read out on a vertical signal line (VSL) and the VSL is connected to the AMP via a selection transistor (SEL).

Furthermore, each pixel of the image sensor 10 is provided with a reset transistor (RST) for discharging (resetting) the charges retained by the FD.

Note that the transistors of the RST, the AMP, and the SEL are also called pixel transistors. Furthermore, in the figure, black lines having circles at both ends indicate metal wires. For example, a gate terminal of the AMP (top surface side of sheet) and the FD are connected to each other via metal wires.

In addition, in portions denoted by the characters and symbols of "P++" in circles positioned in the left and right in FIG. 1, pinning terminals are provided.

This image sensor 10 has a structure in which at least two semiconductor substrates are laminated. In FIG. 1, a light-receiving surface of the PD of the image sensor 10 is located in a rear surface. Furthermore, in FIG. 1, a top surface of a semiconductor substrate of the two semiconductor substrates, on which mainly the FD and the pixel transistors are provided, is shown.

That is, the image sensor 10 is actually configured as an image sensor including a plurality of pixels. For example, a pixel array in which light-receiving portions placed on the rear surface in FIG. 1 are arranged in a two-dimensional matrix form is located at a position at which light collected by lenses and the like of a camera forms an image. In the image sensor 10, a transfer gate transistor (TG) is provided corresponding to electrically connecting the PD and the FD to each other. That is, the TG is provided penetrating the semiconductor substrate in a depth direction of the sheet.

Figure 2:
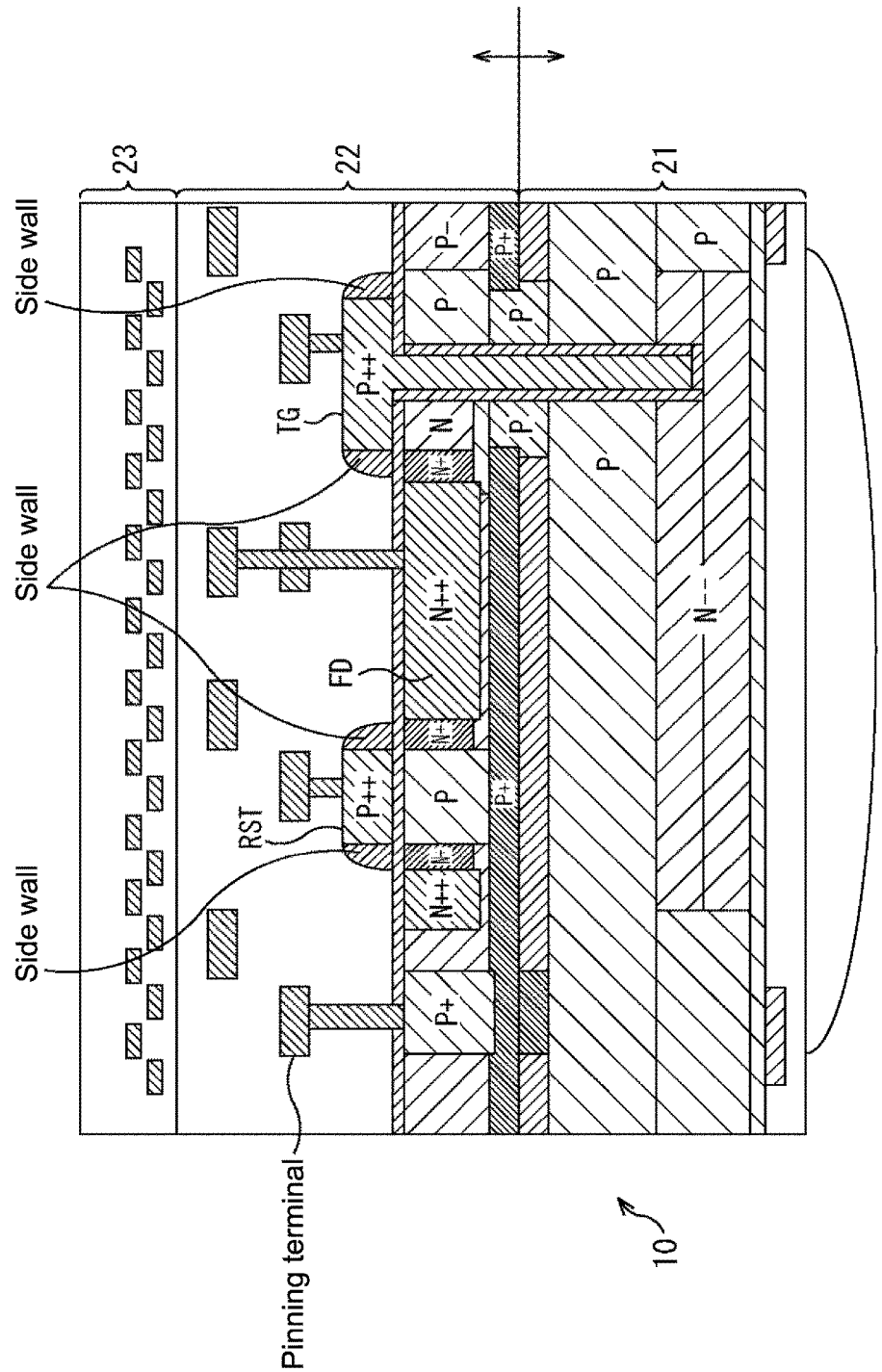
FIG. 2 A sectional view of the image sensor shown in FIG. 1.

FIG. 2 is a sectional view of the image sensor 10 shown in FIG. 1. As shown in the figure, the image sensor 10 is constituted of a first semiconductor substrate 21, a second semiconductor substrate 22, and a logic layer 23. The symbols of "P" and "N" in the figure represent a P-type semiconductor region and an N-type semiconductor region, respectively. Furthermore, the symbols of "P+" and "P−" and "N+" and "N−" represent a high-density P-type and a low-density P-type and a high-density N-type and a low-density N-type, respectively. The density thereof is expressed by the number of "+" or "−." Note that, in FIG. 2, the light-receiving surface of the image sensor 10 is on the lower side in the figure.

The first semiconductor substrate 21 is a semiconductor substrate on which mainly the PD is formed. That is, charges generated corresponding to light entering from the lower side of FIG. 2 are accumulated in the PD of the first semiconductor substrate 21.

The second semiconductor substrate 22 is a semiconductor substrate on which mainly the pixel transistors and the FD are formed. In the example of FIG. 2, the RST that is one of the pixel transistors are formed on the second semiconductor substrate 22 together with the FD. Furthermore, a pinning terminal is provided near a left end portion of the second semiconductor substrate 22 in the figure.

The logic layer 23 is a layer in which an analog-to-digital converter circuit (ADC) and the like are formed. Note that the rectangles long in a horizontal direction in the figure indicate only wires associated with circuits such as the ADC in the logic layer 23.

As shown in FIG. 2, in the image sensor 10 to which the present technology is applied, the TG electrically connects the PD of the first semiconductor substrate 21 and the FD of the second semiconductor substrate 22 to each other. That is, the TG is provided penetrating the second semiconductor substrate 22 and reaching the first semiconductor substrate 21. That is, in the figure, the TG that is a transistor shown on a right side in the figure includes a gate terminal extending long in a vertical direction in the figure.

Figure 3:
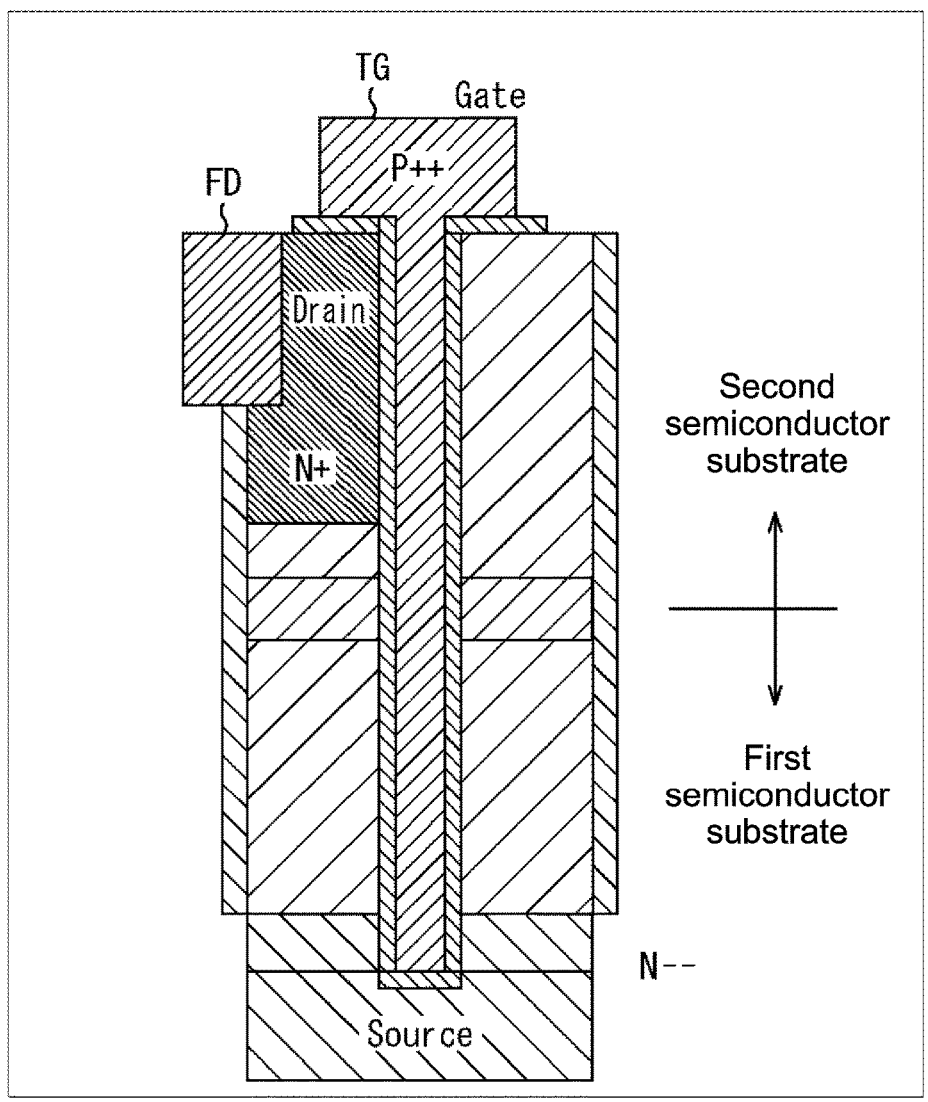
FIG. 3 An enlarged view of a configuration near a TG shown in FIG. 2.

Although not limited thereto, the TG can be configured to have a T-shape or an L-shape as viewed in a cross-section, depending on its shape penetrating the first semiconductor base 21 and the second semiconductor base 22. In an exemplary not limitative example, it can be configured to have a T-shape as shown in FIG. 3 or an L-shape although not shown. As viewed from the top of the TG, it can also be configured to have a donut-shape, an inverse C-shape surrounding a channel, or the like.

Note that the transistor shown on the left side in the figure is the RST and the pinning terminal is shown on the left side of the RST in the figure.

Furthermore, side walls are formed on both the left and right sides of the TG and the RST.

In addition, as will be described later in detail, a bottom of the second semiconductor substrate 22 is configured as a single-crystal substrate. That is, the image sensor 10 is configured by, for example, bonding the first semiconductor substrate 21 configured by forming an insulating film on a silicon substrate and the second semiconductor substrate 22 configured as the silicon single-crystal substrate to each other.

Note that, by the pixel transistors and the FD being formed on the second semiconductor substrate 22 configured as the single-crystal substrate, it is possible to obtain a good I-V characteristic that is adaptable also to fine pixel signals and suppress variations in performance of the pixels.

Furthermore, as described above, the image sensor 10 is configured by bonding the first semiconductor substrate 21 and the second semiconductor substrate 22 to each other, and hence a bonding surface between the first semiconductor substrate and the second semiconductor substrate is a bonding interface.

Regarding the TG that is the transistor, a part of an "N−−" region of the first semiconductor substrate 21 that is held in contact with the lower side in the figure of the gate terminal is a source terminal. A part of an "N" region of the second semiconductor substrate 22 that is held in contact with the left side on the upper side in the figure of the gate terminal is a drain terminal. That is, a channel of the transistor is formed in the portion from the source terminal to the drain terminal in the gate terminal.

Thus, in the image sensor 10 to which the present technology is applied, as shown in FIG. 3, the bonding interface is present in the channel of the transistor.

FIG. 3 is an enlarged view of a configuration near the TG shown in FIG. 2. As shown in the figure, the part of the "N−−" region that is held in contact with the lower side in the figure of the gate terminal of the TG is the source terminal and the part of the "N+" region that is held in contact with the left side on the upper side in the figure of the gate terminal is the drain terminal.

A direction of the bonding interface can be set to a direction vertical to a direction of a current flowing through the source and the drain.

A distance of the bonding interface from the drain terminal can be set to an arbitrary position intended by a designer. Furthermore, a distance of the bonding interface from the drain terminal can be set to an arbitrary position in all the pixels of the image sensor, which is intended by the designer.

A bandgap is generated in the bonding interface. Therefore, it is likely to be an obstruction for transferring charges, for example.

Furthermore, in the portion in which the bonding interface is formed, the directions of crystals are changed and grain boundaries are formed. At the grain boundary, new lattice defects can be formed inside the crystals. Thus, lattice defect density increases near the grain boundary. Therefore, the electric field becomes larger in the portion in which the bonding interface is formed and a so-called hot carrier is more likely to occur. Thus, it is more likely to lead to the performance degradation of the transistor.

Figure 4:
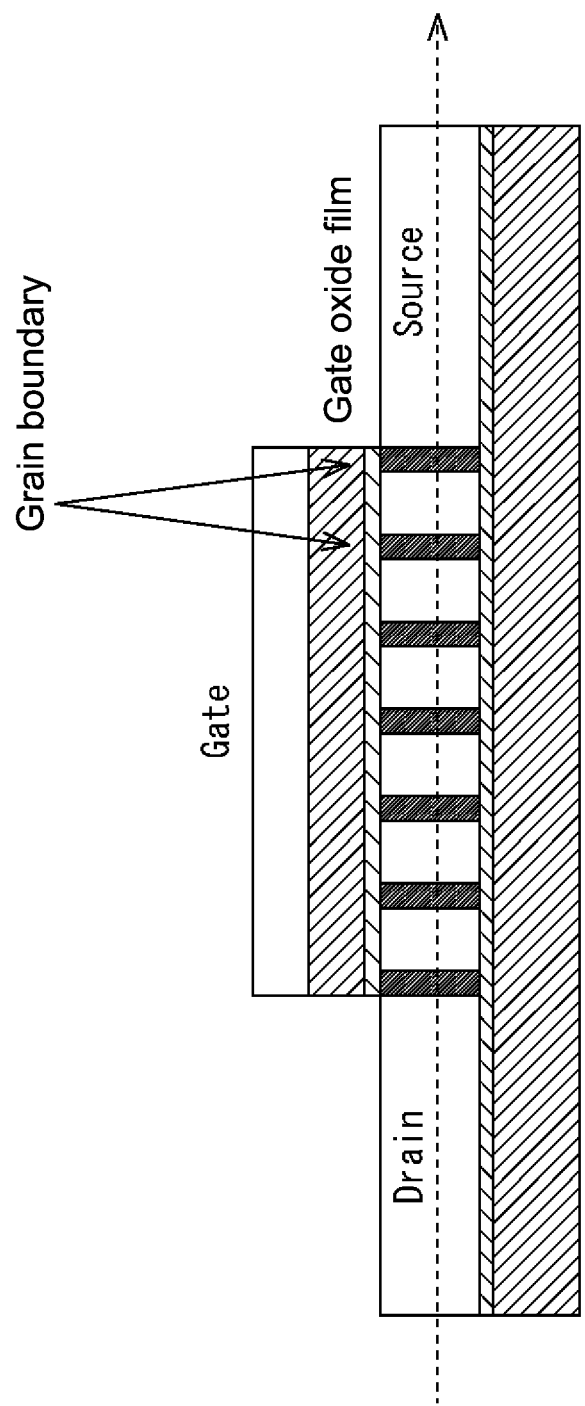
FIG. 4 A diagram for describing positions of grain boundaries of a polysilicon TFT (Thin Film Transistor).

FIG. 4 is a diagram for describing grain boundaries in a bonding interface and the effects of their electrical properties. FIG. 4 is a diagram for describing the positions of the grain boundaries of a polysilicon TFT (Thin Film Transistor). As shown in the figure, the grain boundaries are positioned between the drain and the source.

Figure 5:
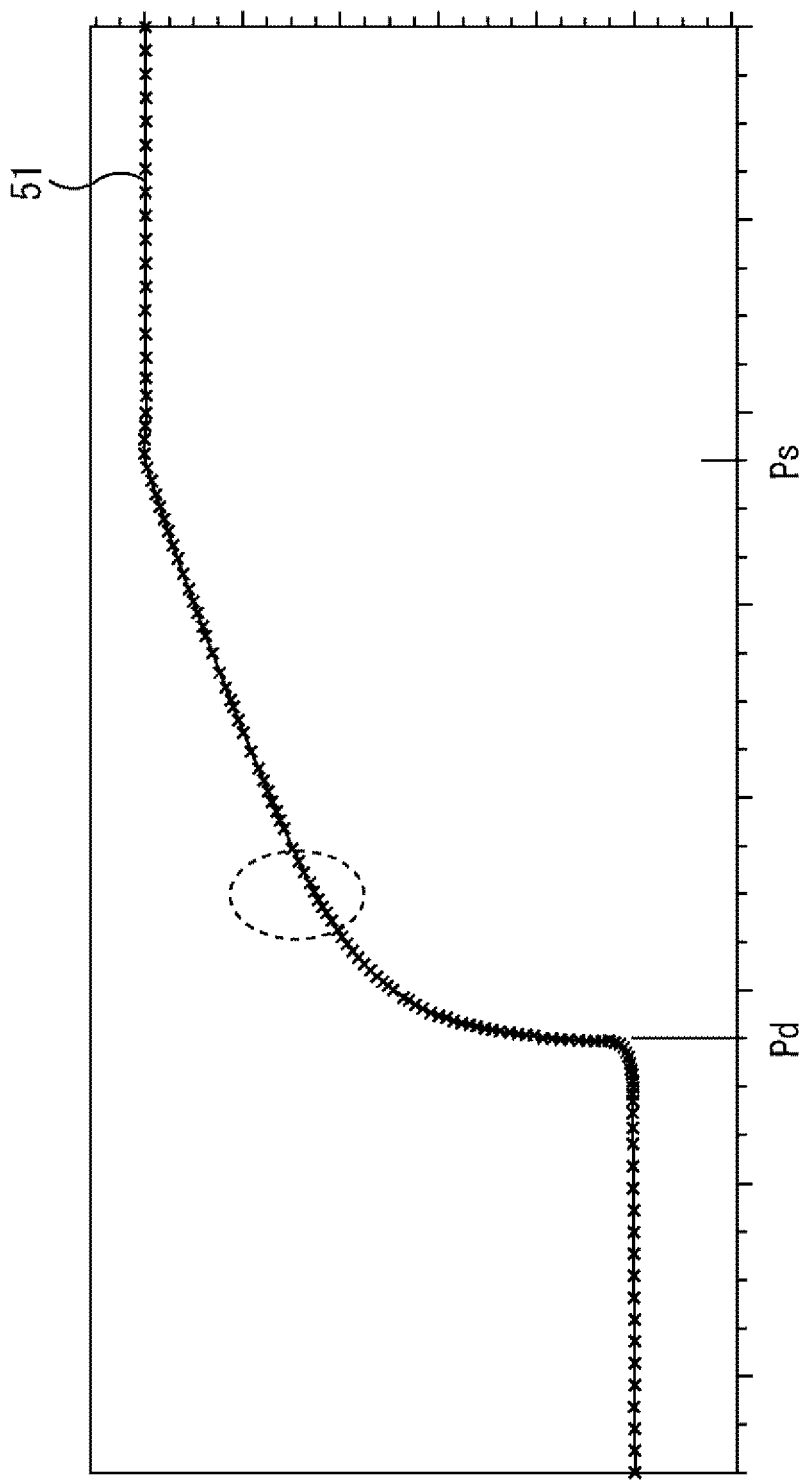
FIG. 5 A diagram for describing a potential barrier at a position in a channel of the TFT.

FIG. 5 is a diagram for describing a potential barrier at a position in a channel of the polysilicon TFT (Thin Film Transistor). In the figure, the horizontal axis represents a position in the channel of the TFT and the vertical axis represents a potential. A line 51 indicates the potential depending on the position in the channel. Note that, in the figure, Pd shown along the horizontal axis represents the position of the drain terminal of the channel and Ps represents the position of the source terminal of the channel.

If a position having a potential higher than the potential of the source terminal is present in the channel, it becomes impossible to transfer charges from the source to the drain. Furthermore, if the potential becomes higher at any position in the channel, a trap is formed and the charge transfer performance is likely to be lowered.

As shown in FIG. 5, the source terminal of the channel has a higher potential and the drain terminal has a lower potential. Therefore, when the bonding interface is formed in the channel of the TFT, it is desirable that it be formed near the drain terminal. This is because, even if the bonding interface is formed near the drain terminal and the potential becomes higher, it is considered that the potential is sufficiently lower than the potential of the source terminal and the effect on the charge transfer performance is small. That is, when the bonding interface is formed in the channel of the TFT, it is ideal that it be formed in a portion indicated by the dotted oval of FIG. 5.

Figure 6:
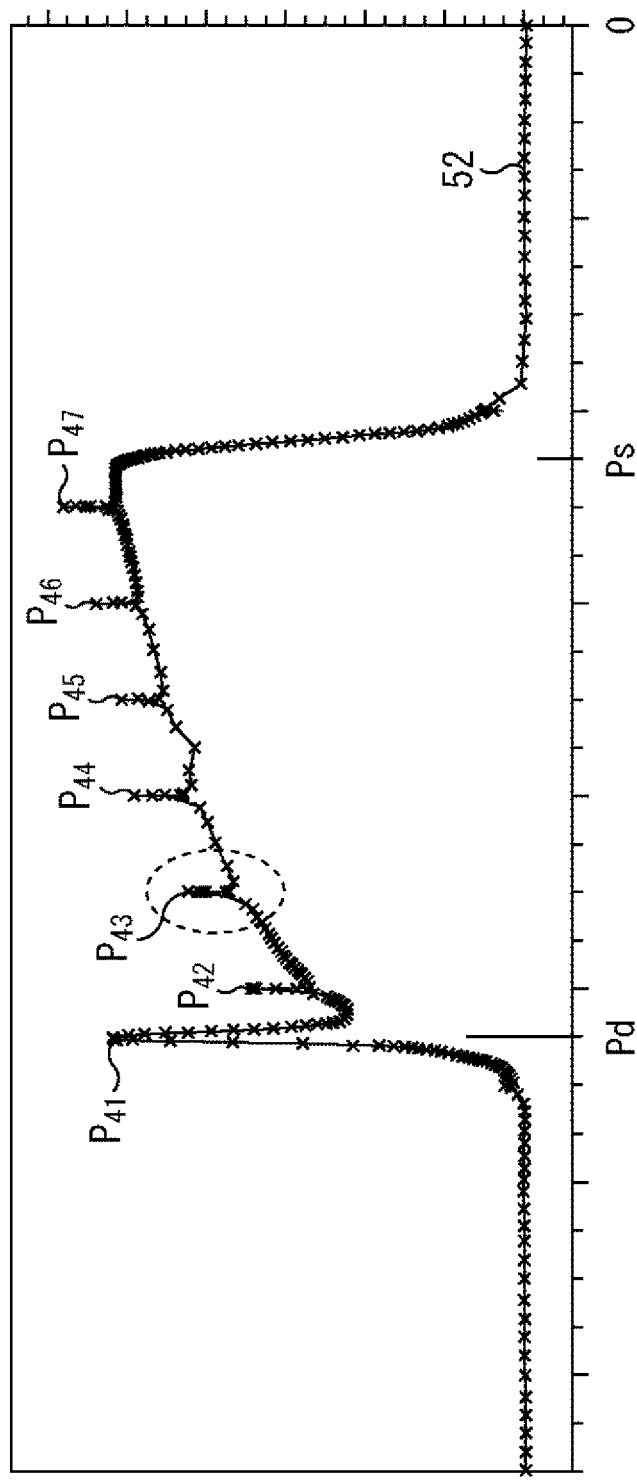
FIG. 6 A diagram for describing a change in electric field at respective positions in the channel of the TFT.

FIG. 6 is a diagram for describing a change in electric field at respective positions in the channel of the TFT (Thin Film Transistor). In the figure, the horizontal axis represents a position in the channel of the TFT and the vertical axis represents electric field intensity. A line 52 indicates the electric field intensity depending on the position in the channel. Note that, in the figure, Pd indicated by the horizontal axis represents the position of the drain terminal of the channel and Ps represents the position of the source terminal of the channel. As shown in the figure, peaks P41 to P47 are formed in the line 52.

As shown in FIG. 6, the peak P41 is higher than the peaks P42 to P47 are lower peaks than the peak P41. That is, if the bonding interface is formed in the drain terminal (position Pd in horizontal axis), the electric field in the channel becomes significantly larger in that portion. In this manner, if the electric field in the channel becomes significantly larger, a hot carrier occurs, which adversely affects the life of the elements, the resistance of the gate oxide film, and the like.

Therefore, when the bonding interface is formed in the channel of the TFT, it is desirable that it be formed near the drain terminal (near peak P43 in figure) excluding the position of the drain terminal (peak P41 in figure). That is, when the bonding interface is formed in the channel of the TFT, it is ideal that it be formed in a portion indicated by the dotted oval of FIG. 6.

In the image sensor 10 of the present technology, the bonding interface is formed at a position of the gate terminal of the TG which is closer to the drain terminal. The bonding interface is formed in a position of the gate terminal of the TG, which is at least closer to the drain terminal than to the source terminal.

Next, manufacturing processes for the image sensor 10 shown in FIG. 2 will be described.

Figure 7:
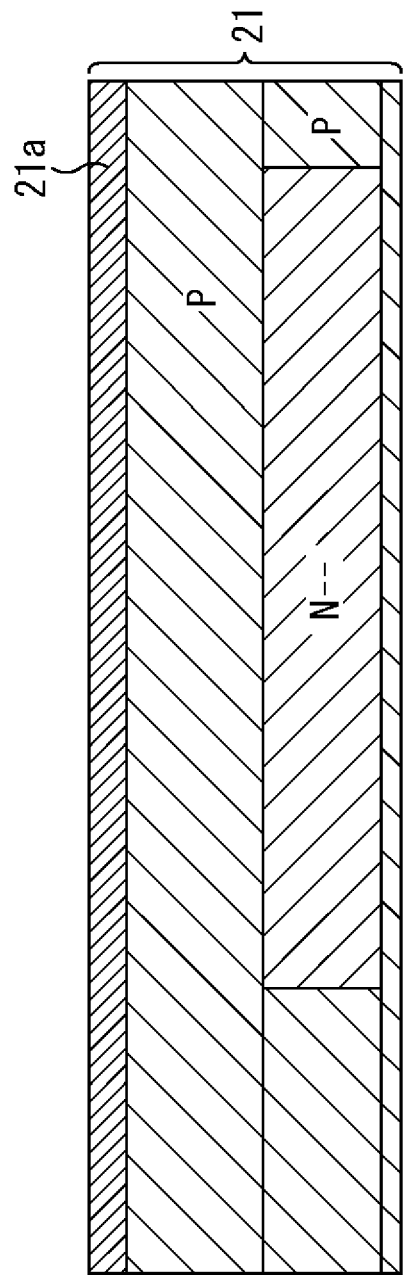
FIG. 7 A diagram for describing manufacturing processes for the image sensor shown in FIG. 2.

First, as shown in FIG. 7, an $SiO_2$ film 21a formed on a first semiconductor substrate 21 configured as a silicon substrate is prepared. Note that, in FIG. 7, P-type semiconductor regions denoted by the symbols "P" and an N-type semiconductor region denoted by the symbol "N--" are formed in the first semiconductor substrate. The N-type semiconductor region serves as a charge accumulation region of the PD.

Figure 8:
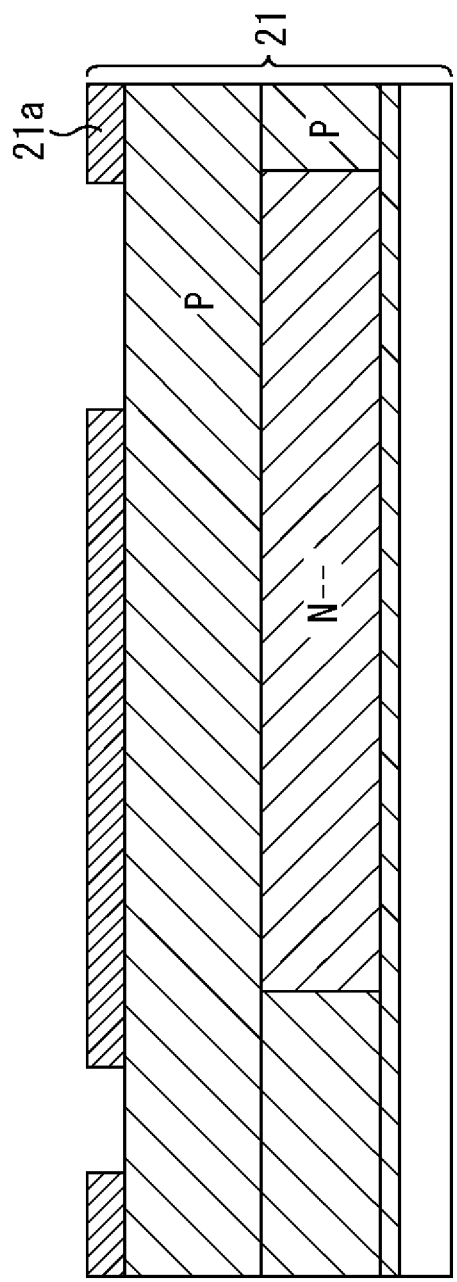
FIG. 8 A diagram for describing the manufacturing processes for the image sensor shown in FIG. 2.

Then, as shown in FIG. 8, the $SiO_2$ film 21a is subjected to dry etching. With this, in the subsequent step, portions of the $SiO_2$ film 21a which correspond to the positions of the portion in which the TG is formed and the portion in which a pinning terminal is formed is removed.

Figure 9:
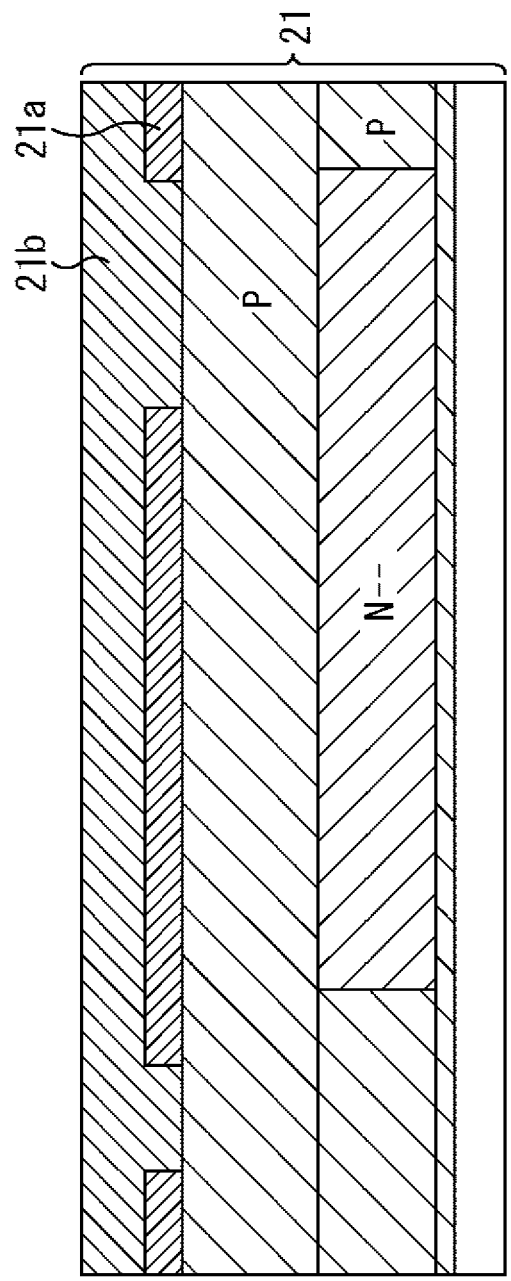
FIG. 9 A diagram for describing the manufacturing processes for the image sensor shown in FIG. 2.

In addition, a silicon layer 21b is epitaxially grown on the first semiconductor substrate 21 in the state as shown in FIGS. 9 and 8.

Figure 10:
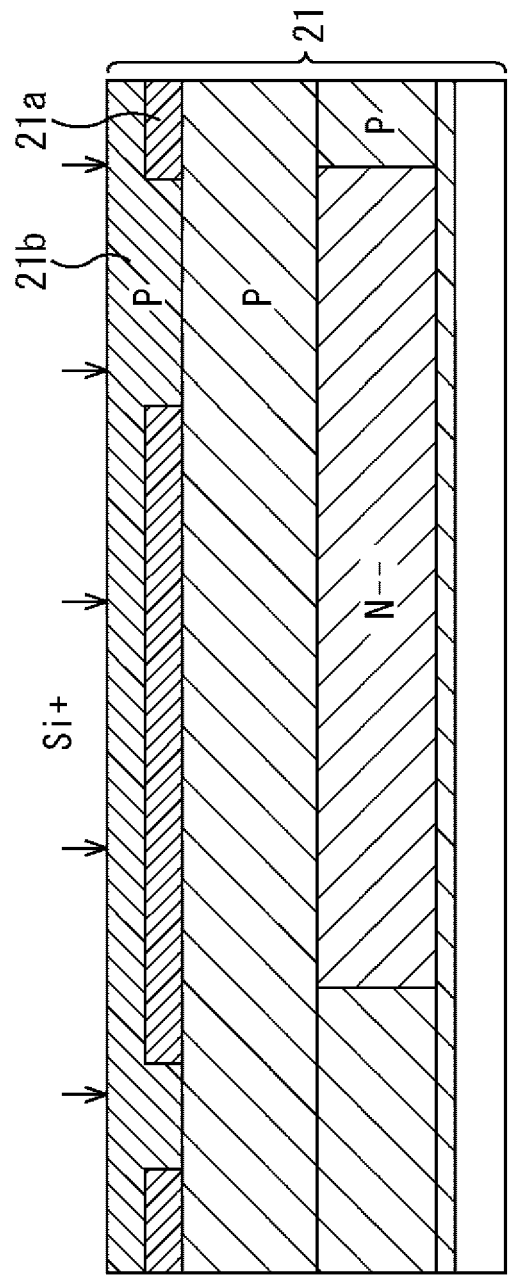
FIG. 10 A diagram for describing the manufacturing processes for the image sensor shown in FIG. 2.

Thereafter, a top surface of the silicon layer 21b is polished by CMP, for example. As shown in FIG. 10, silicon ions are implanted. With this, the bonding property of the silicon substrate for bonding the first semiconductor substrate 21 and the second semiconductor substrate 22 to each other is enhanced.

Note that, instead of implanting silicon ions, phosphorus, arsenic, or boron may be thermally diffused.

Figure 11:
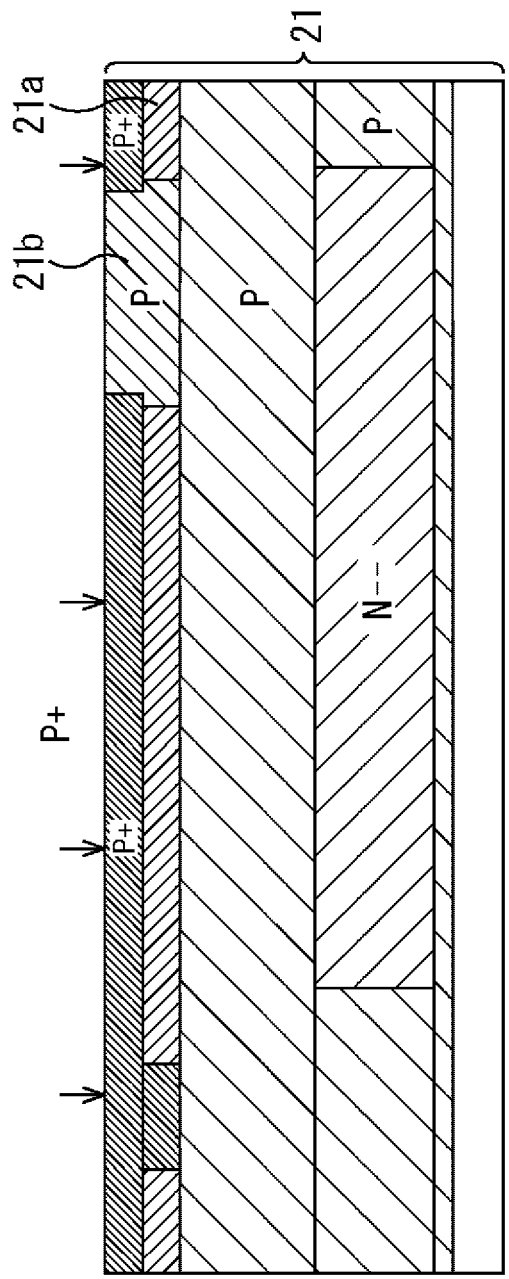
FIG. 11 A diagram for describing the manufacturing processes for the image sensor shown in FIG. 2.

Thereafter, as shown in FIG. 11, high-density P-type ions are implanted onto the silicon layer 21b. With this, the contact resistance is lowered. Note that the high-density P-type ions are not implanted onto a portion in which the TG is to be inserted. This is because this portion is for forming the channel of the TG.

Figure 12:
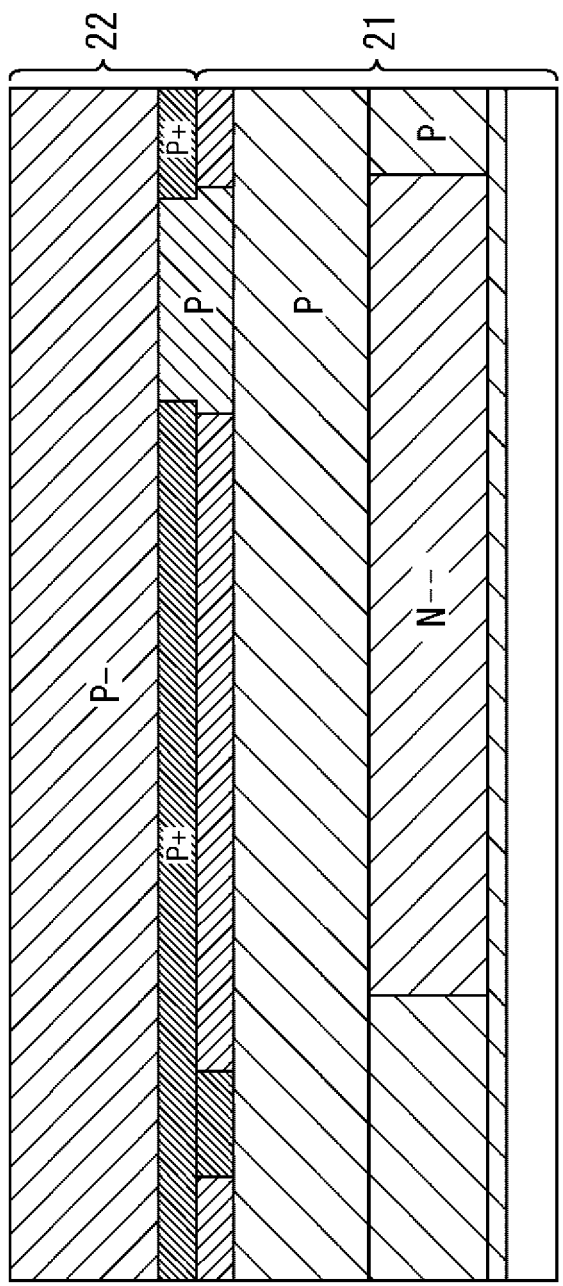
FIG. 12 A diagram for describing the manufacturing processes for the image sensor shown in FIG. 2.

Then, as shown in FIG. 12, a second semiconductor substrate 22 is bonded. At this time, a bonding interface between the first semiconductor substrate 21 and the second semiconductor substrate 22 is formed.

Note that, although not limited thereto, bonding the first semiconductor substrate 21 and the second semiconductor substrate 22 to each other can be performed by using a technique for bonding SOI substrates to each other, for example. For example, it includes direct bonding such as plasma bonding or van der Waals bonding, bonding in a vacuum atmosphere, and thermal annealing after bonding.

Furthermore, although not limited thereto, as surface processing before bonding the first semiconductor substrate 21 and the second semiconductor substrate 22 to each other, processing of making them hydrophilic and hydrophobic can be performed to reduce voids of the bonding interface and increase the bonding strength.

For example, it includes bonding after surfaces of the first semiconductor base 21 and the second semiconductor base 22 are immersed in a chemical liquid of hydrofluoric acid and dried, bonding after the surfaces are immersed in a chemical liquid of ammonia and hydrogen peroxide solution and dried, bonding after the surfaces are immersed in a chemical liquid of hydrochloric acid or sulfuric acid and hydrogen peroxide solution and dried, bonding after the surfaces are irradiated with plasma in a vacuum, bonding after they are irradiated with plasma in an ammonia or hydrogen atmosphere, and the like.

Furthermore, in order to enable the thickness of the substrate to be adjusted when the second semiconductor substrate 22 is thereafter polished, an SiN stopper may be inserted into the second semiconductor substrate 22 in advance. For example, due to the insertion of the SiN stopper in the second semiconductor substrate 22, it is possible to prevent the second semiconductor substrate 22 from being unnecessarily polished.

Furthermore, in order to enable the thickness of the substrate to be adjusted when the second semiconductor substrate 22 is thereafter polished, hydrogen ions may be implanted into the second semiconductor substrate 22 in advance. For example, by hydrogen ions being implanted into the second semiconductor substrate 22, in the layer in which the hydrogen ions are implanted, the second semiconductor substrate 22 can be separated by thermal annealing after bonding, leaving a portion bonded to the first semiconductor base 21.

Furthermore, in order to enable the thickness of the substrate to be adjusted when the second semiconductor substrate 22 is thereafter polished, oxygen ions may be implanted into the second semiconductor substrate 22 in advance. For example, by hydrogen ions being implanted into the second semiconductor substrate 22, the layer in which the oxygen ions is implanted becomes a compound of silicon and oxygen by thermal annealing after bonding. Therefore, it is possible to prevent the second semiconductor substrate 22 from being unnecessarily polished.

Furthermore, in order to enable the thickness of the substrate to be adjusted when the second semiconductor substrate 22 is thereafter polished, the inside of the second semiconductor substrate 22 may be made as an SOI substrate (silicon-on-insulator substrate) in advance. For example, by the second semiconductor substrate 22 being made as the SOI substrate, it is possible to prevent the second semiconductor substrate 22 from being unnecessarily polished.

Figure 13:
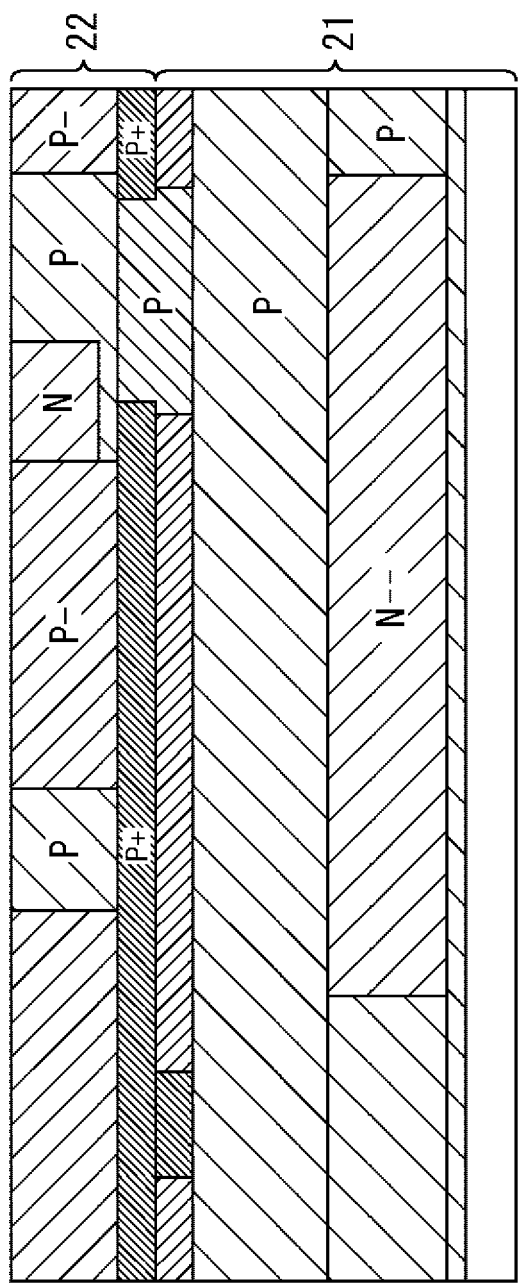
FIG. 13 A diagram for describing the manufacturing processes for the image sensor shown in FIG. 2.

Thereafter, as shown in FIG. 13, impurity ions are implanted into the second semiconductor substrate 22 to form the pixel transistors and the channel of the TG.

Figure 14:
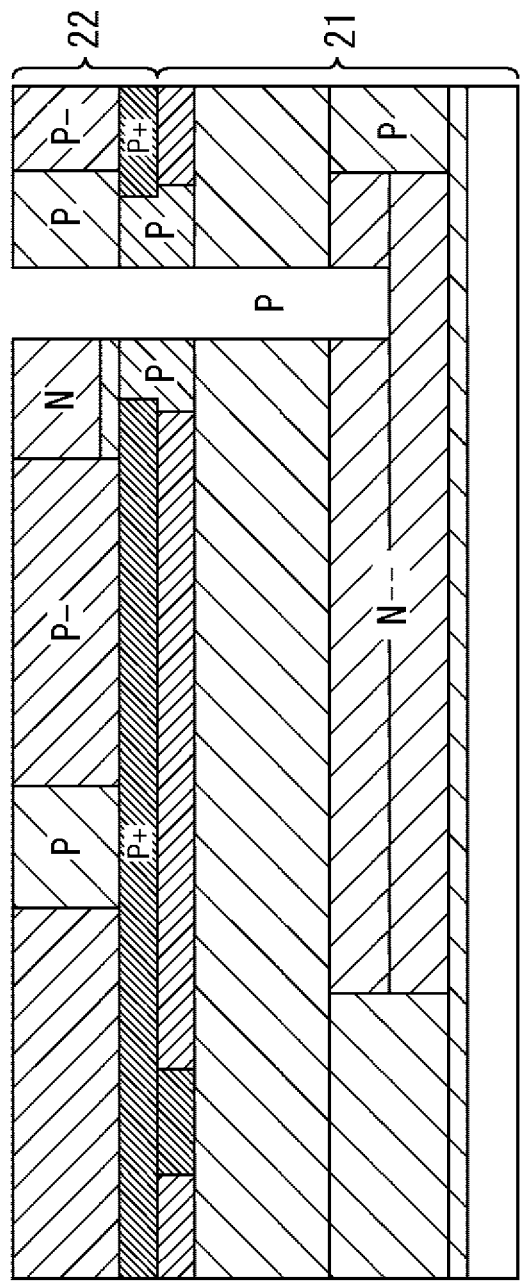
FIG. 14 A diagram for describing the manufacturing processes for the image sensor shown in FIG. 2.

In addition, as shown in FIG. 14, a hole is formed in a portion in which the gate terminal of the TG is to be disposed. This hole is formed by, for example, dry etching or wet etching.

Figure 15:
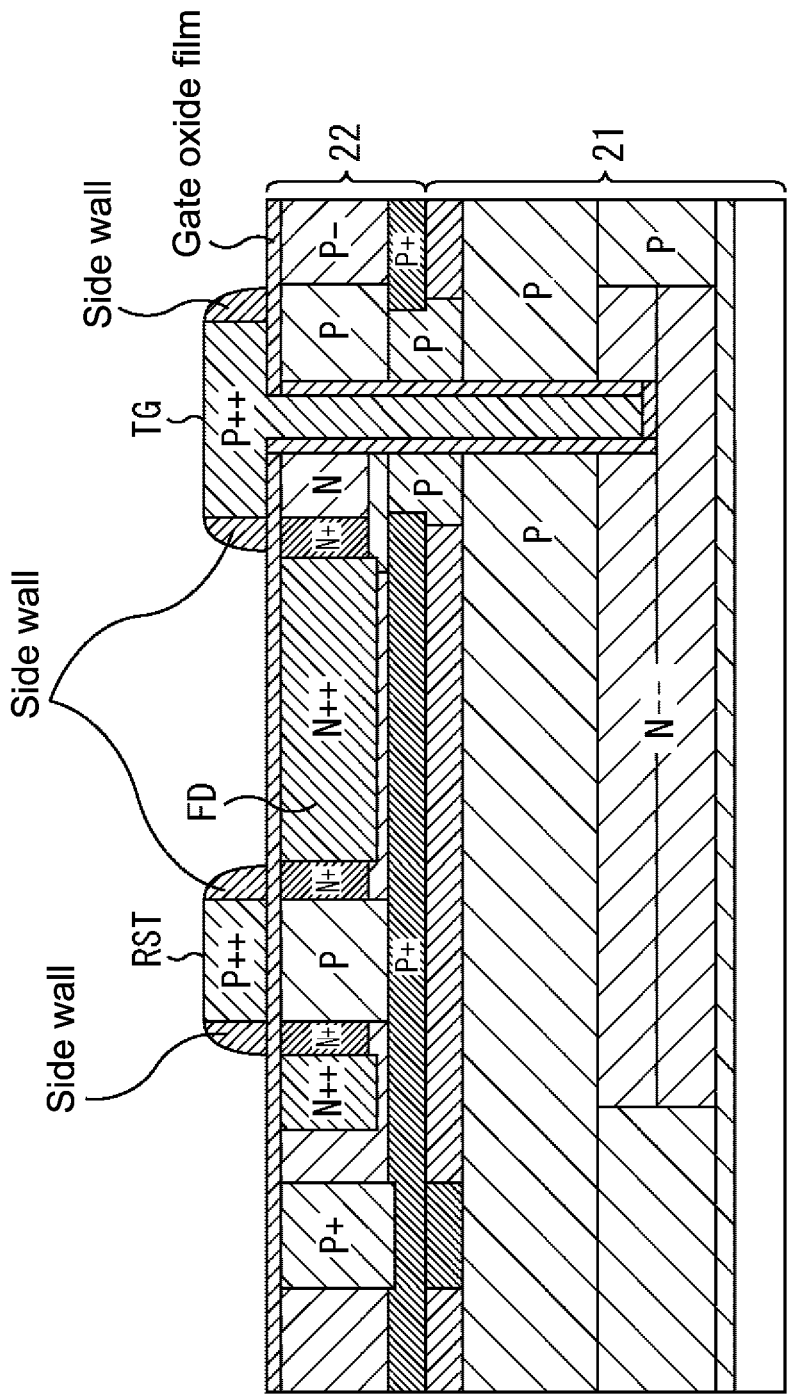
FIG. 15 A diagram for describing the manufacturing processes for the image sensor shown in FIG. 2.

Then, the $SiO_2$ film 21a is formed on the second semiconductor substrate 22 in the state as shown in FIG. 14 as the gate oxide film. As shown in FIG. 15, the pixel transistors (RST) and the TG are formed.

That is, polysilicon is grown on the gate oxide film by the CVD, a part of this polysilicon is removed by etching, and the gate terminal of the TG and the gate terminal of the RST are obtained as shown in FIG. 15. After that, the side walls are formed.

Furthermore, as shown in FIG. 15, the bonding interface between the first semiconductor substrate 21 and the second semiconductor substrate 22 is positioned near the drain terminal of the gate terminal of the TG.

Figure 16:
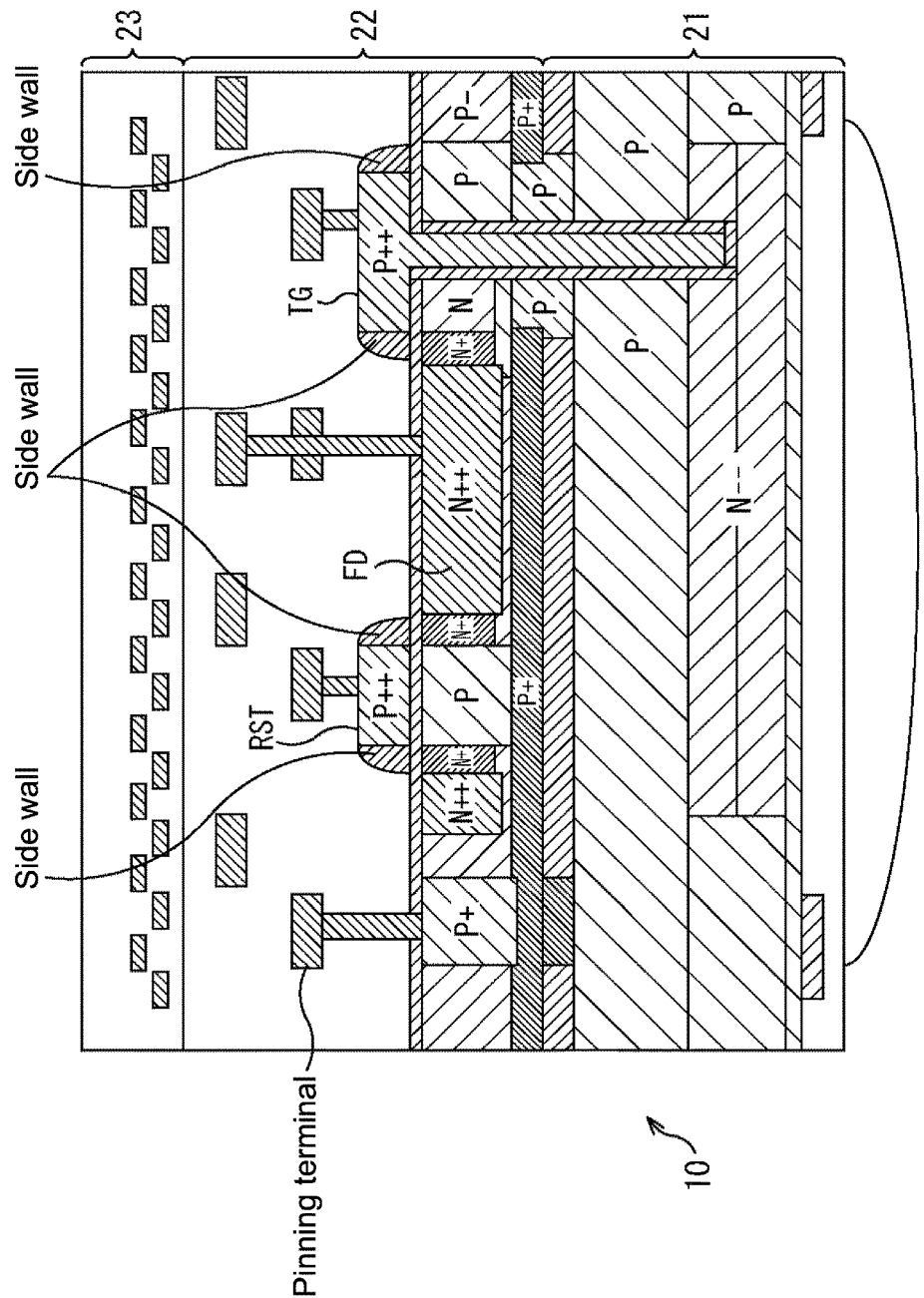
FIG. 16 A diagram for describing the manufacturing processes for the image sensor shown in FIG. 2.

Thereafter, as shown in FIG. 16, the wires, the pinning terminals, and the like to be connected to the pixel transistors (RST) and the TG are formed and the logic layer 23 is formed on the second semiconductor substrate 22. Furthermore, an on-chip lens is formed below the first semiconductor substrate 21. With this, the image sensor 10 is completed.

In the above-mentioned manner, the image sensor 10 to which the present technology is applied is manufactured.

As described above, in the image sensor 10 to which the present technology is applied, the pixel transistors and the FD are formed in the second semiconductor substrate 22 configured as the single-crystal substrate.

It is likely that the PD, the FD, and the transfer transistor can be formed in the single-crystal semiconductor substrate by, for example, using a lamination technique for a semiconductor layer 32 described in Patent Document 1 as the conventional techniques. However, in this method, according to Non-Patent Documents 1 to 14, many unintended crystal defects are present in the semiconductor substrate. Therefore, regarding the PD, the FD, and the transfer transistor, it becomes extremely difficult to manufacture single crystals having no defects with respect to all the pixels as the number of pixels of the image sensor becomes larger, for example. Therefore, a semiconductor on an insulating material is likely to be polycrystalline. Therefore, the pixel transistors become polycrystalline not single-crystal. In this case, the pixel transistors cannot be formed in the single-crystal semiconductor substrate. Therefore, a good I-V characteristic that is adaptable also to, for example, fine pixel signals cannot be obtained.

Furthermore, if the semiconductor substrate in which the pixel transistors are formed is polycrystalline, the particle size becomes uneven. Thus, many traps are generated, which induces noise and the like when electrons corresponding to fine pixel signals pass through the inside of the element.

In contrast, in the present technology, the pixel transistors and the FD are formed in the second semiconductor substrate 22 configured as the single-crystal substrate. That is, the second semiconductor substrate 22 configured as the single-crystal substrate is bonded to the first semiconductor substrate 21, and hence the pixel transistors and the FD can be formed in the single-crystal substrate.

Thus, it is possible to obtain a good I-V characteristic that is adaptable also to fine pixel signals and suppress variations in performance of the pixels.

Furthermore, as described above, in the present technology, the PD of the first semiconductor substrate 21 and the FD of the second semiconductor substrate 22 are electrically connected by the TG. That is, the metal wires or the like do not need to be used for electrical connection between the PD and the FD and Schottky barrier junction can be avoided. Noise generation can be thus suppressed.

In addition, in the present technology, the bonding interface between the first semiconductor substrate 21 and the second semiconductor substrate 22 is formed near the drain terminal of the channel of the TG. Thus, the deterioration of the charge transfer performance is suppressed and the life of the elements and the resistance of the gate oxide film can be enhanced.

Furthermore, a parasitic resistance is generated at the bonding interface and the parasitic resistance results in a leakage current.

Figure 17:
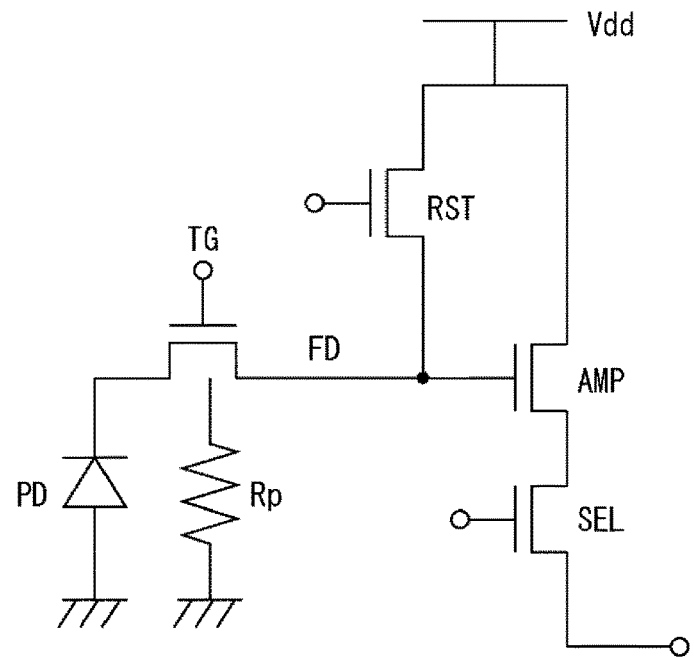
FIG. 17 A diagram showing an equivalent circuit of the image sensor shown in FIG. 1.

FIG. 17 shows an equivalent circuit of the image sensor 10 shown in FIG. 1. As described above, in the present technology, the bonding interface between the first semiconductor substrate 21 and the second semiconductor substrate 22 is formed in the channel of the TG. Therefore, in the equivalent circuit of FIG. 17, a resistance Rp that is connected to the TG and in parallel to the PD is shown as the parasitic resistance.

In the case of the equivalent circuit of FIG. 17, a leakage current is generated in the TG. However, when the TG is turned OFF, no noise is mixed in signals transferred from the PD. On the other hand, when the TG is turned ON, noise can be mixed in signals transferred from the PD. However, by configuring the channel of the TG to have an HAD (Hole-Accumulation Diode) structure and increasing the switching speed of the TG, signals transferred from the PD become sufficiently larger with respect to noise. Thus, by, for example, improving the structure of the channel of the TG and the switching speed, the influences of noise due to the leakage current can be made sufficiently small.

Figure 18:
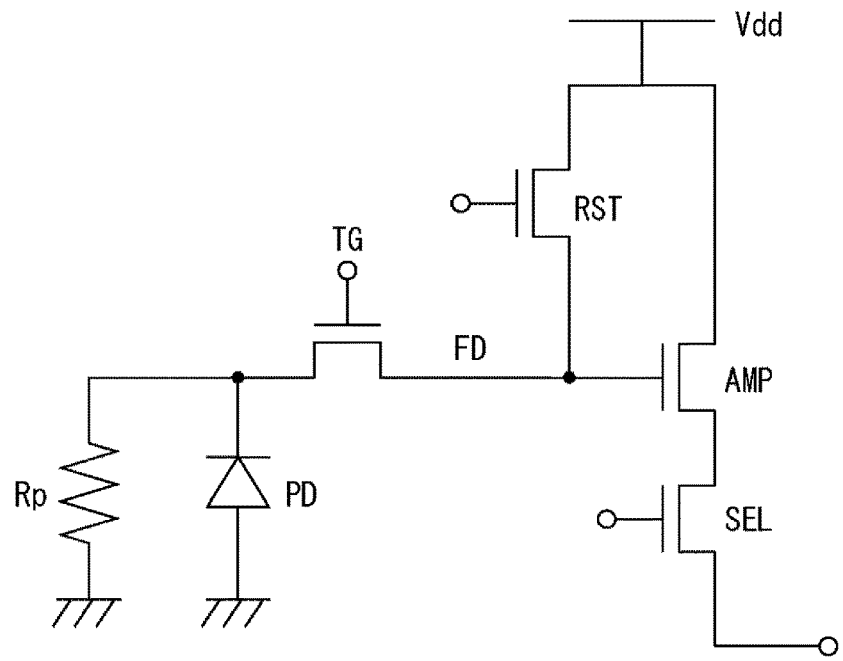
FIG. 18 A diagram showing an equivalent circuit in the case where a bonding interface is formed in a PD.

For example, if a bonding interface is formed in the PD, the equivalent circuit is as shown in FIG. 18. In the equivalent circuit shown in FIG. 18, a resistance Rp that is disposed in parallel to the PD and connected thereto is shown as the parasitic resistance.

In the case of the equivalent circuit shown in FIG. 18, a leakage current is constantly generated in the PD and large noise is mixed in the signals transferred from the PD. Noise is conspicuous particularly in pixels corresponding to a dark region of an image.

Figure 19:
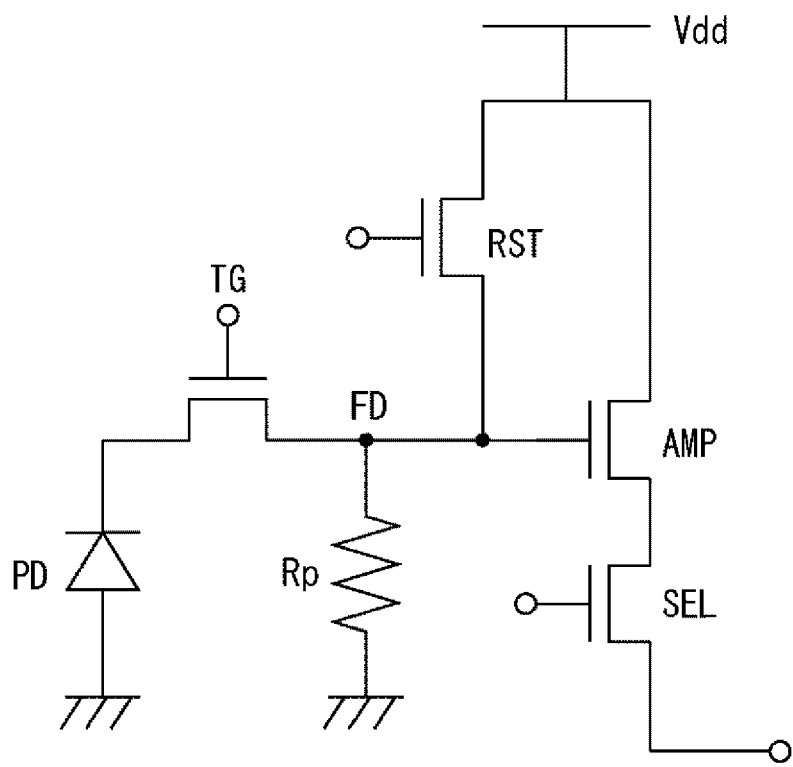
FIG. 19 A diagram showing an equivalent circuit in the case where a bonding interface is formed in the FD.

Furthermore, for example, if a bonding interface is formed in the FD, the equivalent circuit is as shown in FIG. 19. In the equivalent circuit shown in FIG. 19, a resistance Rp that is connected branching from the FD is shown as the parasitic resistance.

Also in the case of the equivalent circuit shown in FIG. 19, a leakage current is constantly generated in the FD and noise is conspicuous in pixels corresponding to a darker region of an image.

As can also be seen from FIGS. 17 to 19, it is desirable that the bonding interface between the first semiconductor substrate 21 and the second semiconductor substrate 22 be formed near the drain terminal of the channel of the TG.

With the present technology, with respect to all the pixels of the image sensor, the bonding interface between the first semiconductor substrate 21 and the second semiconductor substrate 22 can be set at positions, which are intended by the designer, only within the channels of the TGs. In addition, an image sensor having no bonding interfaces in the PDs and the FDs or in the pixel transistors other than the TGs can be fabricated.

For example, in an image sensor including several million pixels, bonding interfaces between the first semiconductor substrate 21 and the second semiconductor substrate 22 are formed all at the same positions, which are purposefully set by the designer, in channels of all the TGs. In addition, an image sensor having no bonding interfaces in the PDs and FDs or in the pixel transistors other than the TGs can be fabricated.

With this, a leakage current due to a parasitic resistance that is caused by the bonding position in the TG shown in the equivalent circuit of FIG. 17 is generated. However, a leakage current due to the parasitic resistance which is caused by the bonding position in the PD and the bonding position in the FD shown in FIGS. 18 and 19 is not generated. With this, it becomes possible to fabricate the image sensor from a semiconductor material having uniform crystals, the pixels and the semiconductor elements such as the pixel transistors, sandwiching the light-shielding film.

Figure 20:
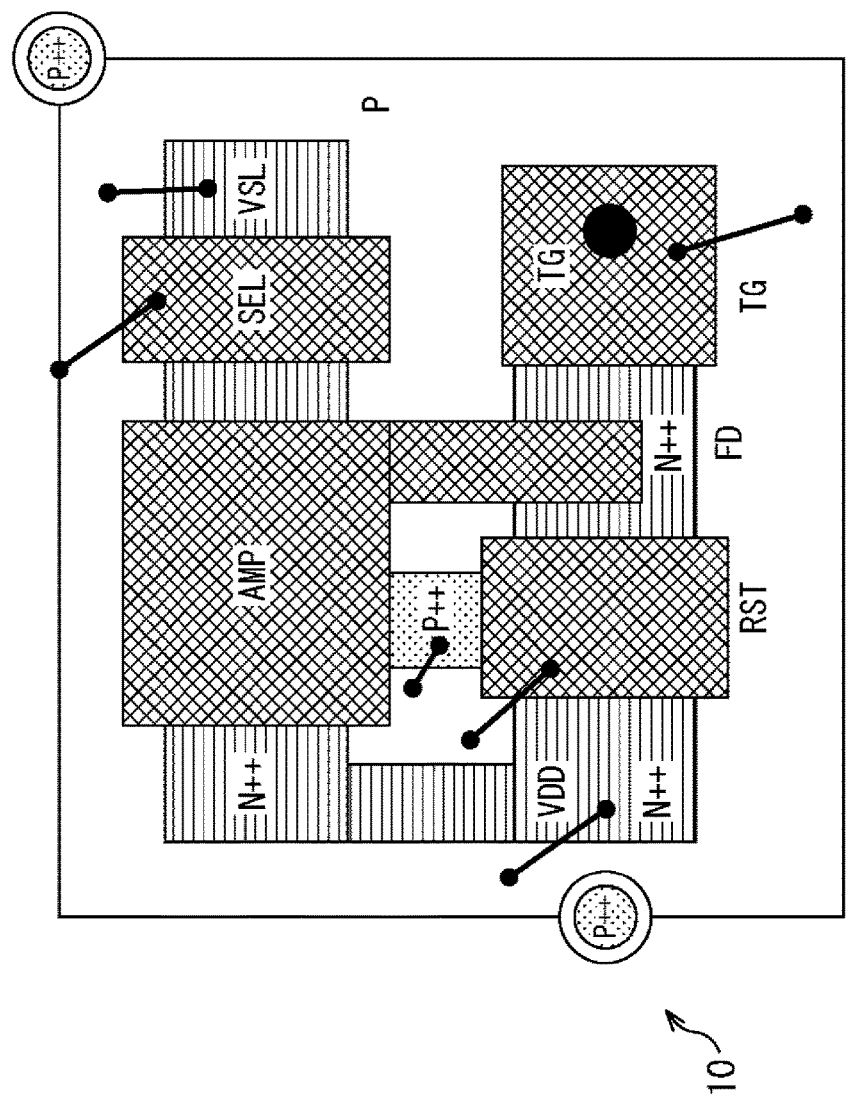
FIG. 20 A plan view showing a configuration example according to another embodiment of the image sensor to which the present technology is applied.

FIG. 20 is a plan view showing a configuration example according to another embodiment of the image sensor to which the present technology is applied. In an image sensor 10 shown in the figure, a region corresponding to an area of one pixel formed on a semiconductor substrate having a planar structure is illustrated.

As in the case of FIG. 1, each pixel of the image sensor 10 of FIG. 20 is also configured to transfer charges accumulated in the photodiode to a floating diffusion (FD) and read out a signal voltage corresponding to the charges retained by the FD via an amplifying transistor (AMP). Note that the signal voltage is read out on a vertical signal line (VSL) and the VSL is connected to the AMP via a selection transistor (SEL).

Furthermore, each pixel of the image sensor 10 is provided with a reset transistor (RST) for discharging (resetting) the charges retained by the FD.

In addition, in portions denoted by the characters and symbols of "P++" in circles positioned in the left and right in FIG. 1, pinning terminals are provided.

The image sensor 10 of FIG. 20 also has a structure in which at least two semiconductor substrates are laminated. In FIG. 20, a light-receiving surface of PD of the image sensor 10 is located in a rear surface. Furthermore, in the figure, a top surface of a semiconductor substrate of the two semiconductor substrates, on which mainly the FD and the pixel transistors are provided, is shown.

That is, also in FIG. 20, the image sensor 10 is actually configured as an image sensor including a plurality of pixels. For example, a pixel array in which light-receiving portions placed on the rear surface in FIG. 20 are arranged in a two-dimensional matrix form is located at a position at which light collected by lenses and the like of a camera forms an image.

In the image sensor 10 shown in FIG. 20, unlike the case of FIG. 1, the gate terminal of the AMP and the FD are connected by polysilicon in which highly-concentrated impurities are implanted, not by connection with the metal wires. That is, a part of the AMP is connected to the FD.

For example, as in the case of FIG. 1, if a gate terminal of an AMP and an FD are connected to each other with metal wires, bonding of a metal with a semiconductor (Schottky barrier junction) becomes necessary and noise is more easily mixed in pixel signals. As shown in FIG. 20, the gate terminal of the AMP and the FD are connected to each other by polysilicon in which the highly-concentrated impurities are implanted, and hence the Schottky barrier junction becomes unnecessary. It is thus possible to reduce noise mixed in the pixel signals.

Figure 21:
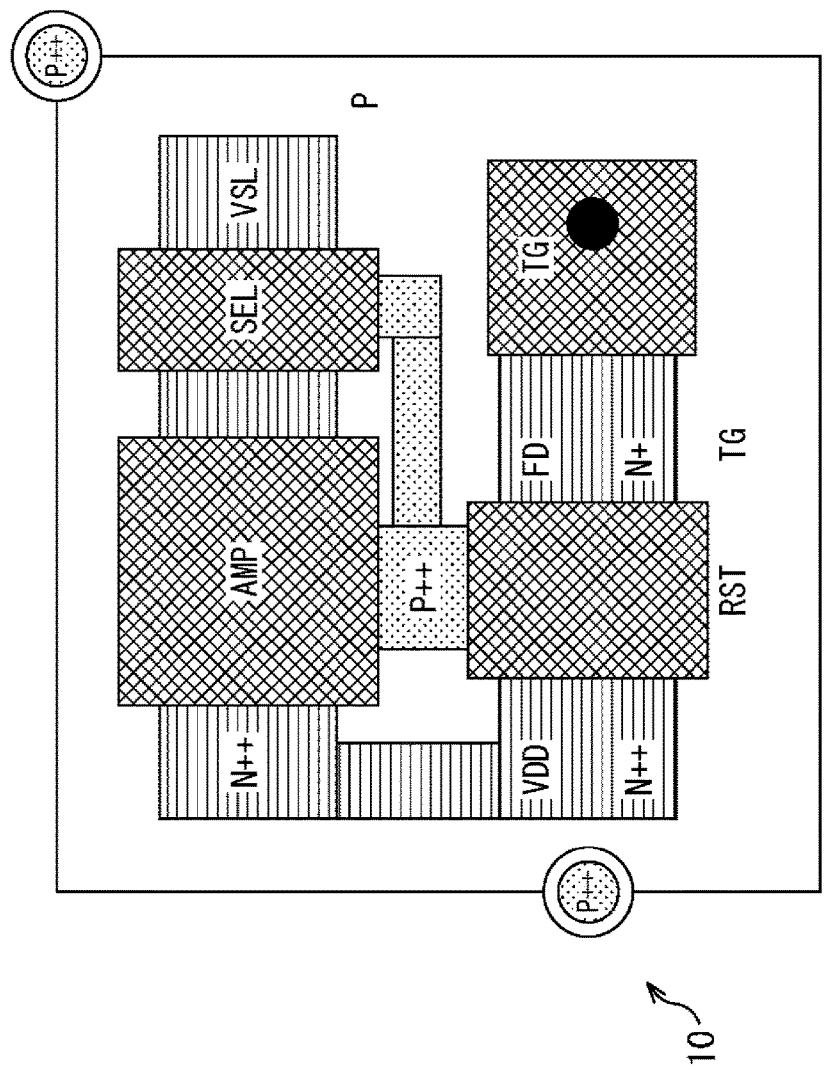
FIG. 21 A plan view showing a configuration example according to still another embodiment of the image sensor to which the present technology is applied.

Alternatively, the image sensor to which the present technology is applied may be configured as shown in FIG. 21.

FIG. 21 is a plan view showing a configuration example according to still another embodiment of the image sensor to which the present technology is applied. In an image sensor 10 shown in the figure, a region corresponding to an area of one pixel formed on a semiconductor substrate having a planar structure is illustrated.

As in the case of FIG. 1, each pixel of the image sensor 10 of FIG. 21 is also configured to transfer charges accumulated in the photodiode to a floating diffusion (FD) and read out a signal voltage corresponding to the charges retained by the FD via an amplifying transistor (AMP). Note that the signal voltage is read out on a vertical signal line (VSL) and the VSL is connected to the AMP via a selection transistor (SEL).

Furthermore, each pixel of the image sensor 10 is provided with a reset transistor (RST) for discharging (resetting) the charges retained by the FD.

In addition, in portions denoted by the characters and symbols of "P++" in circles positioned in the left and right in FIG. 21, pinning terminals are provided.

The image sensor 10 of FIG. 21 also has a structure configured by laminating at least two semiconductor substrates. In FIG. 21, the light-receiving surface of the PD of the image sensor 10 is placed on the rear surface. Furthermore, in the figure, out of the two semiconductor substrates described above, a top surface of the semiconductor substrate on which mainly the FD and the pixel transistors are provided is shown.

That is, also in the case of FIG. 21, the image sensor 10 is actually configured as an image sensor including a plurality of pixels. For example, a pixel array in which light-receiving portions placed on the rear surface in FIG. 21 are arranged in a two-dimensional matrix form is located at a position at which light collected by lenses and the like of a camera forms an image.

In the image sensor 10 shown in FIG. 21, a body contact that connects an AMP and RST and SEL to each other is provided as a high-density P-type semiconductor region. Due to the body contact, the potentials of channels of the AMP, the RST, and the SEL are fixed, and hence the operation of the pixel transistors is stabilized.

Figure 22:
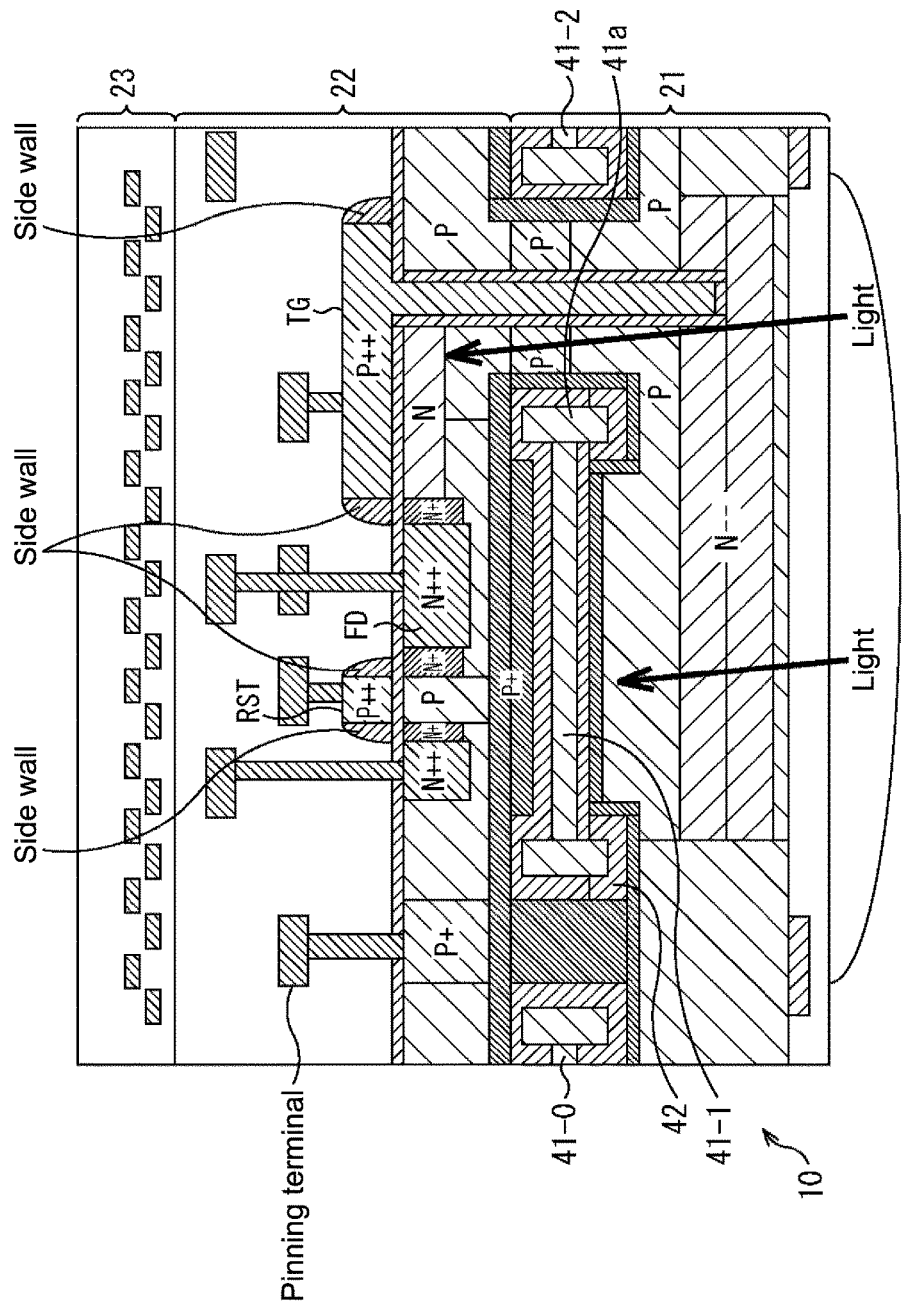
FIG. 22 A sectional view showing a configuration example according to still another embodiment of the image sensor to which the present technology is applied.

FIG. 22 is a sectional view showing a configuration example according to still another embodiment of the image sensor to which the present technology is applied. The figure is a sectional view corresponding to FIG. 2.

Also in the example of FIG. 22, the image sensor 10 is configured by bonding the first semiconductor substrate 21 and the second semiconductor substrate 22 to each other, and hence the bonding surface between the first semiconductor substrate and the second semiconductor substrate is a bonding interface.

Regarding the TG that is the transistor, a part of an "N--" region that is held in contact with the lower side in the figure of the gate terminal is a source terminal. A part of an "N" region that is held in contact with the left side on the upper side in the figure of the gate terminal is a drain terminal. That is, a channel of the transistor is formed in the portion from the source terminal to the drain terminal in the gate terminal. Thus, also in the case of FIG. 22, in the image sensor 10, the bonding interface is present in the channel of the transistor.

Furthermore, in the example of FIG. 22, unlike the case of FIG. 2, light-shielding films 41-0 to 41-2 are provided below the bonding interface between the first semiconductor substrate and the second semiconductor substrate in the figure. Regarding a material for the light-shielding film, although not limited thereto, it can be formed of a material including a particular metal, a metal alloy, a metal nitride, and a metal silicide. For example, tungsten, titanium, tantalum, nickel, molybdenum, chromium, iridium, platinum iridium, titanium nitride, or a tungsten silicon compound can be used.

As described above, the image sensor 10 has the light-receiving surface on the lower side in the figure. Therefore, for example, when received light leaks into the transistor or the FD, carriers (electrons) are generated, which results in noise. As shown in FIG. 22, due to the provision of a light-shielding film 41-1, light does not leak into the RST or the FD.

Furthermore, as shown in FIG. 22, the light-shielding film is not provided below the TG in the figure. This is because it is necessary to extend the gate terminal of the TG in the vertical direction.

However, even if light leaks into the TG when the TG is turned OFF, carriers are not generated. Furthermore, if light leaks into the TG when the TG is turned ON, carriers are generated. However, it can be considered that the time for which the TG is turned ON is sufficiently short, and hence noise due to the generated carriers becomes substantially ignorable.

In addition, an end portion on the right side in the figure of the light-shielding film 41-1 and an end portion on the left side in the figure of the light-shielding film 41-2 are formed in a T-shape (lateral T-shape). Therefore, light leaking into the TG can be minimized.

That is, in the image sensor 10 to which the present technology is applied, the gate terminal of the TG is formed to penetrate the second semiconductor substrate and reach the first semiconductor substrate 21, and hence the light-shielding film 41-1 cannot be extended to the right in the figure. Therefore, near the gate terminal of the TG, there is a portion in which the light-shielding film is not provided.

However, as shown in FIG. 22, near the gate terminal of the TG, the end portion of the light-shielding film is configured to be longer in the vertical direction (direction parallel to extending direction of gate terminal of TG). In this manner, the light passing through the portion in which the light-shielding film is not provided and reaching the second semiconductor substrate 22 can be minimized.

By providing the light-shielding film in this manner, noise of pixel signals of the image sensor 10 can be reduced.

Figure 23:
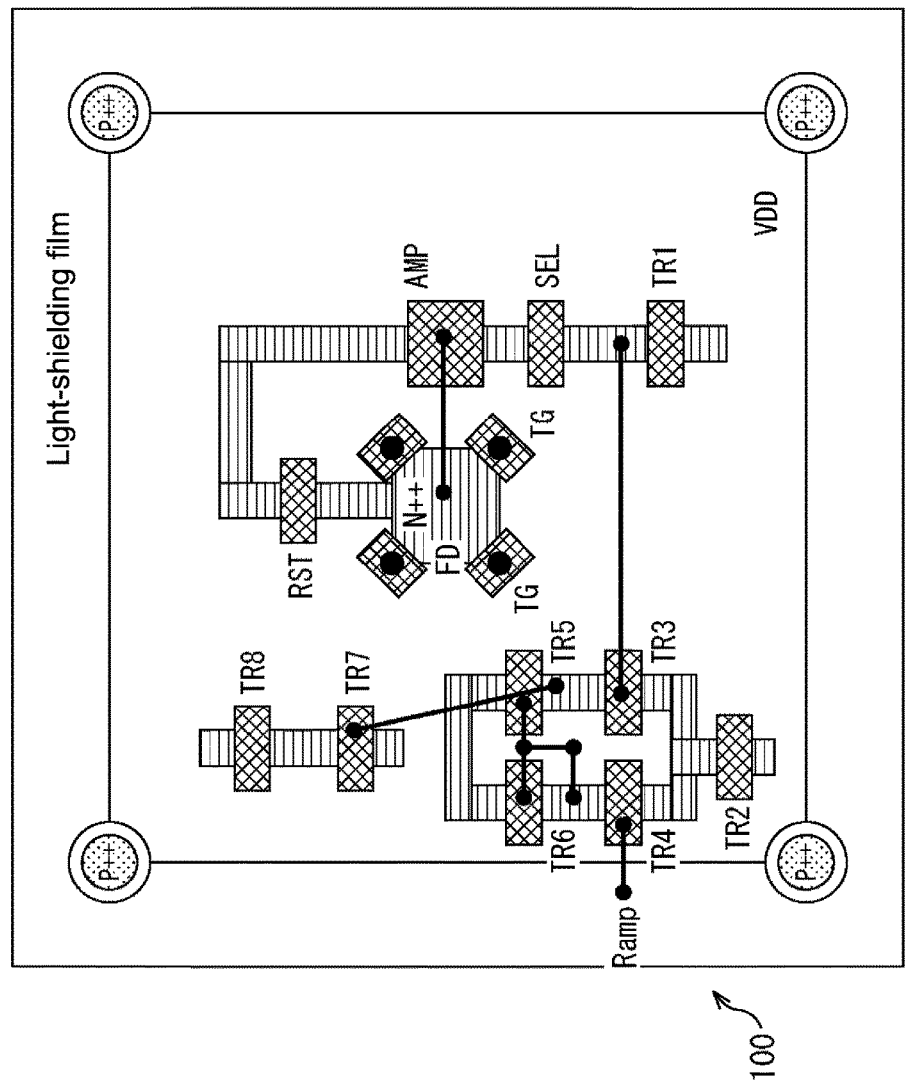
FIG. 23 A plan view showing a configuration example according to still another embodiment of the image sensor to which the present technology is applied.

FIG. 23 is a plan view showing a configuration example according to still another embodiment of the image sensor to which the present technology is applied. In an image sensor 10 shown in the figure, a region corresponding to an area of four pixels formed on a semiconductor substrate having a planar structure is illustrated.

Note that, unlike the case of FIG. 1 or the like, the image sensor 100 shown in FIG. 23 has a four-pixel sharing structure. That is, in an image sensor 10 shown in the figure, a region corresponding to an area of four pixels formed on a semiconductor substrate.

The image sensor 100 is, for every four pixels, configured to transfer charges accumulated in the photodiode to a floating diffusion (FD) and read out a signal voltage corresponding to the charges retained by the FD via an amplifying transistor (AMP). Note that the signal voltage is read out on a vertical signal line (VSL) and the VSL is connected to the AMP via a selection transistor (SEL).

Furthermore, each pixel of the image sensor 100 is provided with a reset transistor (RST) for discharging (resetting) the charges retained by the FD. In addition, in portions denoted by the characters and symbols of "P++" in circles positioned in the upper, lower, left, and right ends in FIG. 23, pinning terminals are provided.

Furthermore, TR1 to TR8 shown in the figure are transistors each constituting an ADC (analog-to-digital converter) circuit.

As in the image sensor 10 shown in FIG. 1, this image sensor 100 has a structure configured by laminating at least two semiconductor substrates. In FIG. 23, the light-receiving surface of the PD of the image sensor 100 is placed on the rear surface.

That is, also the case of FIG. 23, the image sensor 100 is actually configured as an image sensor including a plurality of pixels. For example, a pixel array in which light-receiving portions placed on the rear surface in FIG. 23 are arranged in a two-dimensional matrix form is located at a position at which light collected by lenses and the like of a camera forms an image.

Furthermore, FIG. 23 shows a top surface of the semiconductor substrate of the two semiconductor substrates, on which mainly the FD and the pixel transistors are provided, is shown. Furthermore, FIG. 23 shows a part of the light-shielding film provided between the light-receiving surface and the FD.

Then, a transfer gate transistor (TG) is provided corresponding to electrically connecting the PD and the FD to each other. That is, the TG is provided penetrating the semiconductor substrate in a depth direction of the sheet. In the example of FIG. 23, unlike the case of FIG. 1, four TGs corresponding to four pixels are provided.

Figure 24:
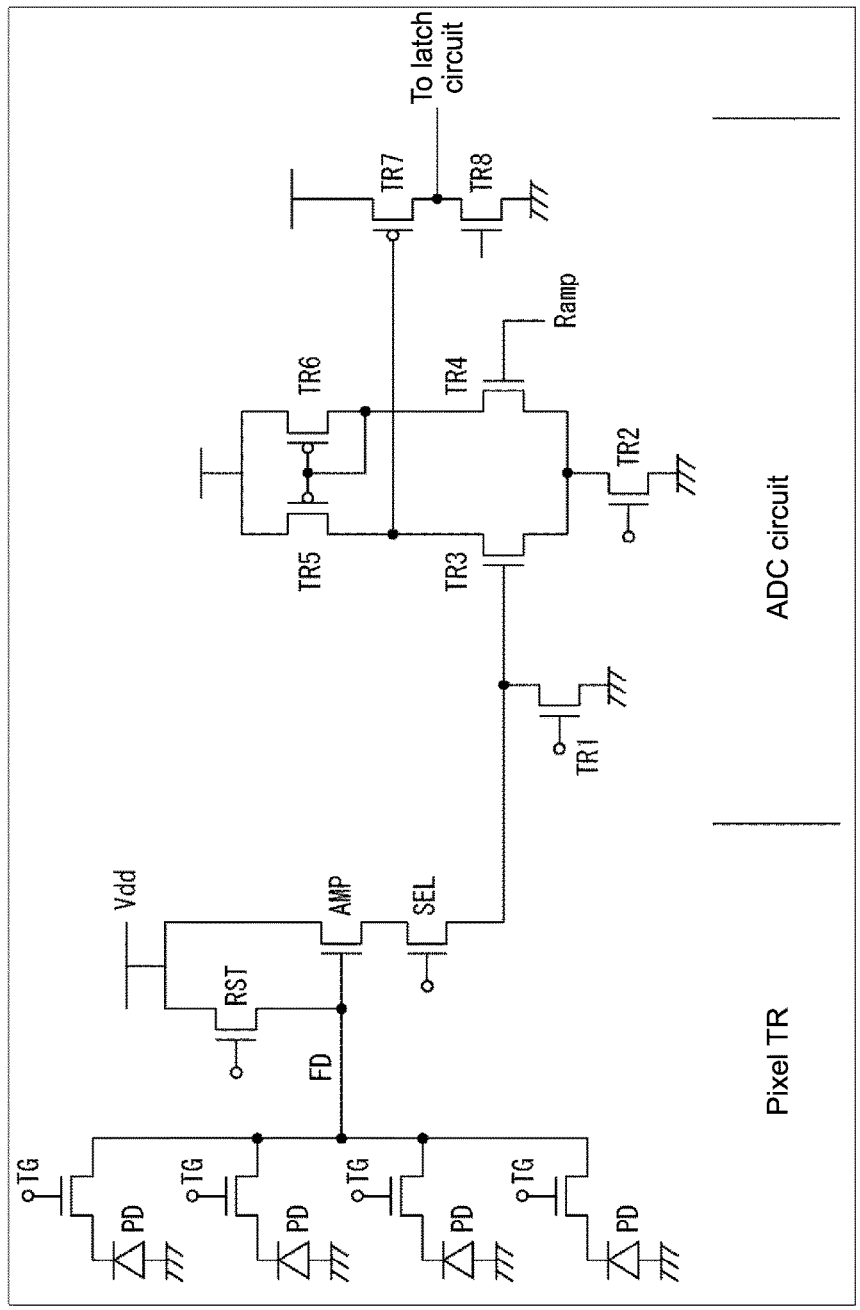
FIG. 24 A diagram of a circuit formed on a second semiconductor substrate in the image sensor shown in FIG. 23.

FIG. 24 is a circuit diagram formed on the second semiconductor substrate in the image sensor 100 shown in FIG. 23. As shown in the figure, a configuration in which charges are transferred from each of the PDs corresponding to the four pixels to the FD via the TG. Furthermore, an ADC circuit is configured by TR1 to TR8.

Also in the case of the image sensor 100, as in the case of the image sensor 10, the pixel transistors and the FD are formed in the second semiconductor substrate 22 configured as the single-crystal substrate.

Thus, it is possible to obtain a good I-V characteristic that is adaptable also to fine pixel signals and suppress variations in performance of the pixels.

Furthermore, also in the case of the image sensor 100, as in the case of the image sensor 10, the PD of the first semiconductor substrate 21 and the FD of the second semiconductor substrate 22 are electrically connected by the TG and the bonding interface between the first semiconductor substrate 21 and the second semiconductor substrate 22 is formed near the drain terminal of the channel of the TG. Thus, the charge transfer performance is not deteriorated and the problems relating to the life of the elements and the resistance of the gate oxide film do not occur.

Figure 25:
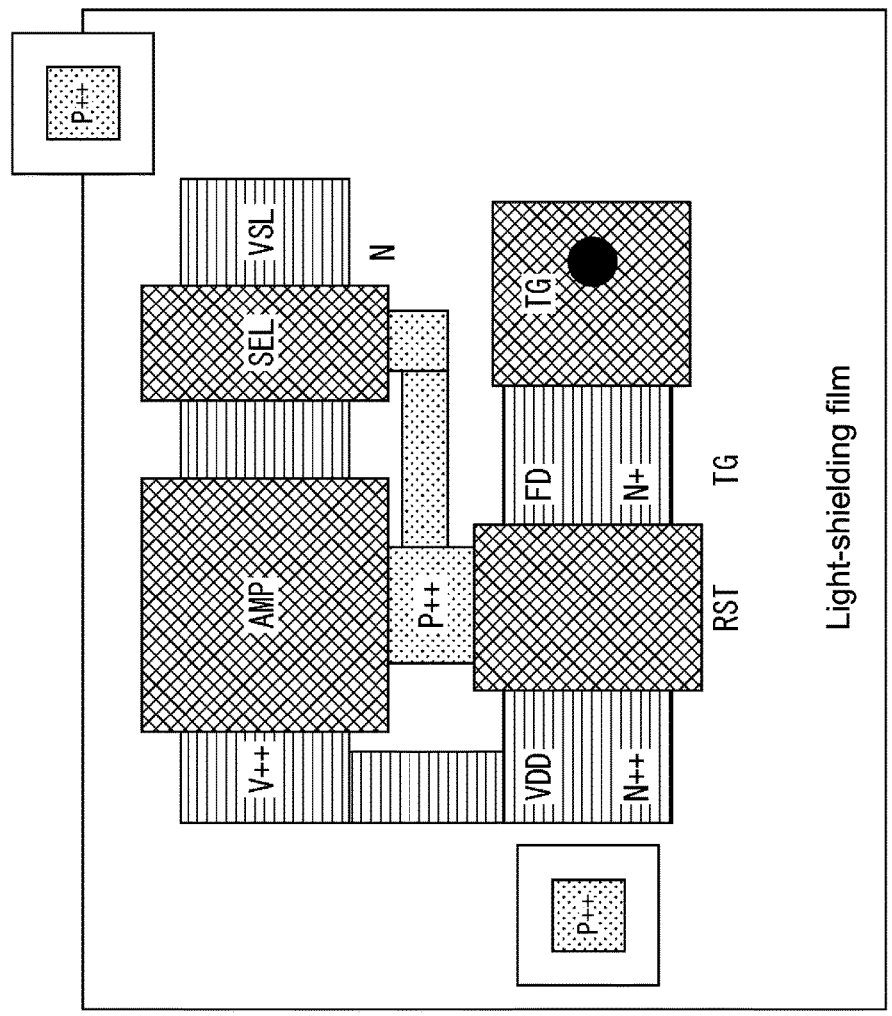
FIG. 25 A plan view showing a configuration example according to still another embodiment of the image sensor to which the present technology is applied.

The example of the image sensor formed on the semiconductor substrate having a planar structure has been described above. The present technology can also be applied to an image sensor formed on a semiconductor substrate having a mesa structure. FIG. 25 is a plan view showing a configuration example according to still another embodiment of the image sensor to which the present technology is applied.

The image sensor 10 shown in FIG. 25 is configured to have a mesa structure. The mesa structure means one that has a mesa-shaped cross-section and allows a current to flow in a thickness direction. By employing the mesa structure, the transistors can be completely insulated from each other and noise and the like can be prevented from mixing.

Also in the case of FIG. 25, the image sensor 10 is actually configured as an image sensor including a plurality of pixels. For example, a pixel array in which light-receiving portions placed on the rear surface in FIG. 25 are arranged in a two-dimensional matrix form is located at a position at which light collected by lenses and the like of a camera forms an image.

Figure 26:
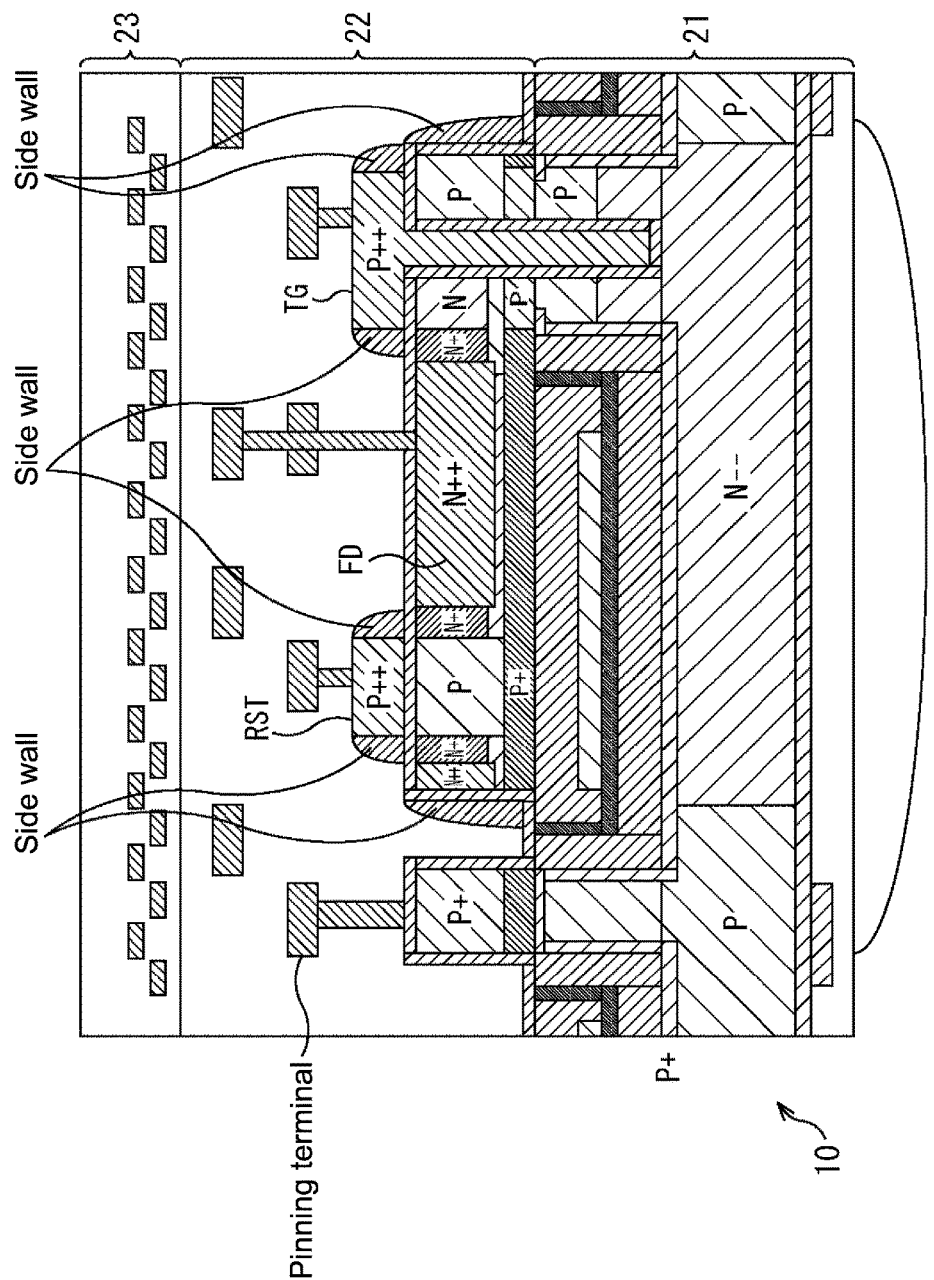
FIG. 26 A sectional view of the image sensor shown in FIG. 25.

FIG. 26 is a sectional view of the image sensor 10 shown in FIG. 25. As shown in the figure, the image sensor 10 is constituted of the first semiconductor substrate 21, the second semiconductor substrate 22, and the logic layer 23. The symbols of "P" and "N" in the figure represent a P-type semiconductor region and an N-type semiconductor region, respectively. Furthermore, the symbols of "P+" and "P−" and "N+" and "N−" represent a high-density P-type and a low-density P-type and a high-density N-type and a low-density N-type, respectively. The density thereof is expressed by the number of "+" or "−." Note that, in FIG. 26, the lower side in the figure is the light-receiving surface of the image sensor 10.

The first semiconductor substrate 21 is a semiconductor substrate on which mainly the PD is formed. That is, charges generated corresponding to light entering from the lower side of FIG. 26 are accumulated in the PD of the first semiconductor substrate 21.

The second semiconductor substrate 22 is a semiconductor substrate on which mainly the pixel transistors and the FD are formed. In the example of FIG. 26, the RST that is one of the pixel transistors are formed on the second semiconductor substrate 22 together with the FD. Furthermore, a pinning terminal is provided near the left end portion in the figure of the second semiconductor substrate 22.

The logic layer is a layer in which, for example, an analog-to-digital converter circuit (ADC) is formed.

As in the case of the configuration of FIG. 2, in the image sensor 10 shown in FIG. 26, the TG electrically connects the PD of the first semiconductor substrate 21 and the FD of the second semiconductor substrate 22 to each other. That is, the TG is provided penetrating the second semiconductor substrate 22 and reaching the first semiconductor substrate 21. That is, in the figure, the TG that is the transistor shown on the right side in the figure includes a gate terminal extending long in a vertical direction in the figure.

Note that the transistor shown on the left side in the figure is the RST and the pinning terminal is shown on the left side of the RST in the figure.

Furthermore, the side walls are formed on both the left and right sides of the TG and the RST.

In addition, also in the configuration of FIG. 26, a bottom of the second semiconductor substrate 22 is configured as a single-crystal substrate. That is, the image sensor 10 is configured by, for example, bonding the first semiconductor substrate 21 configured by forming an insulating film on a silicon substrate and the second semiconductor substrate 22 configured as the silicon single-crystal substrate to each other.

Note that, in the case of the configuration of FIG. 26, unlike the case of FIG. 2, a mesa including the TG and the RST is formed and the side walls are formed on both the left and right sides of the mesa.

Furthermore, as described above, the image sensor 10 is configured by bonding the first semiconductor substrate 21 and the second semiconductor substrate 22 to each other, and hence the bonding surface between the first semiconductor substrate and the second semiconductor substrate is a bonding interface.

Regarding the TG that is the transistor, a part of an "N−−" region that is held in contact with the lower side in the figure of the gate terminal is a source terminal. A part of an "N" region that is held in contact with the left side on the upper side in the figure of the gate terminal is a drain terminal. That is, a channel of the transistor is formed in the portion from the source terminal to the drain terminal in the gate terminal. Thus, also in the case of FIG. 22, in the image sensor 10, the bonding interface is present in the channel of the transistor.

Next, manufacturing processes for the image sensor 10 shown in FIG. 26 will be described.

Figure 27:
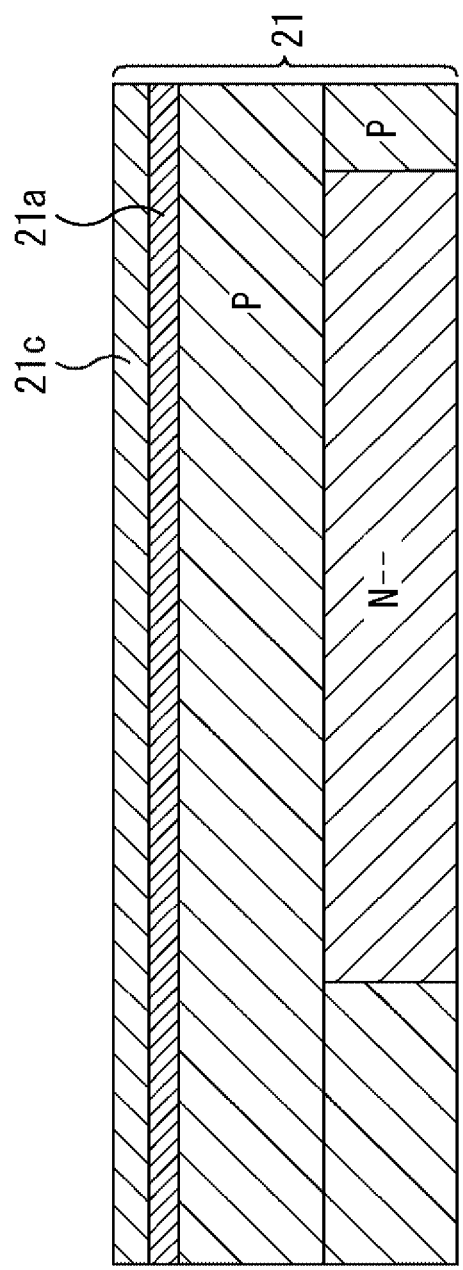
FIG. 27 A diagram for describing manufacturing processes for the image sensor shown in FIG. 26.

First, as shown in FIG. 27, an $SiO_2$ film 21a and an SiN film 21c that are formed on a first semiconductor substrate 21 configured as a silicon substrate is prepared. Note that, in FIG. 27, P-type semiconductor regions denoted by the symbols "P" and an N-type semiconductor region denoted by the symbol "N−−" are formed in the first semiconductor substrate. The N-type semiconductor region serves as a charge accumulation region of the PD.

Figure 28:
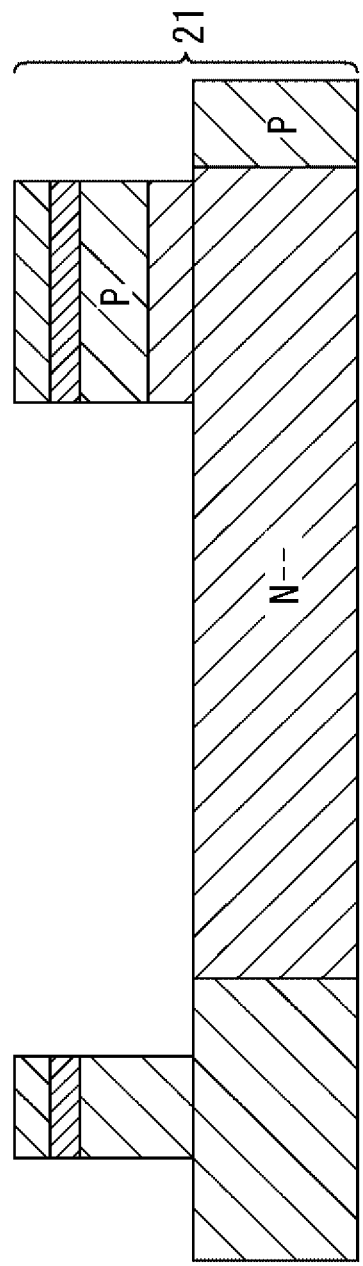
FIG. 28 A diagram for describing the manufacturing processes for the image sensor shown in FIG. 26.

Then, as shown in FIG. 28, the $SiO_2$ film 21a and the SiN film 21c as well as the silicon substrate are subjected to dry etching. With this, in the subsequent step, except for the positions corresponding to the portion in which the TG is formed and the portion in which a pinning terminal is formed, the $SiO_2$ film 21a and the SiN film 21c as well as the silicon substrate are removed.

Figure 29:
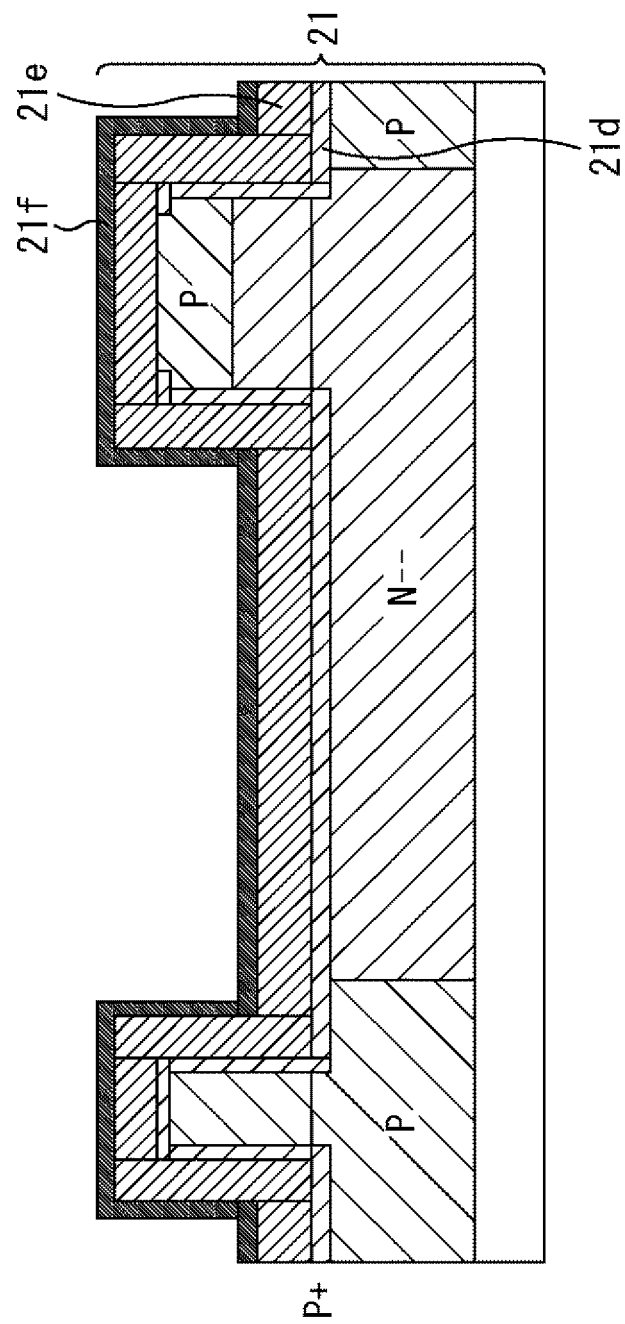
FIG. 29 A diagram for describing the manufacturing processes for the image sensor shown in FIG. 26.

Thereafter, the $SiO_2$ film 21a and the SiN film 21c are removed. As shown in FIG. 29, a pinning film 21d, an $SiO_2$ film 21e, and an insulating film 21f are formed.

Figure 30:
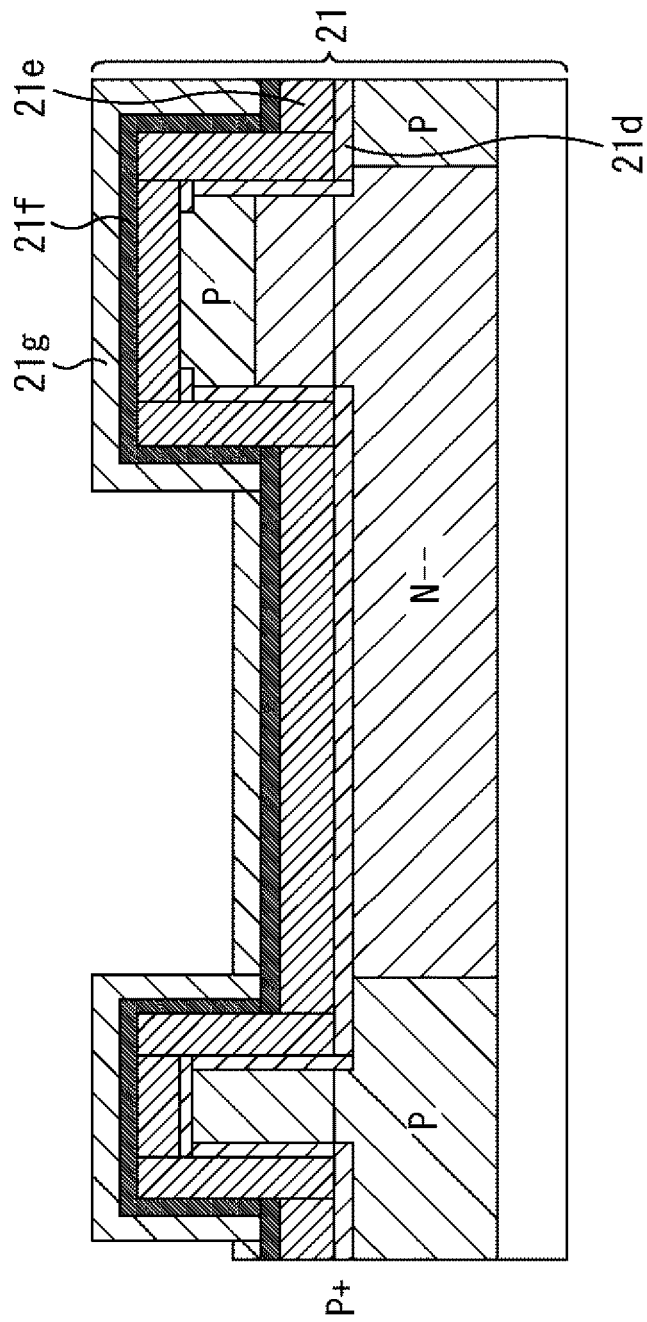
FIG. 30 A diagram for describing the manufacturing processes for the image sensor shown in FIG. 26.
Figure 31:
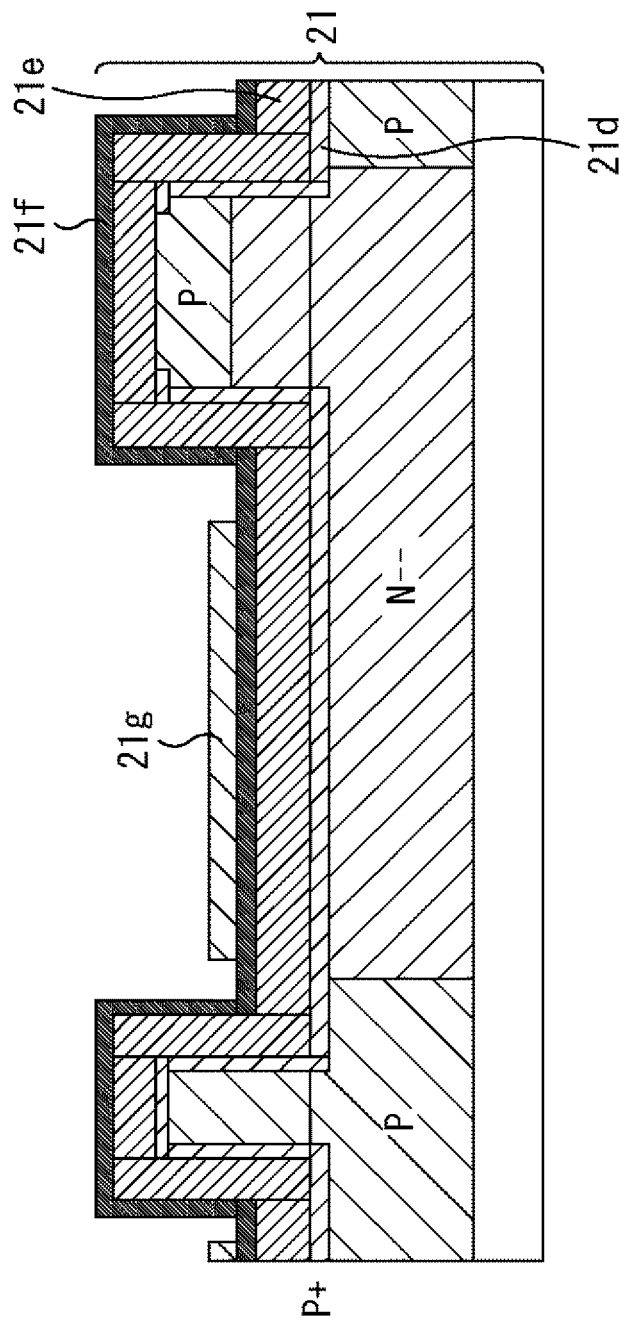
FIG. 31 A diagram for describing the manufacturing processes for the image sensor shown in FIG. 26.

Thereafter, as shown in FIG. 30, a tungsten film 21g serving as the light-shielding film is formed by sputtering, for example. As shown in FIG. 31, an unnecessary portion of the tungsten film 21g is removed by etching or the like.

Note that the tungsten film 21g is used as the light-shielding film, and hence the end portion may be formed in a T-shape (lateral T-shape) as in the case described above with respect to FIG. 22, for example. That is, near the gate terminal of the TG, the end portion of the light-shielding film is configured to be longer in the vertical direction (direction parallel to extending direction of gate terminal of TG). In this manner, the light passing through the portion in which the light-shielding film is not provided and reaching the second semiconductor substrate 22 can be minimized.

Figure 32:
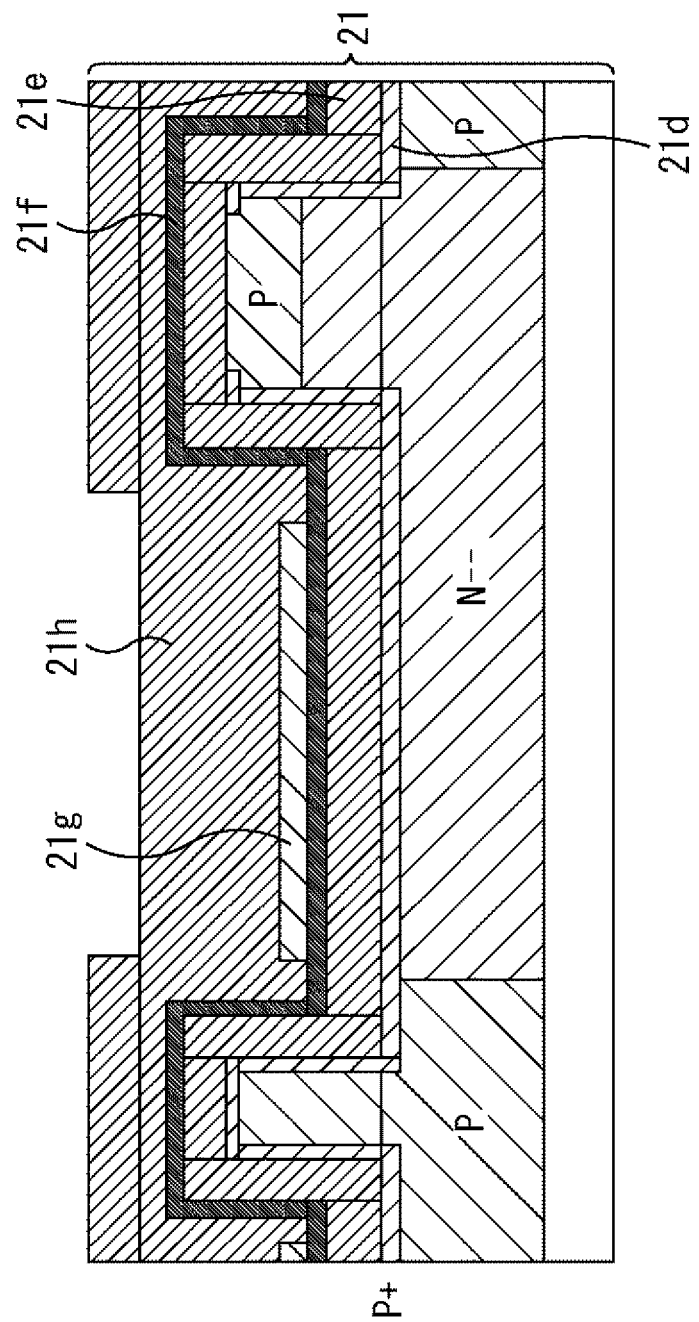
FIG. 32 A diagram for describing the manufacturing processes for the image sensor shown in FIG. 26.
Figure 33:
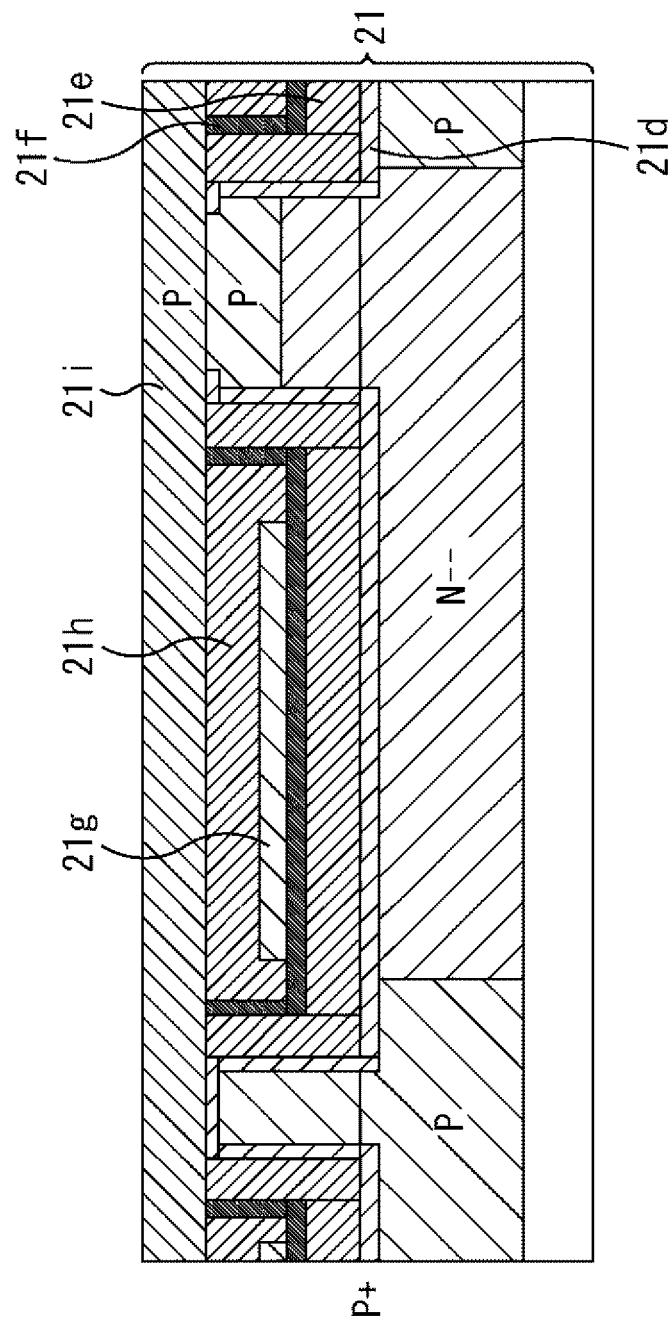
FIG. 33 A diagram for describing the manufacturing processes for the image sensor shown in FIG. 26.

Then, as shown in FIG. 32, an $SiO_2$ film 21h is further grown on the insulating film 21f and the tungsten film 21g. Thereafter, as shown in FIG. 33, the $SiO_2$ film 21h is polished and a silicon layer 21i is epitaxially grown thereon.

Figure 34:
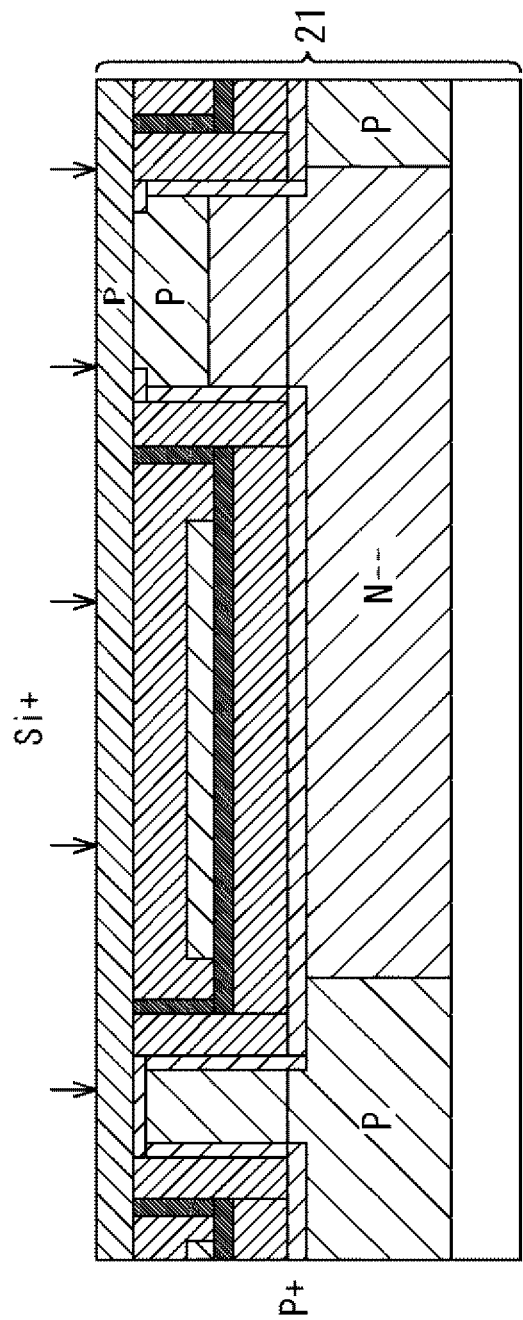
FIG. 34 A diagram for describing the manufacturing processes for the image sensor shown in FIG. 26.

Thereafter, a top surface of the silicon layer 21b is polished by CMP, for example. As shown in FIG. 34, silicon ions are implanted. With this, the bonding property of the silicon substrate for bonding the first semiconductor substrate 21 and the second semiconductor substrate 22 to each other is enhanced.

Note that, instead of implanting silicon ions, phosphorus, arsenic, or boron may be thermally diffused.

Figure 35:
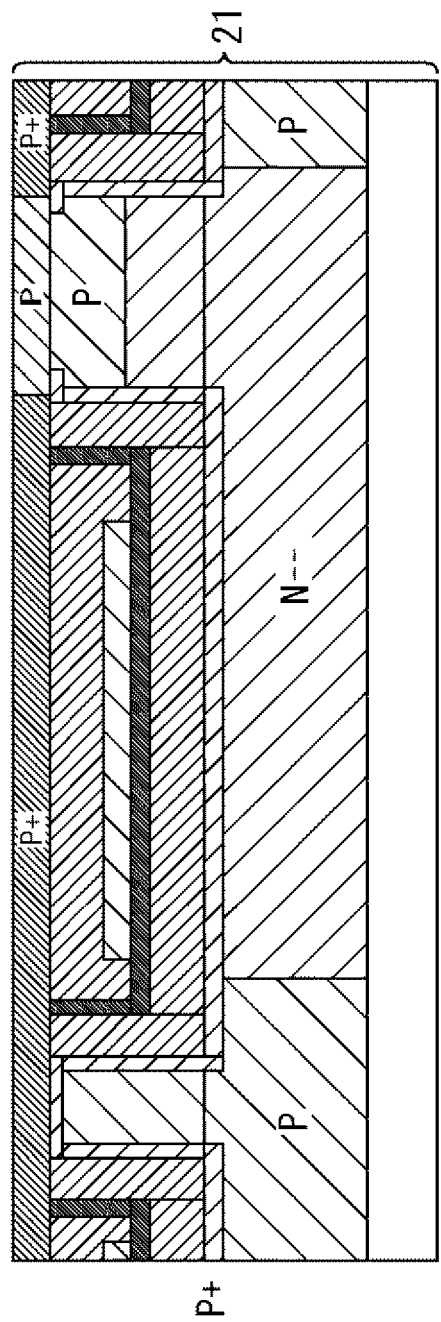
FIG. 35 A diagram for describing the manufacturing processes for the image sensor shown in FIG. 26.

Thereafter, as shown in FIG. 35, high-density P-type ions are implanted onto the silicon layer 21b. With this, the contact resistance is lowered. Note that the high-density P-type ions are not implanted onto a portion in which the TG is to be inserted. This is because this portion is for forming the channel of the TG.

Figure 36:
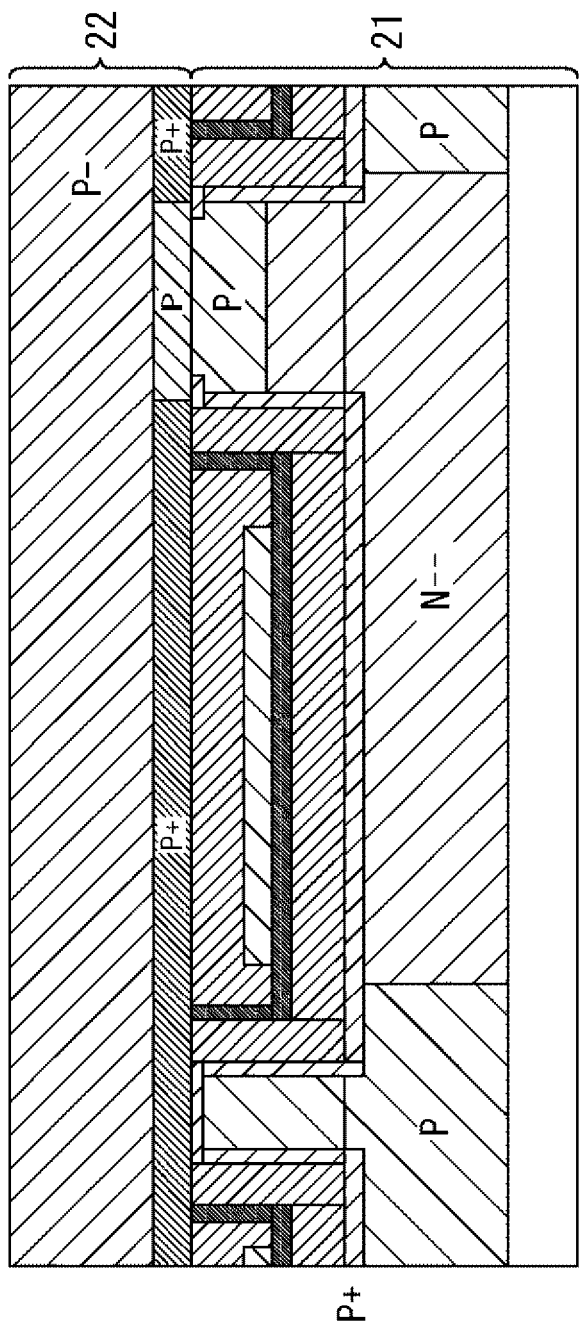
FIG. 36 A diagram for describing the manufacturing processes for the image sensor shown in FIG. 26.

Then, as shown in FIG. 36, a second semiconductor substrate 22 is bonded. At this time, a bonding interface between the first semiconductor substrate 21 and the second semiconductor substrate 22 is formed.

Note that bonding the first semiconductor substrate 21 and the second semiconductor substrate 22 to each other can be performed by plasma bonding or thermal annealing, for example. Furthermore, in order to enable the thickness of the substrate to be adjusted when the second semiconductor substrate 22 is thereafter polished, an SiN stopper may be inserted into the second semiconductor substrate 22 in advance. For example, due to the insertion of the SiN stopper in the second semiconductor substrate 22, it is possible to prevent the second semiconductor substrate 22 from being unnecessarily polished.

Figure 37:
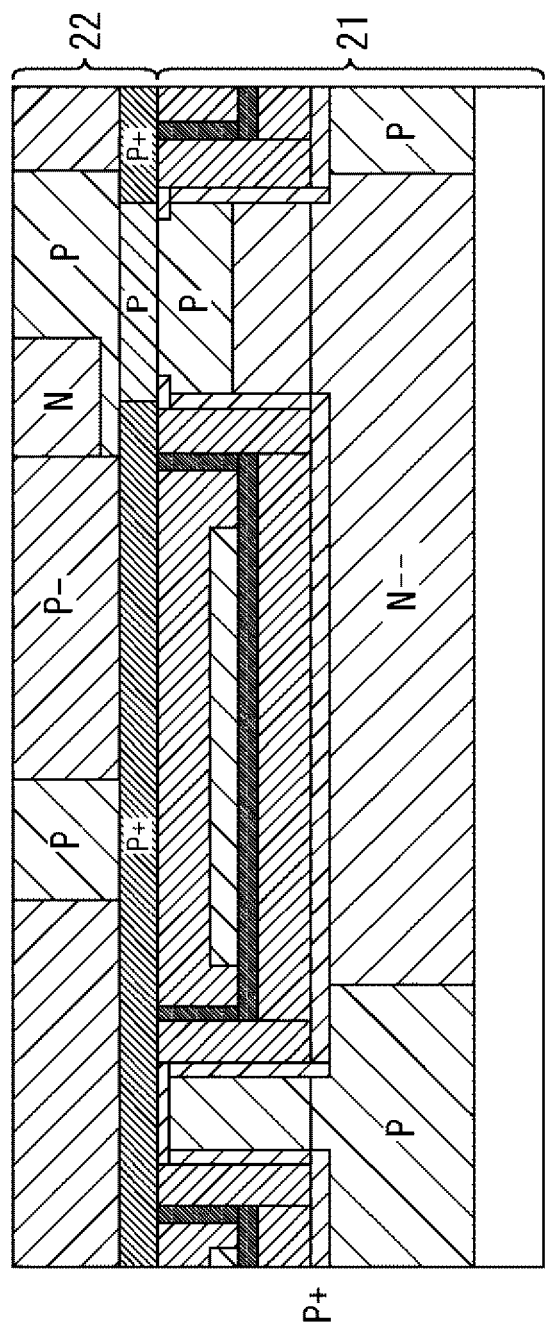
FIG. 37 A diagram for describing the manufacturing processes for the image sensor shown in FIG. 26.

Thereafter, as shown in FIG. 37, ions are implanted into the second semiconductor substrate 22 to form pixel the transistors and the channel of the TG.

Figure 38:
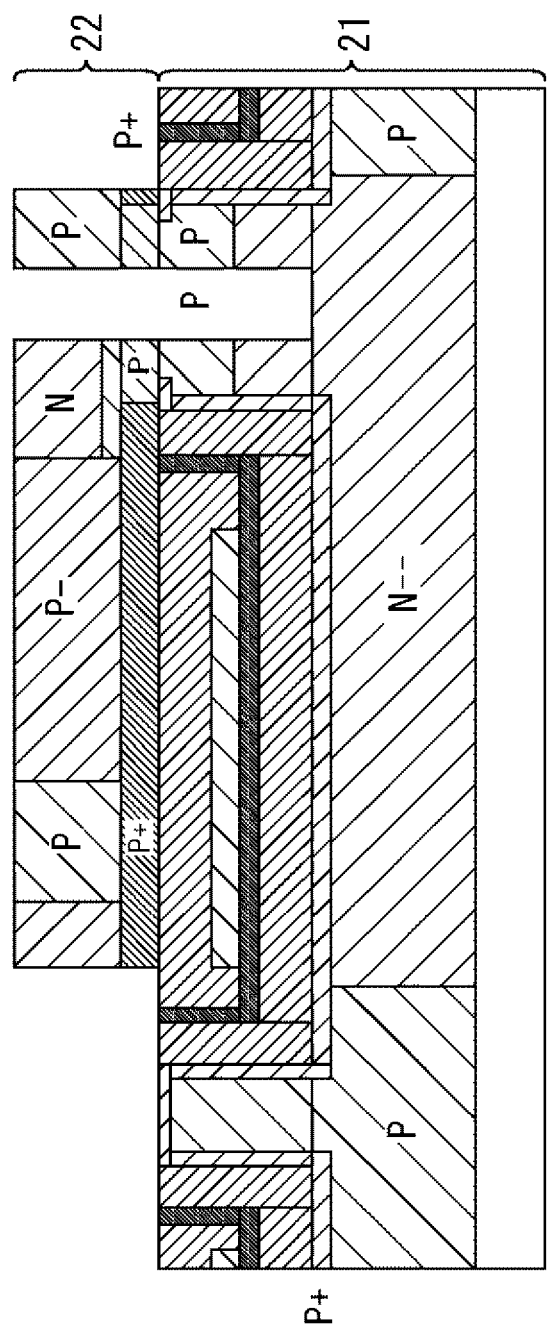
FIG. 38 A diagram for describing the manufacturing processes for the image sensor shown in FIG. 26.

In addition, as shown in FIG. 38, a hole is formed in a portion in which the gate terminal of the TG is to be disposed. A part of the second semiconductor substrate 22 is removed by dry etching such that it has a mesa shape.

Figure 39:
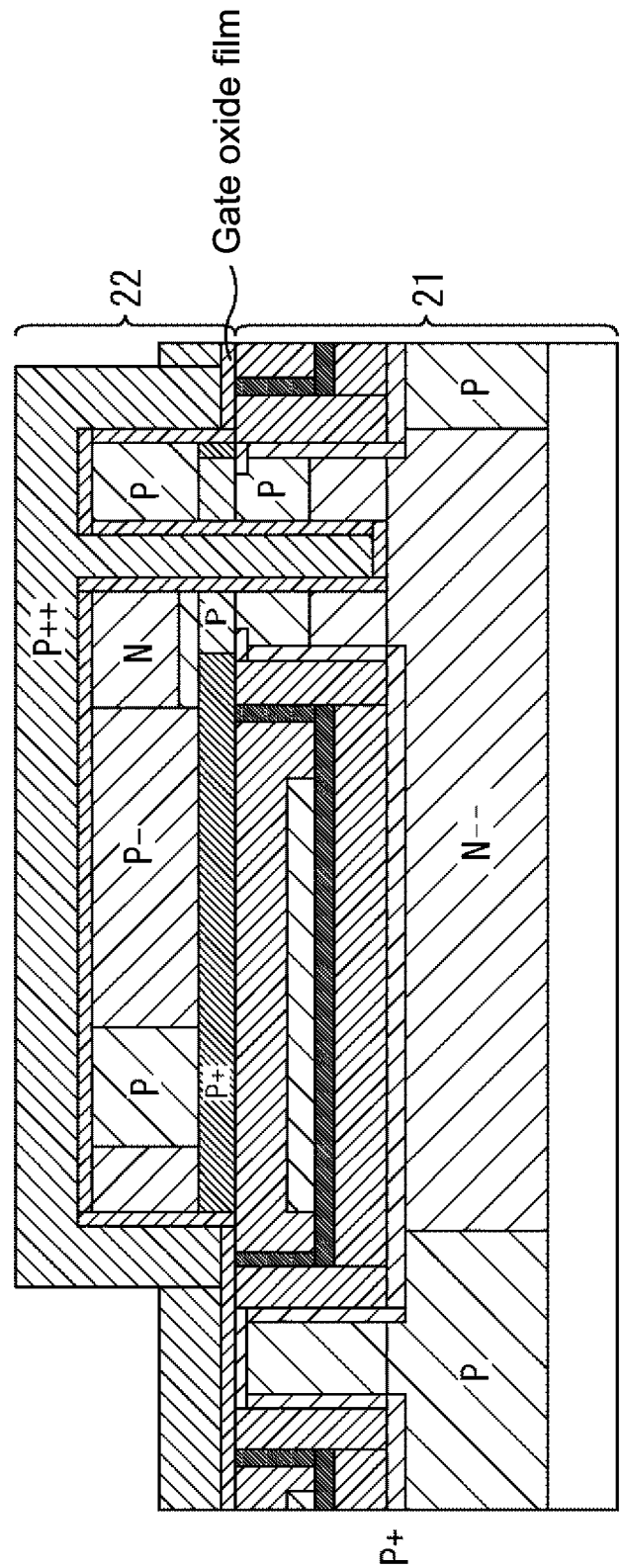
FIG. 39 A diagram for describing the manufacturing processes for the image sensor shown in FIG. 26.

Then, the $SiO_2$ film 21a is formed on the second semiconductor substrate 22 in the state as shown in FIG. 38 as the gate oxide film. As shown in FIG. 39, polysilicon is grown on the gate oxide film by the CVD.

Figure 40:
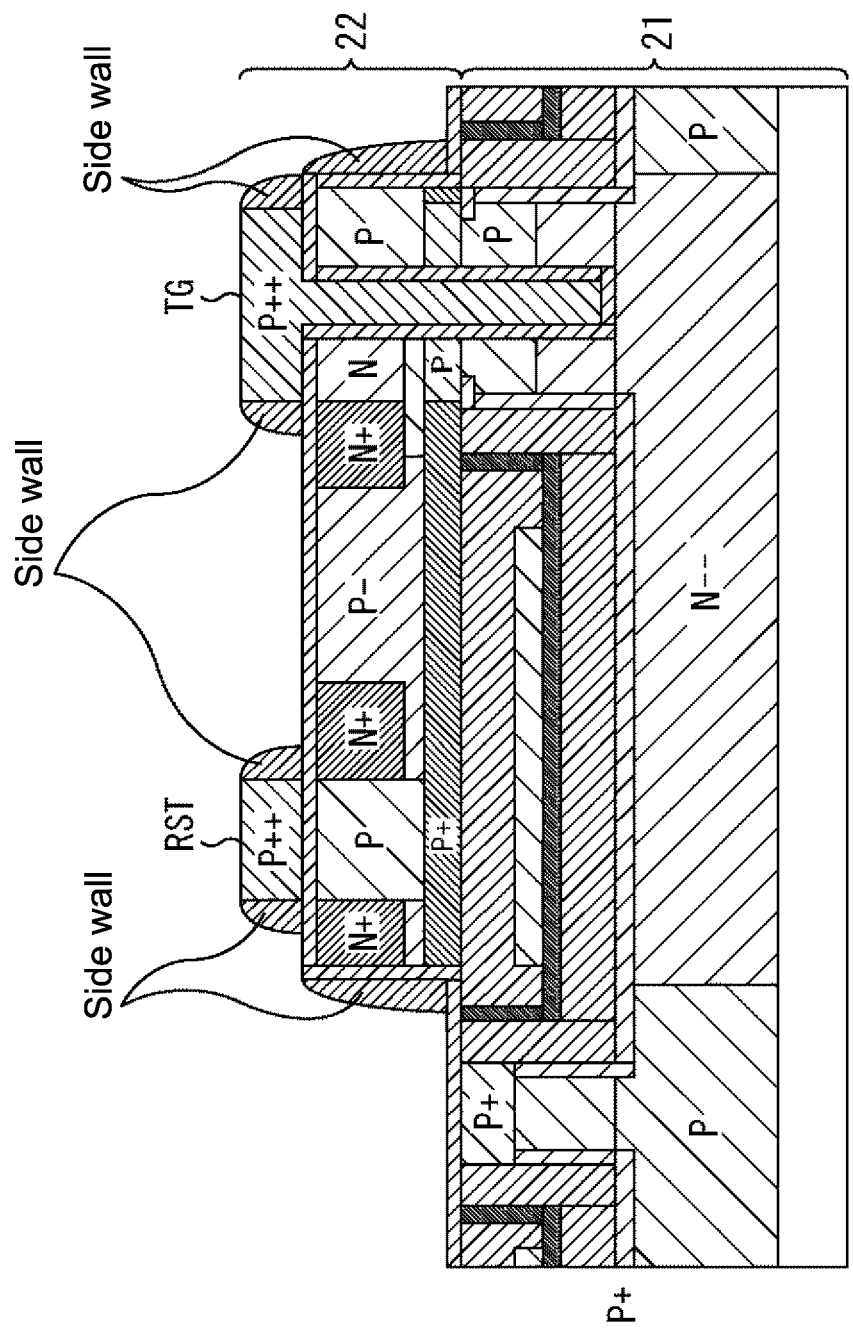
FIG. 40 A diagram for describing the manufacturing processes for the image sensor shown in FIG. 26.

A part of this polysilicon is removed by etching and the gate terminal of the TG and the gate terminal of the RST are obtained as shown in FIG. 40. Note that, at this time, the side walls are also formed. Furthermore, as shown in FIG. 40, the bonding interface between the first semiconductor substrate 21 and the second semiconductor substrate 22 is positioned near the drain terminal of the gate terminal of the TG.

Figure 41:
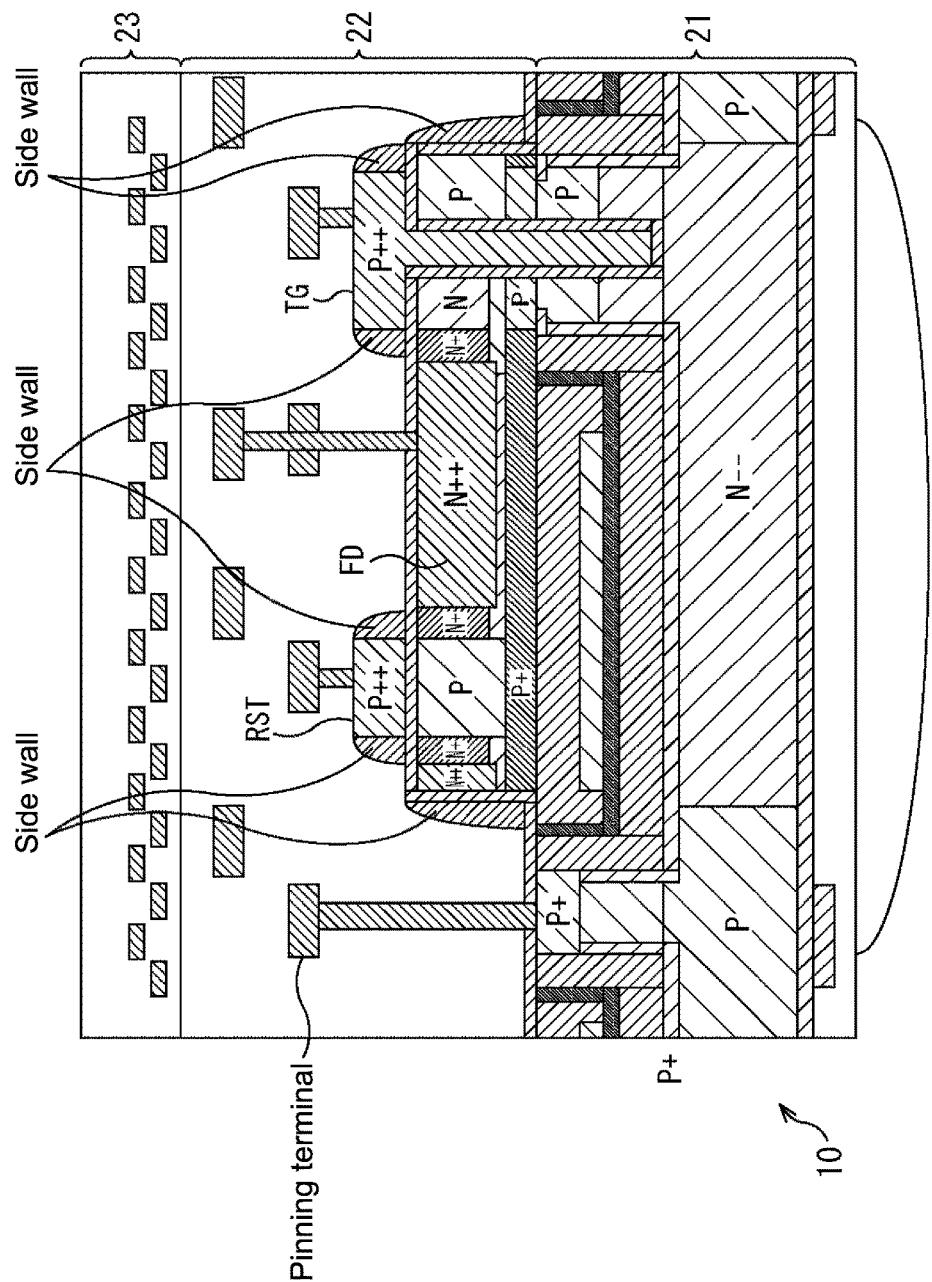
FIG. 41 A diagram for describing the manufacturing processes for the image sensor shown in FIG. 26.

Thereafter, as shown in FIG. 41, the wires, the pinning terminals, and the like to be connected to the pixel transistors (RST) and the TG are formed and the logic layer 23 is formed on the second semiconductor substrate 22. Furthermore, an on-chip lens is formed below the first semiconductor substrate 21. With this, the mesa type image sensor 10 is completed.

Also in the case of the mesa type image sensor 10 described above with reference to FIGS. 25 to 41, as in the case of the planar type image sensor 10, the pixel transistors and the FD are formed in the second semiconductor substrate 22 configured as the single-crystal substrate.

Thus, it is possible to obtain a good I-V characteristic that is adaptable also to fine pixel signals and suppress variations in performance of the pixels.

Furthermore, also in the case of the mesa-type image sensor 10, as in the case of the planar-type image sensor 10, the PD of the first semiconductor substrate 21 and the FD of the second semiconductor substrate 22 are electrically connected by the TG and the bonding interface between the first semiconductor substrate 21 and the second semiconductor substrate 22 is formed near the drain terminal of the channel of the TG. Thus, the charge transfer performance is not deteriorated and the problems relating to the life of the elements and the resistance of the gate oxide film do not occur.

Figure 42:
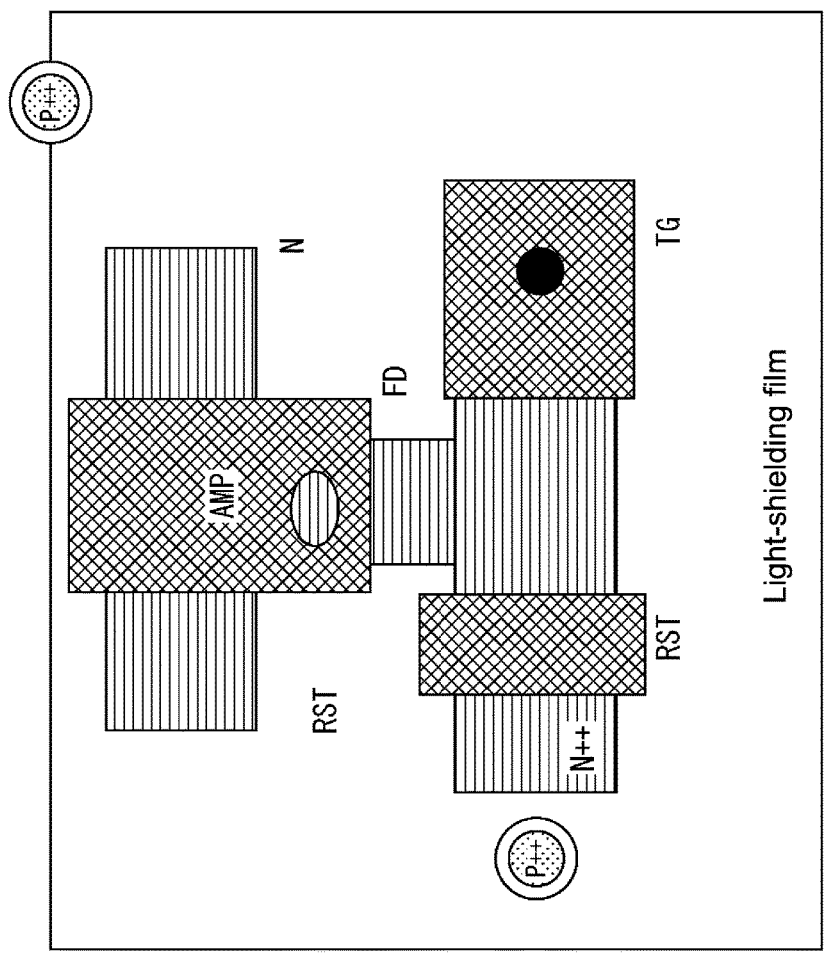
FIG. 42 A plan view showing a configuration example according to still another embodiment of the image sensor to which the present technology is applied.

FIG. 42 is a plan view showing a configuration example according to still another embodiment of the image sensor to which the present technology is applied. In the image sensor 10 shown in the figure, a region corresponding to an area of one pixel formed on a semiconductor substrate having a planar structure is illustrated.

As in the case of FIG. 1, each pixel of the image sensor 10 of FIG. 42 is also configured to transfer charges accumulated in the photodiode to a floating diffusion (FD) and read out a signal voltage corresponding to the charges retained by the FD via an amplifying transistor (AMP). Note that the signal voltage is read out on a vertical signal line (VSL) and the VSL is connected to the AMP via a selection transistor (SEL).

Furthermore, each pixel of the image sensor 10 is provided with a reset transistor (RST) for discharging (resetting) the charges retained by the FD.

In addition, in portions denoted by the characters and symbols of "P++" in circles positioned in the left and right in FIG. 42, pinning terminals are provided.

The image sensor 10 of FIG. 42 also has a structure configured by laminating at least two semiconductor substrates. In FIG. 42, the light-receiving surface of the PD of the image sensor 10 is placed on the rear surface. Furthermore, in the figure, out of the two semiconductor substrates described above, a top surface of the semiconductor substrate on which mainly the FD and the pixel transistors are provided.

That is, also in FIG. 42, the image sensor 10 is actually configured as an image sensor including a plurality of pixels. For example, a pixel array in which light-receiving portions placed on the rear surface in FIG. 21 are arranged in a two-dimensional matrix form is located at a position at which light collected by lenses and the like of a camera forms an image.

In this example, the FD of the image sensor 10 is directly connected to a part of the AMP. For example, in the example described above with reference to FIG. 1, the FD and the AMP are connected with the metal wires. Furthermore, in the example described above with reference to FIG. 20, the gate terminal of the AMP and the FD are connected by polysilicon in which highly-concentrated impurities are implanted, not by connection with the metal wires. In contrast, in the example of FIG. 42, the N-type semiconductor region constituting the FD is extended below the AMP and its part is directly connected to the AMP.

As shown in FIG. 42, the FD is directly connected to a part of the AMP, and hence it is possible to more accurately read out the signal voltage corresponding to the charges retained by the FD.

The pixel transistors formed on the second semiconductor substrate 22 and the transistor used for a logic circuit or the like, which are illustrated in FIGS. 20, 21, 25, 42, and the like, may be formed of, for example, a FinFET transistor that has been proposed in the conventional techniques.

Figure 43:
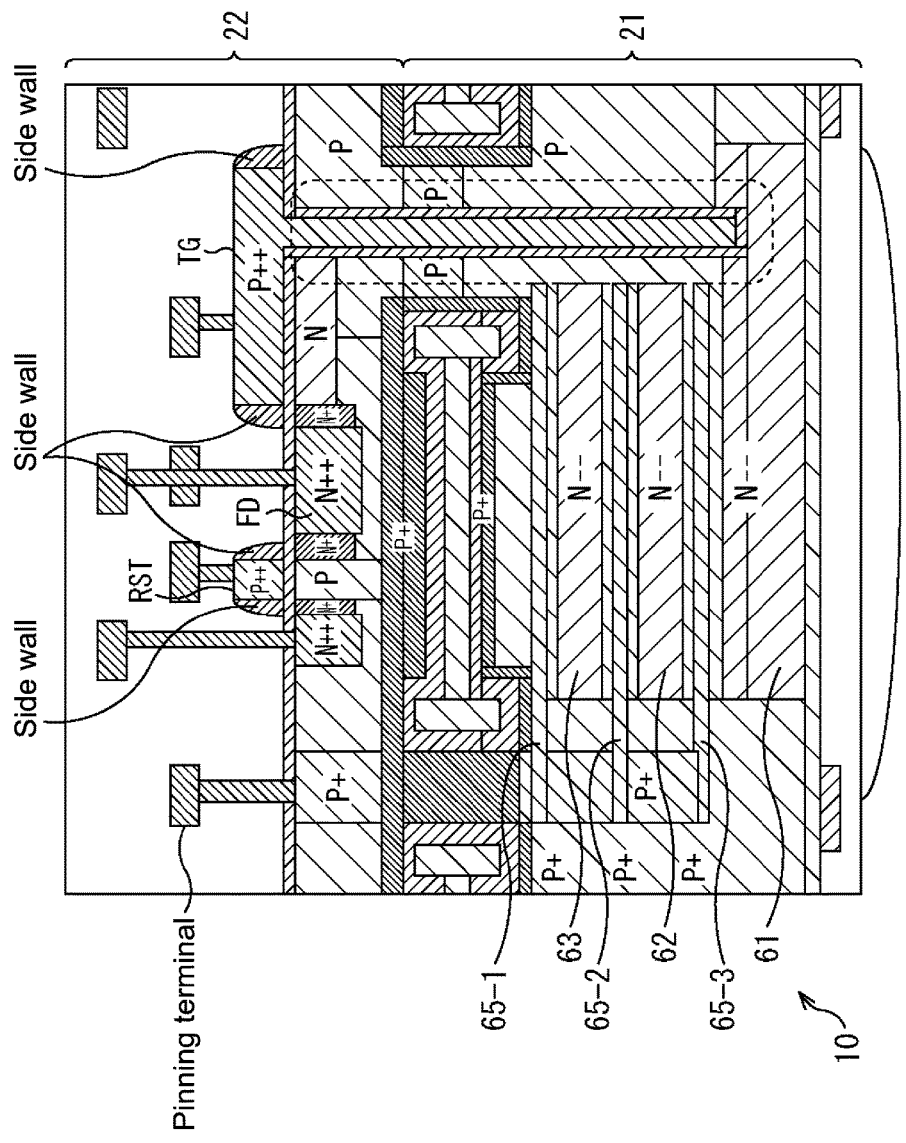
FIG. 43 A sectional view showing a configuration example according to still another embodiment of the image sensor to which the present technology is applied.

FIG. 43 is a sectional view showing a configuration example according to still another embodiment of the image sensor to which the present technology is applied. The figure is a sectional view corresponding to FIG. 2.

Also in the example of FIG. 43, the image sensor 10 is configured by bonding the first semiconductor substrate 21 and the second semiconductor substrate 22 to each other, and hence the bonding surface between the first semiconductor substrate and the second semiconductor substrate is a bonding interface.

Furthermore, regarding the TG that is the transistor, a part of an "N--" region that is held in contact with the lower side in the figure of the gate terminal is a source terminal. A part of an "N" region that is held in contact with the left side on the upper side in the figure of the gate terminal is a drain terminal. That is, a channel of the transistor is formed in the portion from the source terminal to the drain terminal in the gate terminal. Thus, also in FIG. 43, in the image sensor 10, the bonding interface is present in the channel of the transistor.

In this example, in the image sensor 10, in a lower portion of the first semiconductor substrate 21, an N-type semiconductor region 61 that forms a PD is formed. On an upper side thereof, an N-type semiconductor region 62 that forms a PD is formed and an N-type semiconductor region 63 that forms a PD is formed.

Then, a pinning layer 65-1 is formed on the N-type semiconductor region 63. A pinning layer 65-2 is formed on the N-type semiconductor region 62. A pinning layer 65-3 is formed on the N-type semiconductor region 61.

Furthermore, in order to electrically connect the pinning layers, ions are implanted until high-density P-type semiconductor regions below the pinning terminals reach the pinning layer 65-3.

In the case of the configuration shown in FIG. 43, the PD is formed in multiple layers on the left side in the figure of the gate terminal of the TG extending in the vertical direction in the figure. That is, a plurality of PDs are provided near the channel of the TG.

The PD is multilayered in this manner, and hence the capacity of all the PDs in the image sensor 10 can be increased.

Furthermore, the N-type semiconductor region 61 to the N-type semiconductor region 63 may have different surface areas. For example, the N-type semiconductor region 63 near the bonding interface between the first semiconductor substrate 21 and the second semiconductor substrate 22 may have a larger surface area than that of the N-type semiconductor region 61 or the N-type semiconductor region 62. In this way, the capacity of all the PDs in the image sensor 10 can be further increased.

In the above embodiments, the example in which the image sensor to which the present technology is applied is configured by using a silicon semiconductor substrate has been described. For example, the present technology can also be applied to an image sensor configured by using a compound semiconductor substrate.

Furthermore, in the above-mentioned embodiments, in the connection between the first semiconductor substrate 21 and the second semiconductor substrate 22, the silicon layer is formed. As the material for the bonding member, although not limited thereto, it can be formed of a particular semiconductor and a compound semiconductor. For example, monocrystalline silicon, polycrystalline silicon, amorphous silicon may be formed depending on the crystalline form of the silicon layer. Alternatively, a particular semiconductor such as germanium may be adopted. Alternatively, it may be formed of a compound material such as GaAs, GaN, SiGe, InGaAs, InGaN, and InGaZnO.

Regarding the crystalline form of these compound semiconductors, a monocrystalline, a polycrystalline, and an amorphous may be formed.

Furthermore, in the above-mentioned embodiments, the crystals of the first semiconductor substrate 21 and the second semiconductor substrate 22 may have different surface orientations. Regarding a material for a surface orientation, although not limited thereto, it can be formed in a surface orientation different from a particular surface orientation. For example, the first semiconductor substrate 21 is set to have a surface orientation of (111) and the second semiconductor substrate 22 is set to have a surface orientation of (100). With this, the mobility of the channel in the transfer transistor and the channel in the pixel transistors can be optimized.

Figure 44:
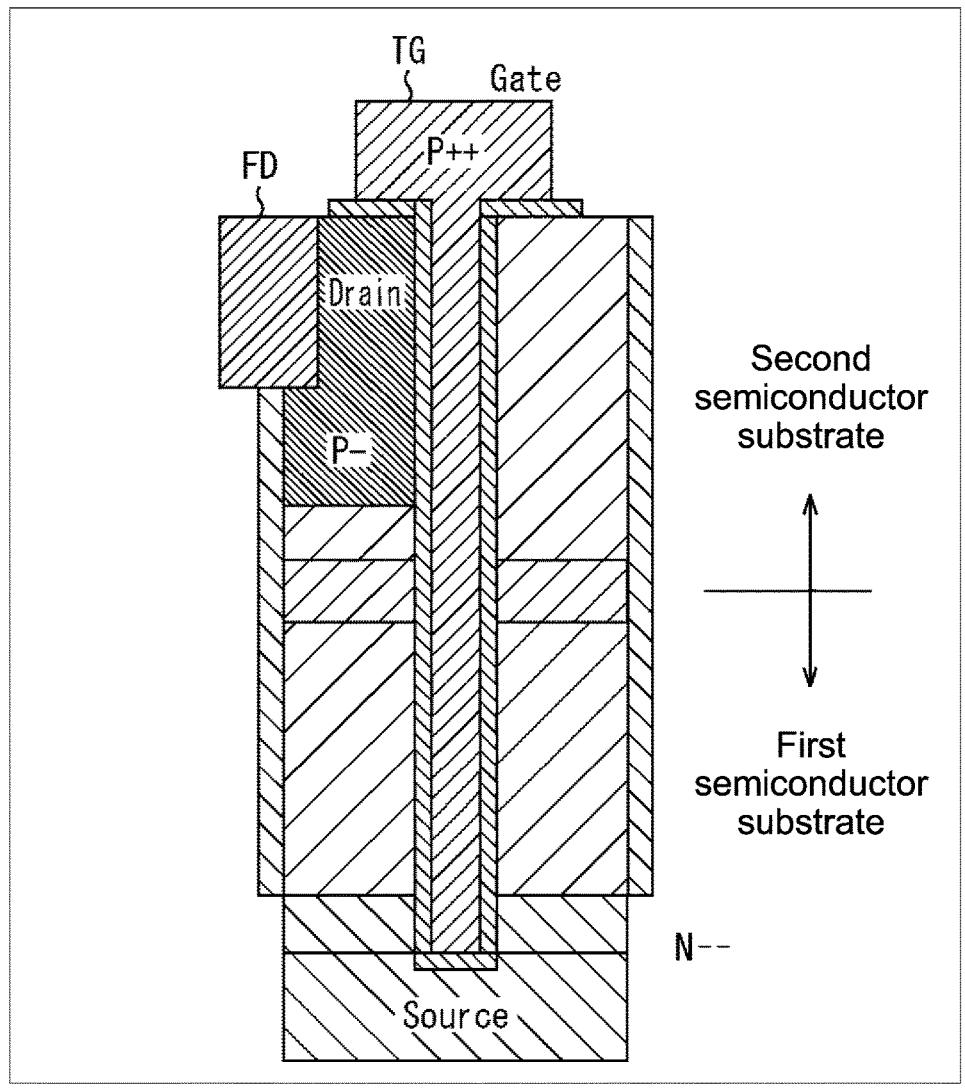
FIG. 44 A diagram showing another example of a configuration near the TG shown in FIG. 2.

In addition, in the above-mentioned embodiments, as in FIG. 3, the drain portion of the transfer transistor is N+. For example, as shown in FIG. 44, this may be a P-type region.

Figure 45:
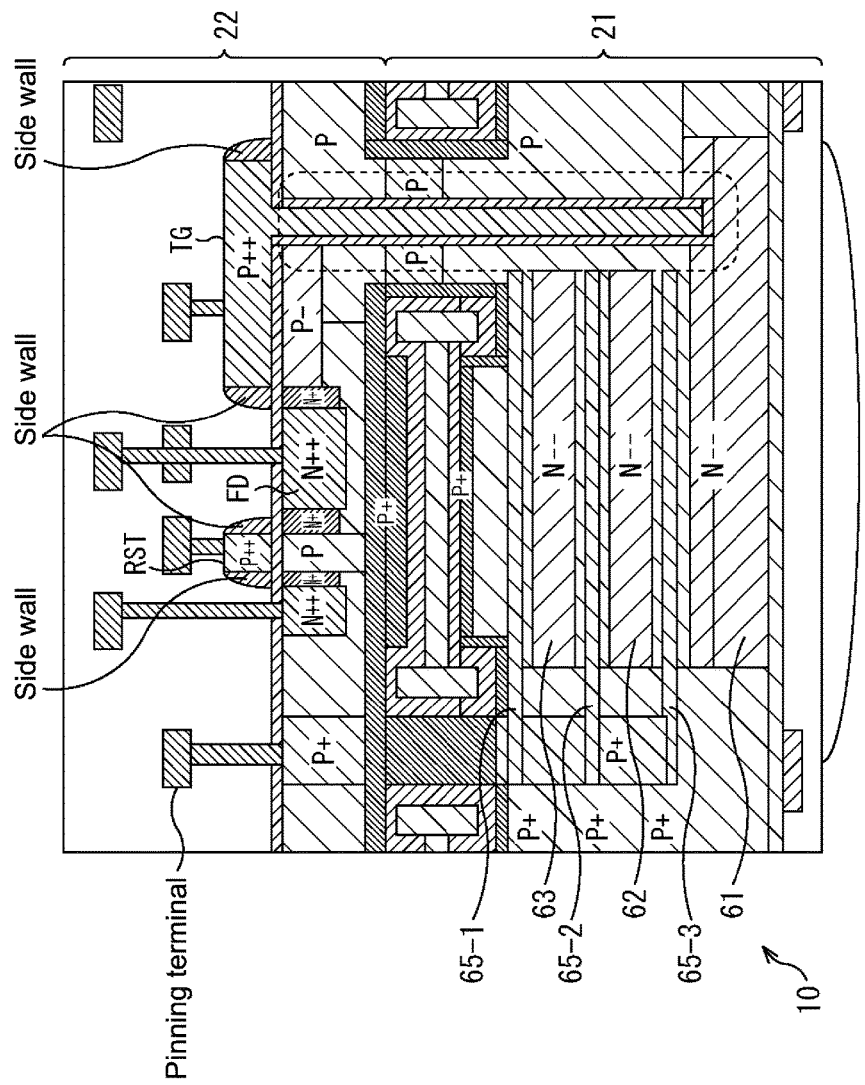
FIG. 45 A sectional view showing a configuration example according to still another embodiment of the image sensor to which the present technology is applied.

Furthermore, for example, as shown in FIG. 45, a transfer portion on the lower side of the gate of the TG may be set to be P− and an FD that is N++ may be configured to be adjacent to the transfer transistor. In this way, the light-shielding property can be further enhanced.

Figure 46:
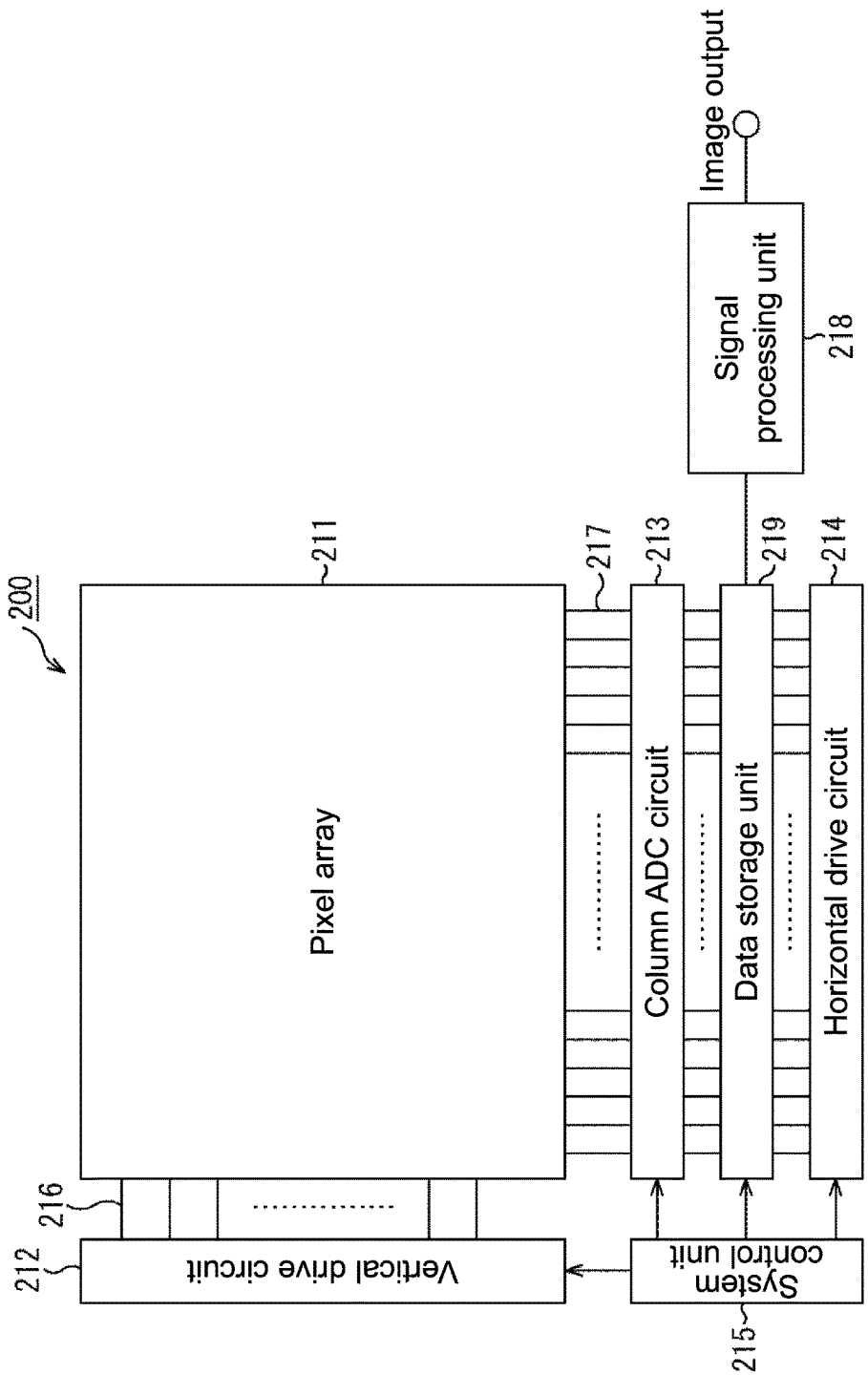
FIG. 46 A system configuration view schematically showing a solid-state imaging apparatus to which the present technology is applied.

FIG. 46 is a system configuration view schematically showing a solid-state imaging apparatus to which the present technology is applied. Here, a system configuration view schematically showing a configuration of a solid-state imaging apparatus 200 to which the present technology is applied is shown. Here, the solid-state imaging apparatus 200 is configured to include the image sensor 10 or the image sensor 100 according to the above-mentioned embodiment as one pixel of a pixel array 211.

As shown in FIG. 46, the solid-state imaging apparatus 200 is configured to include the pixel array 211 formed on a semiconductor chip (not shown) and surrounding circuit sections. In this example, the surrounding circuit sections are constituted of a vertical drive circuit 212, a column ADC circuit 213, a horizontal drive circuit 214, and a system control unit 215.

The solid-state imaging apparatus 200 further includes a signal processing unit 218 and a data storage unit 219. Regarding the signal processing unit 218 and the data storage unit 219, they may be external signal processing units provided on a substrate different from that of this solid-state imaging apparatus 200, for example, a DSP (Digital Signal Processor) and processing by software or may be mounted on the same substrate as this solid-state imaging apparatus 200.

In the pixel array 211, pixels including photo-electric conversion elements (e.g., photodiode: PD) are arranged in a two-dimensional matrix form. That is, the light-receiving portions of the image sensor 10 or the image sensor 100 having the configuration according to the above-mentioned embodiment constitute the pixel array 211.

In the pixel array 211, for each of rows of the pixel arrangement in a matrix form, a pixel drive line 216 is further formed along left and right directions of the figure (arrangement direction of pixels in pixel row). For each of columns, a vertical signal line 217 is formed along upper and lower directions of the figure (arrangement direction of pixels in pixel column). In FIG. 45, a single pixel drive line 216 is shown. However, the number of pixel drive lines 216 is not limited thereto. One end of the pixel drive line 216 is connected to an output end corresponding to each row of the vertical drive circuit 212.

The vertical drive circuit 212 is constituted of a shift register, an address decoder, and the like. The vertical drive circuit 212 is a pixel drive circuit that drives the pixels of the pixel array 211 at the same time or drives the pixels of the pixel array 211 per row or the like.

Signals output from unit pixels of a pixel row selectively scanned by the vertical drive circuit 212 are supplied to the column ADC circuit 213 through the vertical signal lines 217. The column ADC circuit 213 performs predetermined signal processing on signals output through the vertical signal lines 217 from unit pixels of the selected row for each of the pixel columns of the pixel array 211 and temporarily retains the pixel signals after signal processing.

The horizontal drive circuit 214 is configured by a shift register, an address decoder, or the like. Unit circuits corresponding to the pixel columns of the column ADC circuit 213 are sequentially selected. By selective scanning of this horizontal drive circuit 214, the pixel signals subjected to the signal processing in the column ADC circuit 213 are sequentially output.

The system control unit 215 is configured by a timing generator or the like that generates various timing signals. Based on various timing signals generated by this timing generator, the system control unit 215 performs drive control on the vertical drive circuit 212, the column ADC circuit 213, the horizontal drive circuit 214, and the like.

The signal processing unit 218 performs various signal processing such as addition processing on the pixel signals output from the column ADC circuit 213. Furthermore, the signal processing unit 218 is provided with a logic unit. A single correction circuit is provided in the logic unit.

The data storage unit 219 temporarily stores data necessary for the processing in the signal processing unit 218.

Figure 47:
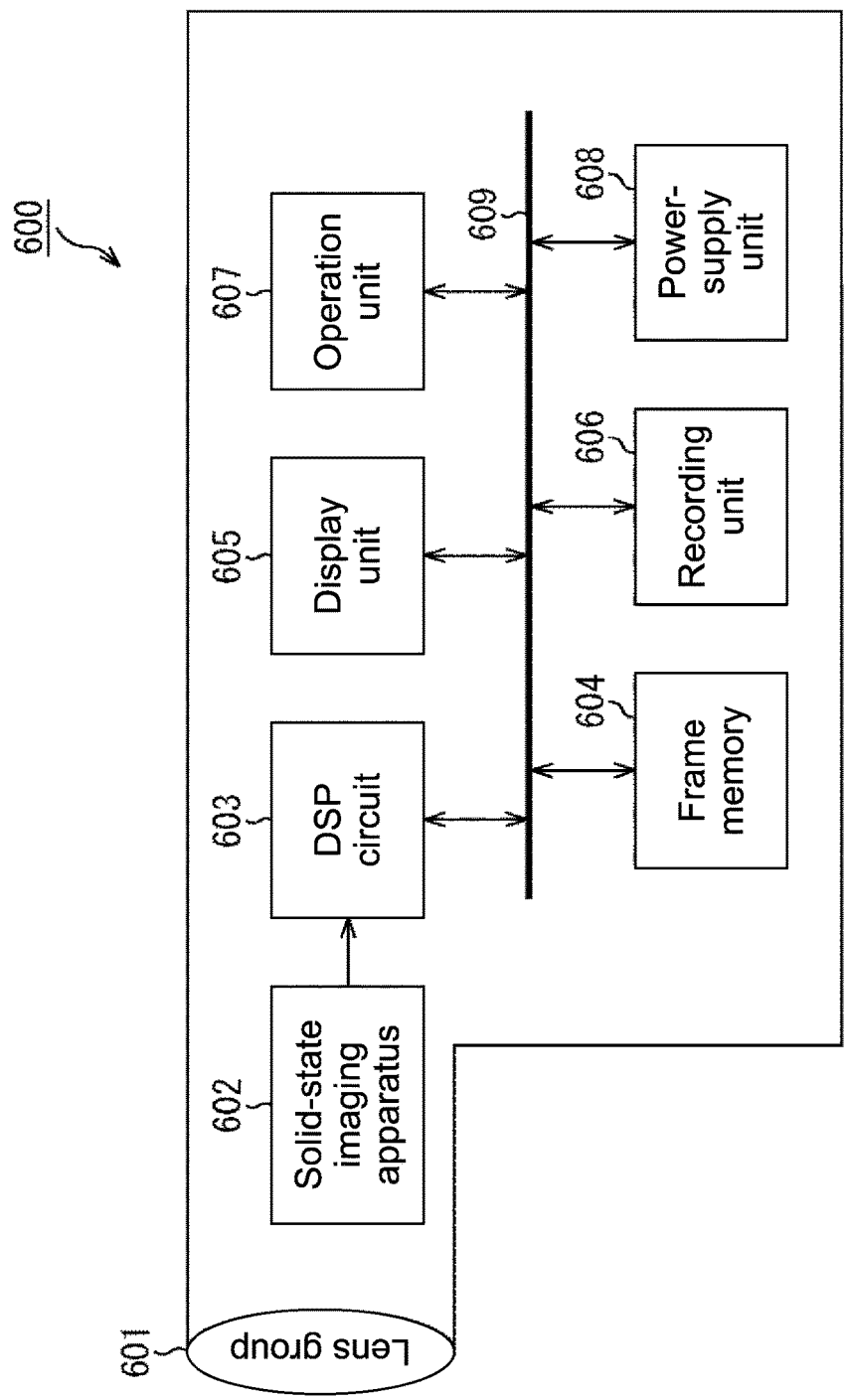
FIG. 47 A block diagram showing a configuration example of the imaging apparatus as an electronic apparatus to which the present technology is applied.

FIG. 47 is a block diagram showing a configuration example of an imaging apparatus as an electronic apparatus to which the present technology is applied.

An imaging apparatus 600 in FIG. 47 includes an optical unit 601 formed of a lens group, a solid-state imaging apparatus (imaging device) 602, and a DSP circuit 603 that is a camera signal processing circuit. Furthermore, the imaging apparatus 600 further includes a frame memory 604, a display unit 605, a recording unit 606, an operation unit 607, and a power-supply unit 608. The DSP circuit 603, the frame memory 604, the display unit 605, the recording unit 606, the operation unit 607, and the power-supply unit 608 are connected to one another via a bus line 609.

The optical unit 601 forms an image on an imaging surface of the solid-state imaging apparatus 602, by taking in incident light (image light) from a subject. The solid-state imaging apparatus 602 converts the light amount of incident light, from which the optical unit 601 has formed the image on the imaging surface, into an electrical signal for each of the pixels, and outputs it as a pixel signal. As this solid-state imaging apparatus 602, a solid-state imaging apparatus, for example, the solid-state imaging apparatus 200 according to the above-mentioned embodiment can be used.

The display unit 605 is formed of, for example, a panel type display apparatus such as a liquid-crystal panel and an organic EL (Electro Luminescence) panel. A moving image or still image captured by the solid-state imaging apparatus 602 is displayed. The recording unit 606 records a moving image or still image captured by the solid-state imaging apparatus 602 on a recording medium such as a video tape and a DVD (Digital Versatile Disk).

According to a user's operation, the operation unit 607 issues an operation instruction relating to various functions of the imaging apparatus 600. The power-supply unit 608 appropriately supplies various power-supplies as operation power-supplies for the DSP circuit 603, the frame memory 604, the display unit 605, the recording unit 606, and the operation unit 607 to those supply targets.

Furthermore, in the above embodiments, the descriptions have been made exemplifying the case where the image sensor configured by arranging the unit pixels that detect signal charges corresponding to the amount of visible light as physical quantity in a matrix form is applied. However, the present technology is not limited to be applied to the image sensor. It can be applied to solid-state imaging apparatuses using a column system in which column processors are arranged for each pixel column of the pixel array.

Furthermore, the present technology is not limited to be applied to the solid-state imaging apparatus that detects a distribution of incident light amounts of visible light and captures it as an image. It can be applied to a solid-state imaging apparatus that captures a distribution of incident amounts of infrared rays, X-rays, particles, or the like, and to solid-state imaging apparatuses (physical quantity distribution detecting apparatuses) such as a finger print sensor that detects a distribution of different physical quantity such as pressure and capacitance and captures it as an image in a broader sense.

In addition, the present technology can also be applied to various sensors, for example, a temperature sensor, a humidity sensor, an acceleration sensor, and an odor sensor.

In addition, the present technology can also be applied to a semiconductor laser.

In addition, in an MEMS (Micro Electro Mechanical Systems), the present technology can also be employed.

Furthermore, the embodiments of the present technology are not limited to the above-mentioned embodiments and various changes can be made without departing from the gist of the present technology.

It should be noted that the present technology may also take the following configurations.

(1)

A solid-state imaging apparatus, including:

a charge accumulation section that is formed on a first semiconductor substrate and accumulates photoelectrically converted charges;

a charge-retaining section that is formed on a second semiconductor substrate and retains charges accumulated in the charge accumulation section; and a transfer transistor that is formed on the first semiconductor substrate and the second semiconductor substrate and transfers charges accumulated in the charge accumulation section to the charge-retaining section, in which a bonding interface between the first semiconductor substrate and the second semiconductor substrate is formed in a channel of the transfer transistor.

(2)

The solid-state imaging apparatus according to (1), in which the transfer transistor is formed such that a gate terminal penetrates the first semiconductor substrate and reaches the second semiconductor substrate.

(3)

The solid-state imaging apparatus according to (2), in which the bonding interface is formed at a position of the gate terminal of the transfer transistor, which is closer to a drain terminal than to a source terminal.

(4)

The solid-state imaging apparatus according to (1), in which in the second semiconductor substrate, formed are pixel transistors including an amplifying transistor that amplifies a signal voltage corresponding to charges retained by at least the charge-retaining section, a reset transistor that resets charges retained by the charge-retaining section, and a selection transistor that selects a signal to be output to a signal line, the signal corresponding to charges read out from the charge-retaining section.

(5)

The solid-state imaging apparatus according to (4), in which the gate terminal of the amplifying transistor and the charge-retaining section are connected by silicon.

(6)

The solid-state imaging apparatus according to (4), in which a P-type semiconductor region is formed as a body contact that connects the amplifying transistor, the reset transistor, and the selection transistor.

(7)

The solid-state imaging apparatus according to (4), in which a part of an N-type semiconductor region forming the charge-retaining section is directly connected to the amplifying transistor.

(8)

The solid-state imaging apparatus according to (4), being configured by bonding the second semiconductor substrate that is a single-crystal silicon substrate and the first semiconductor substrate that is a silicon substrate to each other.

(9)

The solid-state imaging apparatus according to (8), in which a silicon layer is formed in the bonding interface between the first semiconductor substrate and the second semiconductor substrate.

(10)

The solid-state imaging apparatus according to (9), in which the silicon layer is formed by epitaxial growth.

(11)

The solid-state imaging apparatus according to (10), in which silicon ions are implanted onto the silicon layer and the silicon layer is bonded to the second semiconductor substrate.

(12)

The solid-state imaging apparatus according to (1), in which a light-shielding film is embedded in the first semiconductor substrate.

(13)

The solid-state imaging apparatus according to (12), in which near the gate terminal of the transfer transistor, a region in which the light-shielding film is not provided is present, and near the gate terminal of the transfer transistor, the light-shielding film is configured to be long in a direction parallel to an extending direction of the gate terminal of the transfer transistor.

(14)

The solid-state imaging apparatus according to (12), in which the light-shielding film is formed of tungsten, titanium, tantalum, nickel, molybdenum, chromium, iridium, or a tungsten silicon compound.

(15)

The solid-state imaging apparatus according to (1), in which the single charge-retaining section is provided corresponding to a plurality of charge accumulation sections.

(16)

The solid-state imaging apparatus according to (1), in which a plurality of charge accumulation sections are multilayered in a direction in which the first semiconductor substrate and the second semiconductor substrate are laminated.

(17)

The solid-state imaging apparatus according to (1), being configured as a planar structure.

(18)

The solid-state imaging apparatus according to (1), being configured as a mesa structure.

(19)

A manufacturing method for a solid-state imaging apparatus, including:

a step of bonding a first semiconductor substrate formed in a charge accumulation section that accumulates photoelectrically converted charges and a second semiconductor substrate on which a charge-retaining section that retains charges accumulated in the charge accumulation section to each other; and a step of forming a transfer transistor that transfers charges accumulated in the charge accumulation section to the charge-retaining section in the first semiconductor substrate and the second semiconductor substrate.

(20)

An electronic apparatus, including:

a solid-state imaging apparatus including a charge accumulation section that is formed on a first semiconductor substrate and accumulates photoelectrically converted charges;

a charge-retaining section that is formed on a second semiconductor substrate and retains charges accumulated in the charge accumulation section; and a transfer transistor that is formed on the first semiconductor substrate and the second semiconductor substrate and transfers charges accumulated in the charge accumulation section to the charge-retaining section, in which a bonding interface between the first semiconductor substrate and the second semiconductor substrate is formed in a channel of the transfer transistor.

DESCRIPTION OF SYMBOLS 10 image sensor
21 first semiconductor substrate
21a silicon layer
second semiconductor substrate
41-0 to 41-2 light-shielding film
200 solid-state imaging apparatus
211 pixel array
212 vertical drive circuit
213 column ADC circuit
214 horizontal drive circuit
215 system control unit
218 signal processing unit
600 imaging apparatus
602 solid-state imaging apparatus

The invention claimed is:

1. An imaging apparatus, comprising:
a charge accumulation section that is formed in a first semiconductor substrate and accumulates photoelectrically converted charges;
a charge-retaining section that is formed in a second semiconductor substrate and retains charges accumulated in the charge accumulation section; and
a transfer transistor that is formed in the first semiconductor substrate and the second semiconductor substrate and that transfers charges accumulated in the charge accumulation section to the charge-retaining section, wherein
a bonding interface between the first semiconductor substrate and the second semiconductor substrate is formed between a drain and a source of the transfer transistor, and
a gate terminal of the transfer transistor is disposed from a surface of the second semiconductor substrate to the first semiconductor substrate such that the gate terminal penetrates the first semiconductor substrate.

2. The imaging apparatus according to claim 1, wherein the bonding interface is formed at a position of the gate terminal of the transfer transistor, which is closer to a drain terminal of the transfer transistor than to a source terminal of the transfer transistor.

3. The imaging apparatus according to claim 1, wherein in the second semiconductor substrate, pixel transistors are formed, the pixel transistors including:
an amplifying transistor that amplifies a signal voltage corresponding to charges retained by at least the charge-retaining section,
a reset transistor that resets charges retained by the charge-retaining section, and
a selection transistor that selects a signal to be output to a signal line, the signal corresponding to charges read out from the charge-retaining section.

4. The imaging apparatus according to claim 3, wherein a gate terminal of the amplifying transistor and the charge-retaining section are connected by silicon.

5. The imaging apparatus according to claim 3, wherein a P-type semiconductor region is formed as a body contact that connects the amplifying transistor, the reset transistor, and the selection transistor.

6. The imaging apparatus according to claim 3, wherein a part of an N-type semiconductor region forming the charge-retaining section is directly connected to the amplifying transistor.

7. The imaging apparatus according to claim 3, wherein the imaging apparatus is configured by bonding the second semiconductor substrate that is a single-crystal silicon substrate and the first semiconductor substrate that is a silicon substrate to each other.

8. The imaging apparatus according to claim 7, wherein a silicon layer is formed in the bonding interface between the first semiconductor substrate and the second semiconductor substrate.

9. The imaging apparatus according to claim 8, wherein the silicon layer is formed by epitaxial growth.

10. The imaging apparatus according to claim 9, wherein silicon ions are implanted onto the silicon layer and the silicon layer is bonded to the second semiconductor substrate.

11. The imaging apparatus according to claim 1, wherein a light-shielding film is embedded in the first semiconductor substrate.

12. The imaging apparatus according to claim 1, further comprising a light-shielding film, wherein near the gate terminal of the transfer transistor a region in which the light-shielding film is not provided is present, and near the gate terminal of the transfer transistor the light-shielding film is configured to be long in a direction parallel to an extending direction of the gate terminal of the transfer transistor.

13. The imaging apparatus according to claim 1, further comprising a light-shielding film, wherein the light-shielding film is formed of tungsten, titanium, tantalum, nickel, molybdenum, chromium, iridium, or a tungsten silicon compound.

14. The imaging apparatus according to claim 1, wherein the charge-retaining section is provided corresponding to a plurality of charge accumulation sections.

15. The imaging apparatus according to claim 1, wherein a plurality of charge accumulation sections are multilayered in a direction in which the first semiconductor substrate and the second semiconductor substrate are laminated.

16. The imaging apparatus according to claim 1, wherein the imaging apparatus is configured as a planar structure.

17. The imaging apparatus according to claim 1, wherein the imaging apparatus is configured as a mesa structure.

18. A manufacturing method for an imaging apparatus, comprising:
bonding a first semiconductor substrate having a charge accumulation section that accumulates photoelectrically converted charges and a second semiconductor substrate having a charge-retaining section that retains charges accumulated in the charge accumulation section to each other; and
forming a transfer transistor that transfers charges accumulated in the charge accumulation section to the charge-retaining section in the first semiconductor substrate and the second semiconductor substrate, wherein
a bonding interface between the first semiconductor substrate and the second semiconductor substrate is between a drain and a source of the transfer transistor, and wherein a gate terminal of the transfer transistor is disposed from a surface of the second semiconductor substrate to the first semiconductor substrate such that the gate terminal penetrates the first semiconductor substrate.

19. An electronic apparatus, comprising:
an imaging apparatus including:
- a charge accumulation section that is formed in a first semiconductor substrate and accumulates photoelectrically converted charges;
- a charge-retaining section that is formed in a second semiconductor substrate and retains charges accumulated in the charge accumulation section; and
- a transfer transistor that is formed in the first semiconductor substrate and the second semiconductor substrate and that transfers charges accumulated in the charge accumulation section to the charge-retaining section, wherein a bonding interface between the first semiconductor substrate and the second semiconductor substrate is formed between a drain and a source of the transfer transistor, and wherein a gate terminal of the transfer transistor is disposed from a surface of the second semiconductor substrate to the first semiconductor substrate such that the gate terminal penetrates the first semiconductor substrate.

\* \* \* \* \*